United States Patent
Kim et al.

(10) Patent No.: US 8,823,072 B2
(45) Date of Patent: Sep. 2, 2014

(54) FLOATING GATE TYPE NONVOLATILE MEMORY DEVICE AND RELATED METHODS OF MANUFACTURE AND OPERATION

(75) Inventors: Jae Ho Kim, Seoul (KR); Sung-Hwan Jang, Bucheon-si (KR); Hye-Young Kwon, Suwon-si (KR); Sunil Shim, Seoul (KR); Hyun-Sil Oh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 826 days.

(21) Appl. No.: 13/074,219

(22) Filed: Mar. 29, 2011

(65) Prior Publication Data
US 2011/0254069 A1 Oct. 20, 2011

(30) Foreign Application Priority Data
Apr. 15, 2010 (KR) .......... 10-2010-0034766
Oct. 28, 2010 (KR) .......... 10-2010-0106212

(51) Int. Cl.
*H01L 29/788* (2006.01)
*H01L 27/115* (2006.01)
*H01L 29/423* (2006.01)

(52) U.S. Cl.
CPC ...... *H01L 29/7889* (2013.01); *H01L 27/11556* (2013.01); *H01L 29/42324* (2013.01); *H01L 27/11551* (2013.01)
USPC ..................... 257/315; 257/E29.3

(58) Field of Classification Search
USPC .............................. 257/315, E29.3
See application file for complete search history.

(56) References Cited

U.S. PATENT DOCUMENTS

| | | | |
|---|---|---|---|
| 7,304,343 B2 | 12/2007 | Masuoka et al. | |
| 7,388,245 B2 | 6/2008 | Masuoka et al. | |
| 2009/0310415 A1 | 12/2009 | Jin et al. | |
| 2010/0078701 A1 | 4/2010 | Shim et al. | |
| 2011/0092038 A1 | 4/2011 | Choi et al. | |

FOREIGN PATENT DOCUMENTS

| | | | |
|---|---|---|---|
| JP | 06338602 A | 12/1994 | |
| JP | 2005259889 A | 9/2005 | |
| JP | 2005268418 A | 9/2005 | |
| JP | 2007266143 A | 10/2007 | |
| JP | 2009266281 A | 11/2009 | |
| JP | 2009277770 A | 11/2009 | |
| KR | 1020060043688 A | 5/2006 | |
| KR | 1020090093770 A | 9/2009 | |
| KR | 1020110070142 | 6/2011 | |
| KR | 1020110086405 | 7/2011 | |
| KR | 1020110090056 | 8/2011 | |
| KR | 1020110094985 | 8/2011 | |

OTHER PUBLICATIONS

Co-pending U.S. Appl. No. 12/901,025.

*Primary Examiner* — Marvin Payen
(74) *Attorney, Agent, or Firm* — Volentine & Whitt, PLLC

(57) ABSTRACT

A floating gate type nonvolatile memory device comprises a semiconductor layer, wordlines crossing over the semiconductor layer, and a memory element disposed between the wordlines and facing the semiconductor layer.

8 Claims, 52 Drawing Sheets

Fig. 42

| FG | FG Potential [min, max] | SP Potential | SP |
|---|---|---|---|
|  |  | V_S | CSL |
| M1 | [-, Von] | (Off) | R1 |
| M2 | [-, Von] | (Off) | R2 |
| M3 | [-, Von] | (Off) | R3 |
| M4 | [Von, Vpc] | V_BL | R4 |
| M5 | [Von, Vpc] | V_BL | R5 |
| M6 | [Von, Vpc] | V_BL | R6 |
| M7 | [Vpc, -] | V_BL | R7 |
| M8 | [Von, Vpc] | V_BL | R8 |
| M9 | [Von, Vpc] | V_BL | R9 |
| M10 | [Von, Vpc] | V_BL | R10 |
| M11 | [Von, Vpc] | V_BL | R11 |
| M12 | [Von, Vpc] | V_BL | R12 |
| M13 | [Von, Vpc] | V_BL | R13 |
| Program | | V_BL | BL |

Fig. 43

| FG | FG Potential | SP Potential | SP |
|---|---|---|---|
|  |  | V_S | CSL |
| M1 | > Von | V_S | R1 |
| M2 | > Von | V_S | R2 |
| M3 | > Von | V_S | R3 |
| M4 | > Von | V_S | R4 |
| M5 | > Von | V_S | R5 |
| M6 | > Von | V_S | R6 |
| M7 | – | On/Off | R7 |
| M8 | > Von | V_BL | R8 |
| M9 | > Von | V_BL | R9 |
| M10 | > Von | V_BL | R10 |
| M11 | > Von | V_BL | R11 |
| M12 | > Von | V_BL | R12 |
| M13 | > Von | V_BL | R13 |
|  | READ | V_BL | BL |

Iread

Fig. 49A

|      | Program | Read | Erase |
|------|---------|------|-------|
| BL   | 0V/Vcc  | Vcc  | Vers  |
| SSL1 | Vcc     | 6V   | 6V    |
| SSL0 | Vcc     | 6V   | 6V    |
| DL1  | 8V      | 6V   | 0V    |
| WL7  | 8V      | 6V   | 0V    |
| WL6  | 8V      | 6V   | 0V    |
| WL5  | 0V      | 12V  | 0V    |
| WL4  | 15V     | 0V   | 0V    |
| WL3  | 15V     | 0V   | 0V    |
| WL2  | 0V      | 12V  | 0V    |
| WL1  | 8V      | 6V   | 0V    |
| WL0  | 8V      | 6V   | 0V    |
| DL2  | 0V      | 6V   | 0V    |
| GSL1 | 0V      | 6V   | 6V    |
| GSL0 | 0V      | 6V   | 6V    |
| CSL  | 1.2V    | 0V   | Vers  |

Fig. 49B

| BL | 0V/Vcc | Vcc | Floating |
|---|---|---|---|
| SSL1 | Vcc | 7V | Floating |
| SSL0 | Vcc | 7V | Floating |
| DL1 | 8V | 7V | 0V |
| WL7 | 8V | 7V | 0V |
| WL6 | 8V | 5V | 0V |
| WL5 | 0V | 10V | 0V |
| WL4 | 15V | 1V/2.5V/4V | 0V |
| WL3 | 15V | 1V/2.5V/4V | 0V |
| WL2 | 0V | 10V | 0V |
| WL1 | 8V | 5V | 0V |
| WL0 | 8V | 7V | 0V |
| DL2 | 0V | 7V | 0V |
| GSL1 | 0V | 7V | 6V |
| GSL0 | 0V | 7V | 6V |
| CSL | 1.2V | 0V | Vers |

FLOATING GATE TYPE NONVOLATILE MEMORY DEVICE AND RELATED METHODS OF MANUFACTURE AND OPERATION

CROSS-REFERENCE TO RELATED APPLICATIONS

This application claims priority under 35 U.S.C. §119 to Korean Patent Application Nos. 10-2010-0034766 filed on Apr. 15, 2010 and 10-2010-0106212 filed on Oct. 28, 2010, the collective disclosures of which are hereby incorporated by reference in their entirety.

BACKGROUND OF THE INVENTION

Embodiments of the inventive concept relate generally to semiconductor memory devices. More particularly, embodiments of the inventive concept relate to floating gate type flash memory devices and related methods of manufacture and operation.

Flash memory devices can be roughly divided into two categories according to a type of charge storage element used in their memory cells. These categories include charge trap type flash memory devices, which use an insulation layer (e.g., a silicon nitride layer) as the charge storage element, and floating gate type flash memory devices, which use an electrically isolated conductive pattern (i.e., a floating gate) as the charge storage element.

Due to limits of current technology, floating gate type flash memory devices tend to have superior reliability than charge trap type flash memory devices. Accordingly, most commercialized flash memory devices are floating gate type flash memory devices. As technology progresses, however, charge type flash memory devices are expected to gain popularity. For instance, the 2009 edition of International Technology Roadmap for Semiconductors (ITRS) predicts that three-dimensional charge trap flash memory devices will be commercially adopted by 2014, replacing many floating gate type flash memory devices.

Notwithstanding these predictions, the development of charge trap flash memory devices remains uncertain, and future improvements could allow floating gate type flash memory devices to remain the dominant form of flash memory for years to come.

SUMMARY OF THE INVENTION

Embodiments of the inventive concept provide nonvolatile memory devices having an increased coupling ratio between a charge storage element and corresponding electrodes. Embodiments of the inventive concept also provide methods of manufacturing and operating the nonvolatile memory devices.

According to one embodiment of the inventive concept, a nonvolatile memory device comprises a semiconductor pattern comprising a channel region, a floating gate formed over the semiconductor pattern and facing the channel region, and first and second wordlines formed over the semiconductor substrate on opposite sides of the floating gate. The floating gate is separated from the semiconductor pattern by a first distance, and the first and second wordlines are separated from the semiconductor pattern by a second distance greater than the first distance.

In certain embodiments, the memory element has a disk shape comprising through hole, the first and second wordlines each have a line shape comprising a through hole, and the semiconductor pattern is formed in the through hole of the floating gate and the through holes of the first and second wordlines.

In certain embodiments, the nonvolatile memory device further comprises a substrate formed below the first and second wordlines, wherein the first and second wordlines have major axes that are substantially parallel to a top surface of the substrate, and the semiconductor pattern has a major axis that is substantially perpendicular to the top surface of the substrate.

In certain embodiments, the nonvolatile memory device further comprises a first insulation layer interposed between the floating gate and the semiconductor pattern, and a second insulation layer interposed between the semiconductor pattern and the first and second wordlines. The floating gate comprises a conductive pattern that is electrically isolated from the semiconductor pattern and is electrically isolated from the first and second wordlines by the first and second insulation layers.

In certain embodiments, a thickness of the first insulation layer is less than a thickness of the second insulation layer.

In certain embodiments, the second insulation layer is a multi-layer comprising at least two of a silicon oxide layer, a silicon nitride layer, a silicon oxide nitride layer, and a high-k dielectric.

In certain embodiments, the first insulation layer is a silicon oxide layer formed locally on a surface of the floating gate adjacent to the semiconductor pattern.

In certain embodiments, the first insulation layer comprises a tunnel region adjacent to the floating gate and a spacer region extending from the tunnel region to be adjacent to the first and second wordlines, and a distance between the semiconductor layer and a sidewall of the first insulation layer spaced apart from the semiconductor layer is greater in the spacer region than in the tunnel region.

According to another embodiment of the inventive concept, a method of manufacturing a nonvolatile memory device comprises forming a mold structure on a substrate, the mold structure comprising interlayer insulation layers and mold layers stacked sequentially and alternately, forming an opening that penetrates the mold structure and exposes sidewalls of the interlayer insulation layer, forming memory element molding regions between the mold layers by horizontally etching the exposed sidewalls of the interlayer insulation layers, and forming memory elements each being locally formed in one of the memory element molding regions.

In certain embodiments, the method further comprises, after forming the memory elements, forming a first insulation layer to cover a sidewall of the memory element adjacent to the opening, and forming a semiconductor layer in the opening having the first insulation layer.

In certain embodiments, the method further comprises, after the forming of the semiconductor layer, forming a trench that penetrates the mold structure and exposes sidewalls of the mold layers, forming wordline molding regions by horizontally etching the exposed sidewalls of the mold layers, the wordline molding regions being formed to expose sidewalls of the semiconductor layer between the memory elements, and forming wordlines in the wordline molding regions.

In certain embodiments, the method further comprises, before forming the wordlines, forming a second insulation layer in the wordline molding regions, wherein the second insulation layer covers an inner wall of the wordline molding regions and a thickness of the second insulation layer is greater than a thickness of the first insulation layer.

According to another embodiment of the inventive concept, a method is provided for operating a nonvolatile memory device comprising conductive patterns that cross over a semiconductor layer and memory elements that face the semiconductor layer and are disposed between the conductive patterns. The method comprises performing a cell selection operation by selecting one of the memory elements. The cell selection operation comprises applying three different voltages to three respective conductive patterns disposed sequentially at one side of a selected one of the memory elements.

In certain embodiments, the memory elements are floating gates and the conductive patterns comprise wordlines used to access the memory elements.

In certain embodiments, during the cell selection operation, the voltages V1, V2, and V3 are respectively applied to three wordlines disposed sequentially at one side of the selected memory element, wherein the voltages V1, V2, and V3 satisfy an inequality $(V1-V2) \times (V2-V3) < 0$.

In certain embodiments, the method further comprises performing a program operation to selectively change data stored in one of the memory elements, and performing a read operation to read data stored in one of the memory elements. The program operation or the read operation comprises a cell selection operation.

In certain embodiments, during the program operation, the voltages V1 and V3 are higher than an operating voltage Vcc, the voltage V2 is lower than the operating voltage Vcc, and the voltage V1 is higher than the voltage V3.

In certain embodiments, during the program operation, voltages V4, V5, and V6 are respectively applied to three wordlines disposed sequentially at a second side of the selected memory element, wherein the voltages V4, V5, and V6 are substantially identical to the voltages V1, V2, and V3, respectively.

In certain embodiments, during the read operation, the voltage V1 is lower than the voltages V2 and V3.

In certain embodiments, during the cell selection operation, the voltages V1, V2, V3, and V4 are respectively applied to four wordlines disposed sequentially at one side of the selected memory element. The voltages V1, V2, and V3 satisfy an inequality $(V1-V2) \times (V2-V3) < 0$, the voltage V1 is lower than the voltages V2, V3, and V4, and the voltage V4 has a value between the voltages V2 and V3.

BRIEF DESCRIPTION OF THE DRAWINGS

The drawings illustrate selected embodiments of the inventive concept. In the drawings, like reference numbers indicate like features. In addition, the relative dimensions of certain features may be exaggerated for clarity of illustration.

FIGS. 42 and 43 are tables illustrating an aspect of program and read operations of a memory device according to an embodiment of the inventive concept.

FIGS. 49A and 49B are tables illustrating a method of operating a memory device according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "on" another feature, it can be directly on the other feature, or intervening features may also be present. Where a feature is referred to as being "under" another feature, it can be directly under, or one or more intervening features may also be present. In addition, where a feature is referred to as being "between" two other features, it can be the only feature between the two other features, or additional intervening features may be present.

Although the terms first, second, etc., are used to describe various features, the described features should not be limited by these terms. Rather, these terms are merely used to distinguish between different features.

In certain embodiments of the inventive concept, a nonvolatile memory device comprises a cell array region, a peripheral circuit region, a sense amp region, a decoding circuit region, and a connection region. The cell array region includes a plurality of memory cells and a plurality of bitlines and wordlines for electrically connecting to the memory cells. The peripheral circuit region includes circuits for driving the memory cells. The sense amp region includes circuits for reading information stored in the memory cells. The connection region is disposed between the cell array region and the decoding circuit region, and it includes a wiring structure electrically connecting the wordlines and the decoding circuit region.

The following description relates largely to the cell array region of a nonvolatile memory device. Other regions, such as the peripheral circuit region and the connection region, are described in further detail in Korean Patent Applications Nos. 2009-0126854 filed on Dec. 18, 2009, 2010-0014751 filed on Feb. 18, 2010, 2010-0006124 filed on Jan. 22, 2010, and 2009-0099370 filed on Oct. 19, 2009, and U.S. patent application Ser. No. 12/480,399 filed on Jun. 8, 2009, the respective disclosures of which are hereby incorporated by reference in their entirety. Korean Patent Application No. 2010-0006124 also discloses a multi-layer memory structure formed by repeatedly forming a memory structure or a cell array structure. Similarly, in certain embodiments of the inventive concept, multi-layer memory structures can be formed by repeatedly forming a memory structure or a cell array structure.

Figure 1:
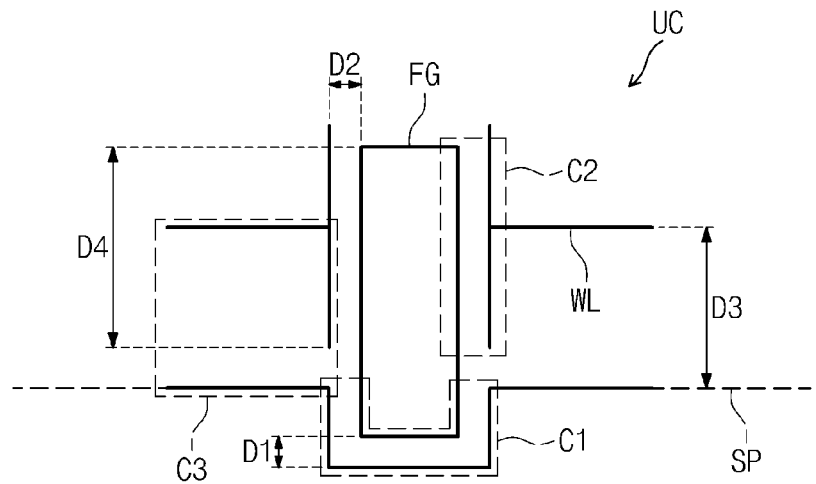
FIG. 1 is a circuit diagram illustrating a unit cell of a nonvolatile memory device according to an embodiment of the inventive concept.

FIG. 1 is a circuit diagram illustrating a unit cell UC of a nonvolatile memory device according to an embodiment of the inventive concept.

Referring to FIG. 1, unit cell UC comprises a semiconductor pattern SP, a pair of wordlines WL facing semiconductor pattern SP, and one floating gate FG disposed between wordlines WL and facing semiconductor pattern SP. Semiconductor pattern SP and floating gate FG form one capacitor (referred to as a first capacitor C1), floating gate FG and one of wordlines WL form another capacitor (referred to as a second capacitor C2), and one of wordlines WL and semiconductor pattern SP form another capacitor (referred to as a third capacitor C3).

A distance D3 between wordlines WL and semiconductor pattern SP is greater than a distance D1 between floating gate FG and semiconductor pattern SP, and a distance D2 between wordlines WL and floating gate FG is greater than distance D1.

Figure 2:
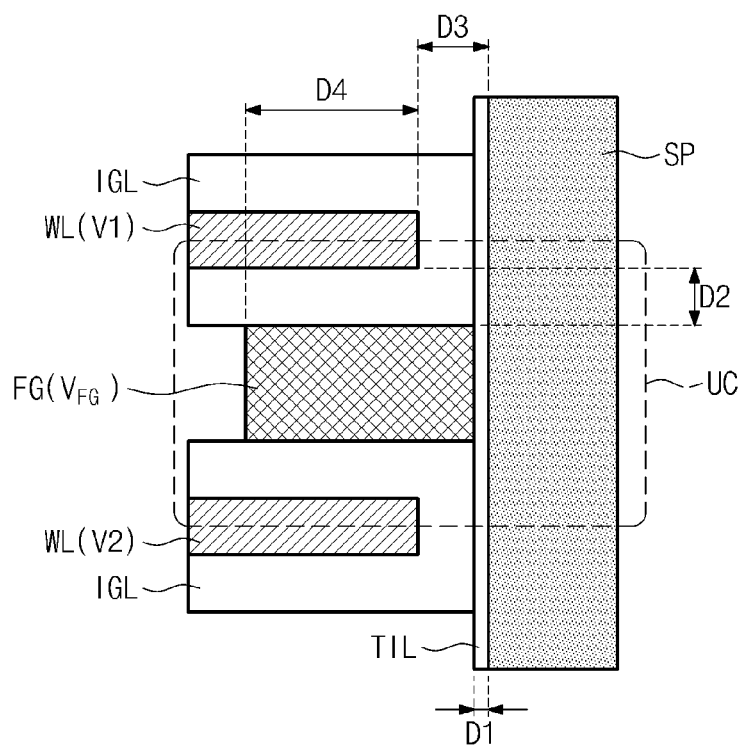
FIG. 2 is a sectional view illustrating a unit cell of a nonvolatile memory device according to an embodiment of the inventive concept.

FIG. 2 is a sectional view illustrating unit cell UC according to an embodiment of the inventive concept.

Referring to FIG. 2, a tunnel insulation layer TIL is disposed between floating gate FG and semiconductor pattern SP, and an inter gate insulation layer IGL is disposed between wordline WL and floating gate FG. These insulation layers form dielectrics of first through third capacitors C1, C2, and C3. Each of wordlines WL is shared by two adjacent unit cells UC, so a total volume of the pair of wordlines WL in unit cell UC is substantially the same as that of one wordline WL.

In the embodiment of FIG. 2, inter gate insulation layer IGL extends between wordlines WL and floating gate FG so that it is interposed between tunnel insulation layer TIL and wordlines WL. Distance D3 between wordlines WL and semiconductor pattern SP is a sum of distance D2, which corresponds to a thickness of inter gate insulation layer IGL, and distance D1, which corresponds to a thickness of tunnel insulation layer TIL. Accordingly, distance D3 is greater than distance D1. Additionally, inter gate insulation layer IGL is formed thicker than tunnel insulation layer TIL. Accordingly, distance D2 is greater than distance D1.

Because unit cell UC comprises two wordlines WL facing floating gate FG, a facing area between floating gate FG and wordlines WL is increased compared to a conventional floating gate type device in which a multi-layered gate structure is interposed between a semiconductor pattern and a wordline. The facing area is a function of an overlapping length D4 between floating gate FG and wordlines WL. The facing area contributes to capacitive coupling between floating gate FG and wordlines WL. Due to the increase in the facing area, unit cell UC can have an increased coupling ratio compared with a conventional floating gate type device.

Figure 3:
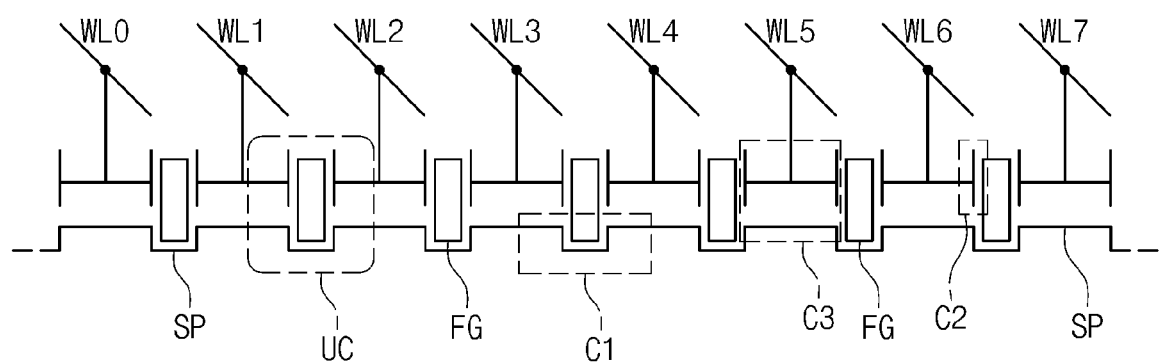
FIG. 3 is a circuit diagram illustrating a part of a cell string of a nonvolatile memory device according to an embodiment of the inventive concept.
Figure 4:
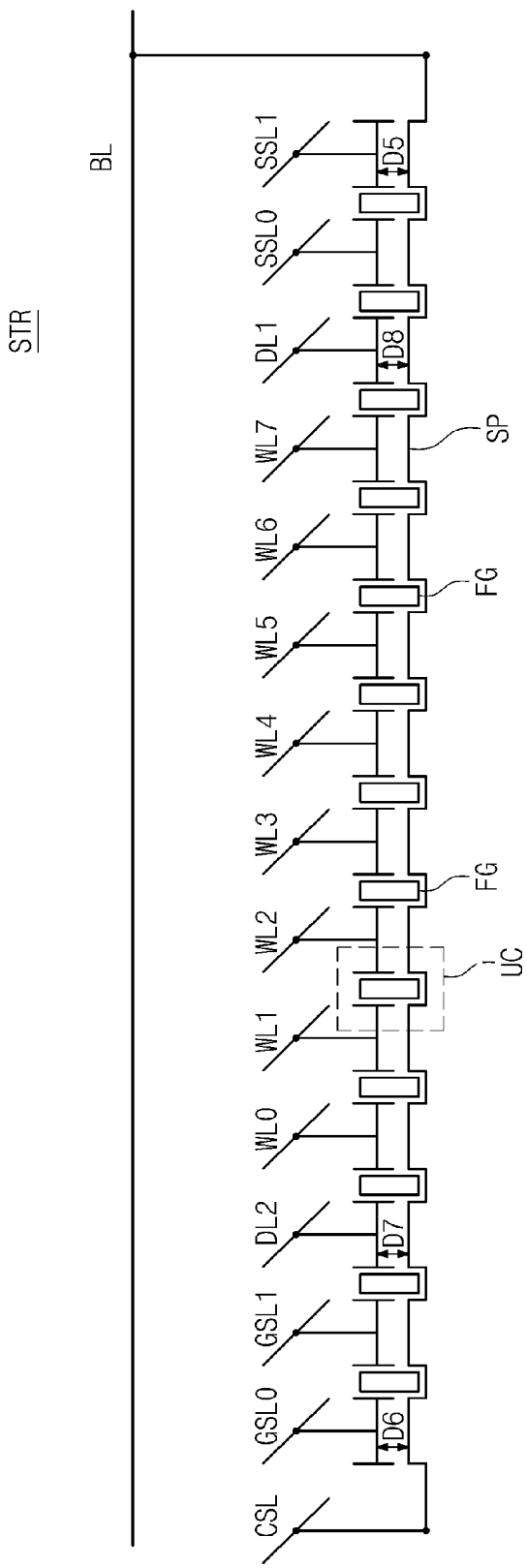
FIG. 4 is a circuit diagram illustrating a cell string of a nonvolatile memory device according to an embodiment of the inventive concept.

FIG. 3 is a circuit diagram illustrating a part of a cell string of a nonvolatile memory device according to an embodiment of the inventive concept, and FIG. 4 is a circuit diagram illustrating a cell string of a nonvolatile memory device according to an embodiment of the inventive concept.

Referring to FIG. 3, the cell string comprises a plurality of unit cells UC connected in series. Unit cells UC are substantially the same as unit cell UC of FIG. 1. Wordlines WL0 through WL7 are arranged across semiconductor pattern SP at locations between floating gates FG facing semiconductor pattern SP. In this arrangement, even where wordlines WL0 through WL7 exert an electrical influence on semiconductor pattern SP, an electrical influence of floating gates FG is greater because distance D3 is significantly greater than distance D1.

Referring to FIG. 4, cell string STR comprises at least one string selection line SSL0 or SSL1 arranged across semiconductor pattern SP, at least one ground selection line GSL0 or GSL1, and wordlines WL0 through WL7 arranged between string selection lines SSL0 and SSL1 and ground selection lines GSL0 and GSL1. String selection lines SSL0 and SSL1 are configured to control an electrical connection between a bitline BL and semiconductor pattern SP, and ground selection lines GSL0 and GSL1 are configured to control an electrical connection between common source line CSL and semiconductor pattern SP.

At least one first dummy line DL1 is disposed between string selection lines SSL0 and SSL1 and wordline WL7, and a second dummy line DL2 is disposed between ground selection lines GSL0 and GSL1 and wordline WL0.

A distance D5 between string selection lines SSL0 and SSL1 and semiconductor pattern SP, a distance D6 between the ground selection lines GSL0 and GSL1 and semiconductor pattern SP, and distances D7 and D8 between the first and second dummy lines DL1 and DL2 and semiconductor pattern SP are not necessarily the same as distance D3 between wordlines WL0 through WL7 and semiconductor pattern SP. That is, distance D3 may be different from at least one of distances D5, D6, D7, and D8.

Figure 5:
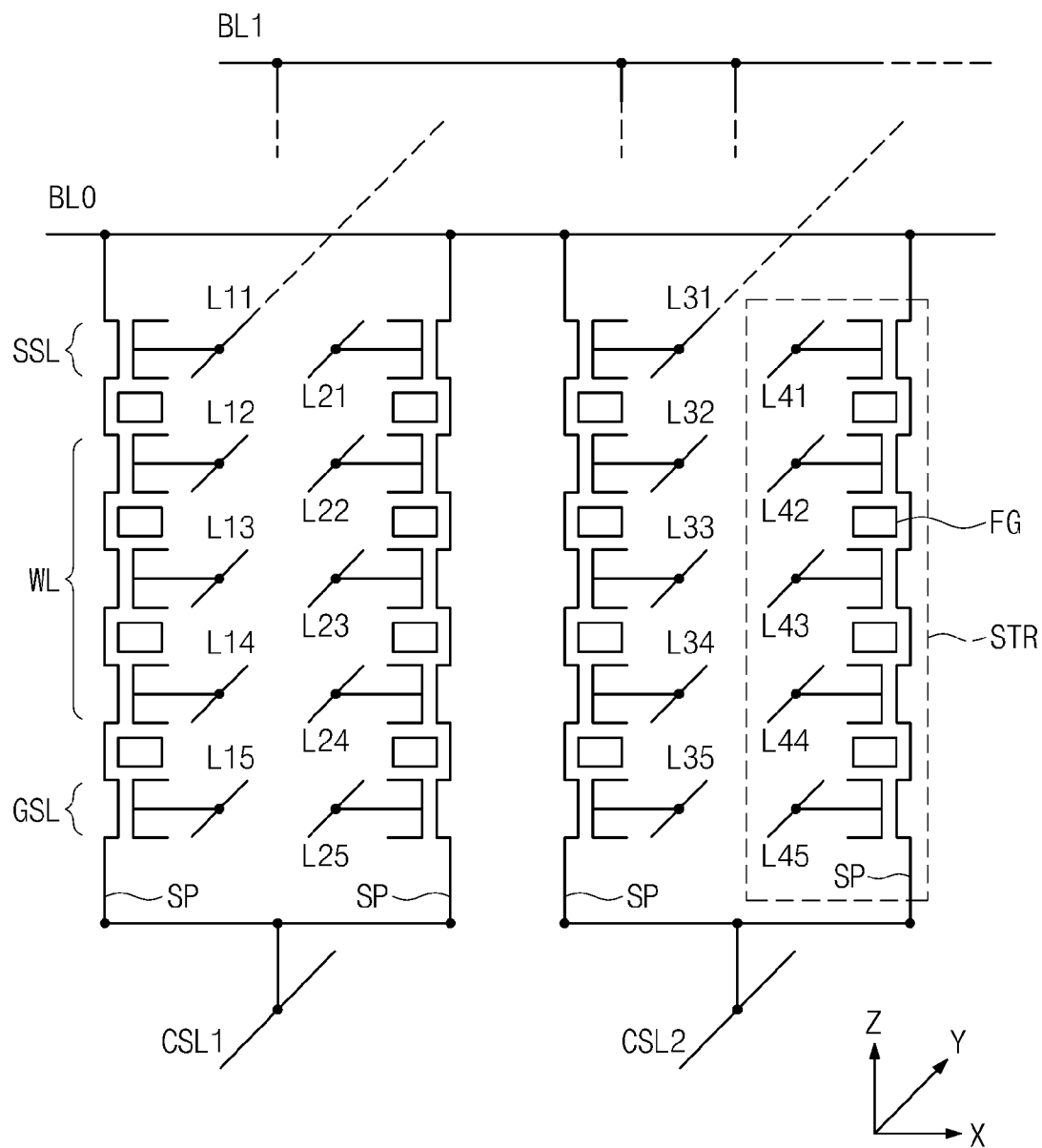
FIG. 5 is a circuit diagram illustrating a cell array of a nonvolatile memory device according to an embodiment of the inventive concept.

FIG. 5 is a circuit diagram illustrating a cell array of a nonvolatile memory device according to an embodiment of the inventive concept.

Referring to FIG. 5, the cell array comprises common source lines CSL1 and CSL2, bitlines BL0 and BL1, and a plurality of cell strings STR connected therebetween. Each of cell strings STR comprises a portion described with reference to FIG. 3 or a cell string described with reference to FIG. 4. Each of cell strings STR comprises a semiconductor pattern SP, a plurality of conductive lines L11 through L45 facing semiconductor pattern SP, and a plurality of floating gates FG disposed therebetween to face semiconductor pattern SP.

Conductive lines L11 through L45 will be referred to collectively as conductive lines Lxz, where xz refers to their respective x and z locations within an xyz coordinate system illustrated in FIG. 5.

Conductive lines Lxz are used as wordlines WL, string selection lines SSL0 and SSL1, ground selection lines GSL0 and GSL1, and first and second dummy lines DL1 and DL2. For simplicity, FIG. 5 illustrates an example where five conductive lines Lxz constitute one cell string STR. However, the number of conductive lines Lxz constituting one cell string STR can be increased or decreased in other embodiments. For example, one cell string STR can comprise conductive lines constituting 2n or 2n+m wordlines, a plurality of string selection lines, a plurality of ground selection lines, and a plurality of dummy lines, where "n" is a natural number greater than 2 and "m" is a natural number greater than 1.

In some embodiments, cell strings STR are arranged in an xy plane to electrically connect common source lines CSL1 and CSL2 with bitlines BL0 and BL1. Semiconductor patterns SP can also be arranged in a plane between common source lines CSL1 and CSL2 and bitlines BL0 and BL1. In this case, conductive lines Lxz can be three-dimensionally arranged on the xy plane to cross over semiconductor patterns SP. In the example of FIG. 5, bitlines BL0 and BL1 are disposed with a major axis parallel to an x-axis, conductive lines Lxz are disposed with a major axis parallel to a y-axis, and semiconductor patterns SP are disposed with a major axis parallel to a z-axis. Furthermore, floating gates FG are disposed three-dimensionally on the xy plane so the memory device of FIG. 5 forms a three-dimensional floating gate type nonvolatile memory device.

In the embodiment of FIG. 5, common source lines CSL are electrically separated from each other. However, in other embodiments, common source lines CSL can be connected to each other so they are in an equipotential state. Additionally, in the embodiment of FIG. 5, conductive lines Lxz are electrically separated from each other. However, in other embodiments, some of conductive lines Lxz are connected to each other so they are in an equipotential state.

The connection structures of conductive lines Lxz can be realized in various forms such as those disclosed in Korean Patent Applications Nos. 2009-0126854, 2010-0014751, 2010-0006124, 2009-0099370, and U.S. patent application Ser. No. 12/480,399.

FIGS. 6 through 40 illustrate various embodiments of a nonvolatile memory device such as that described with reference to FIG. 5. Many of these embodiments are presented by simplified illustrations to reduce the complexity of the drawings and to provide a clear understanding of technical ideas related to the inventive concept. Certain features omitted from one drawing can be understood by referencing other drawings, which may include the omitted features.

Figure 12:
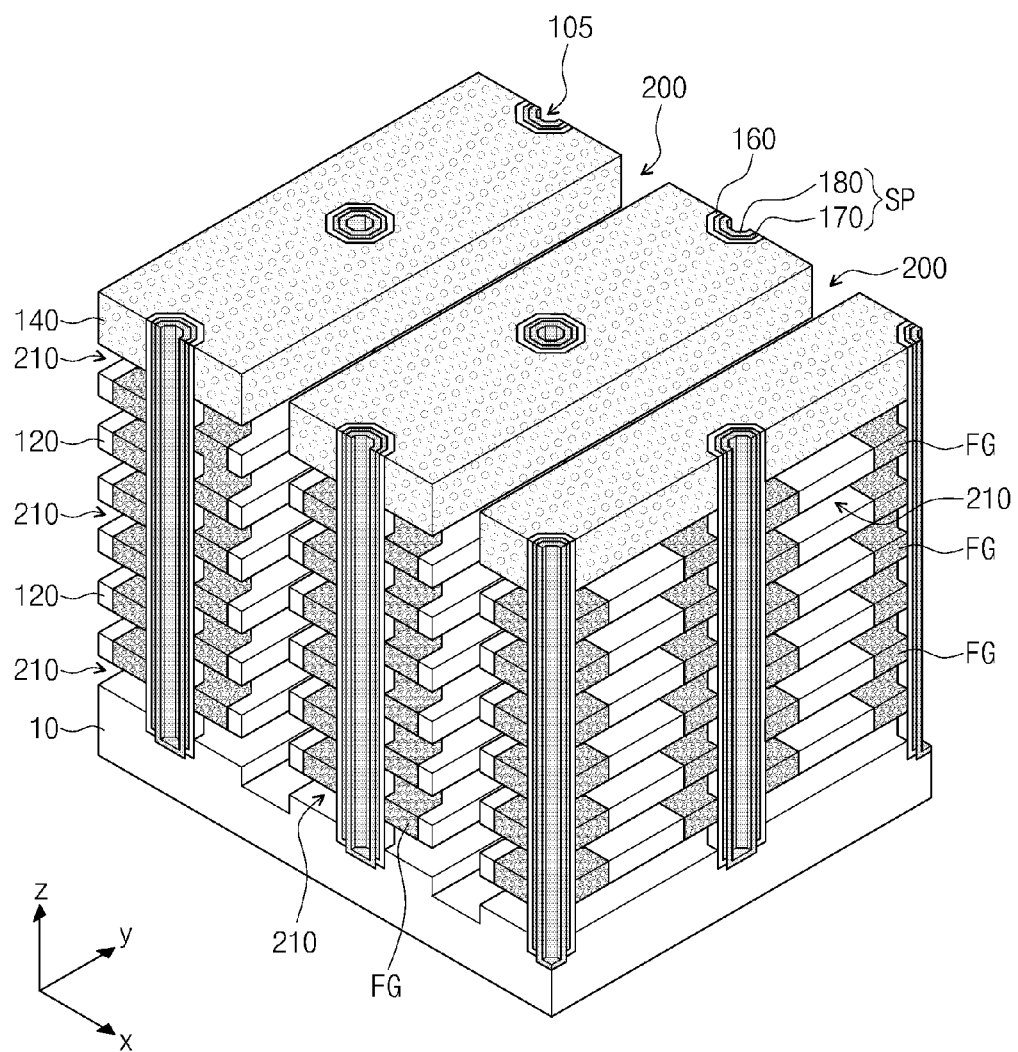
Figure 13:
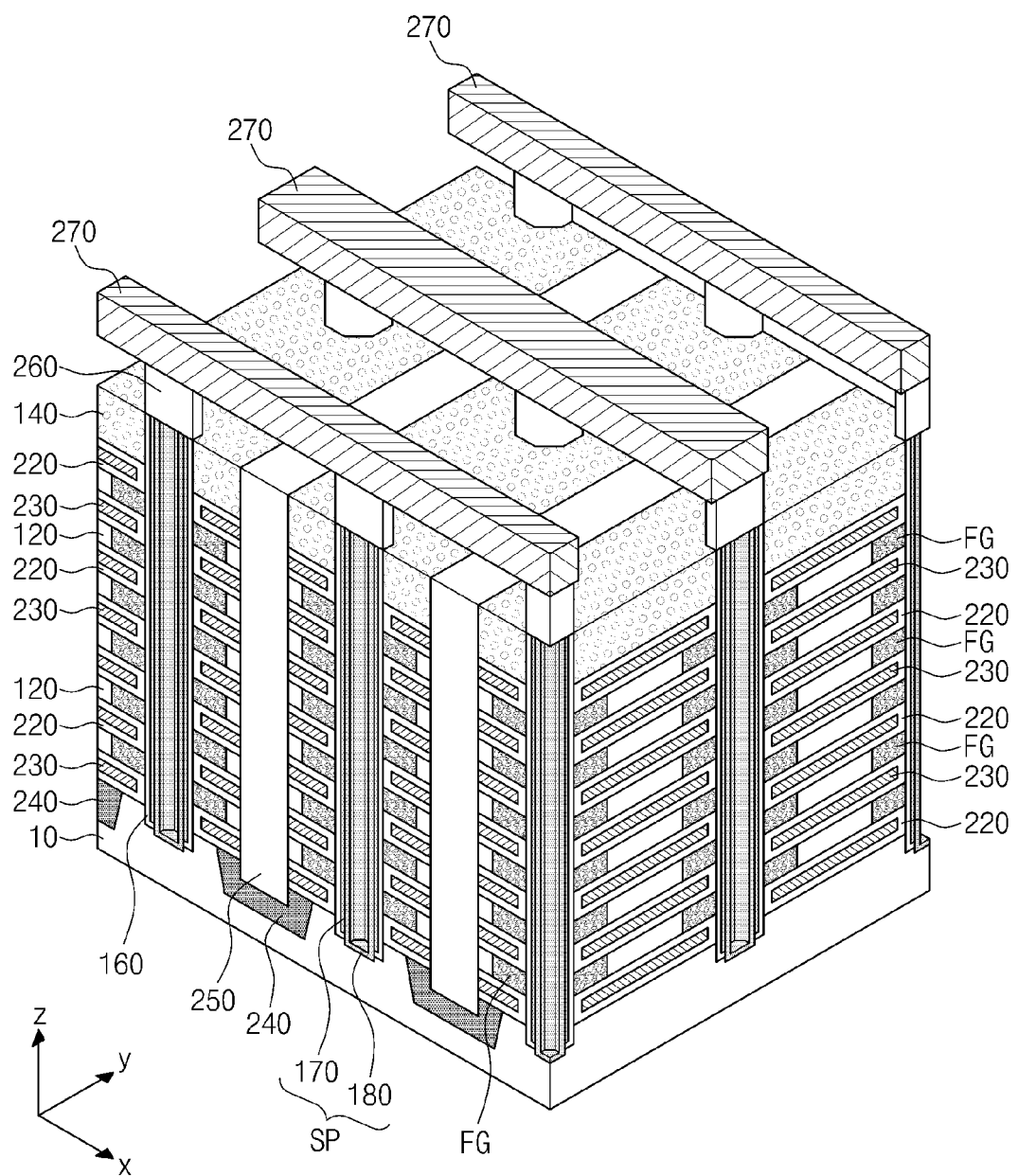
Figure 14:
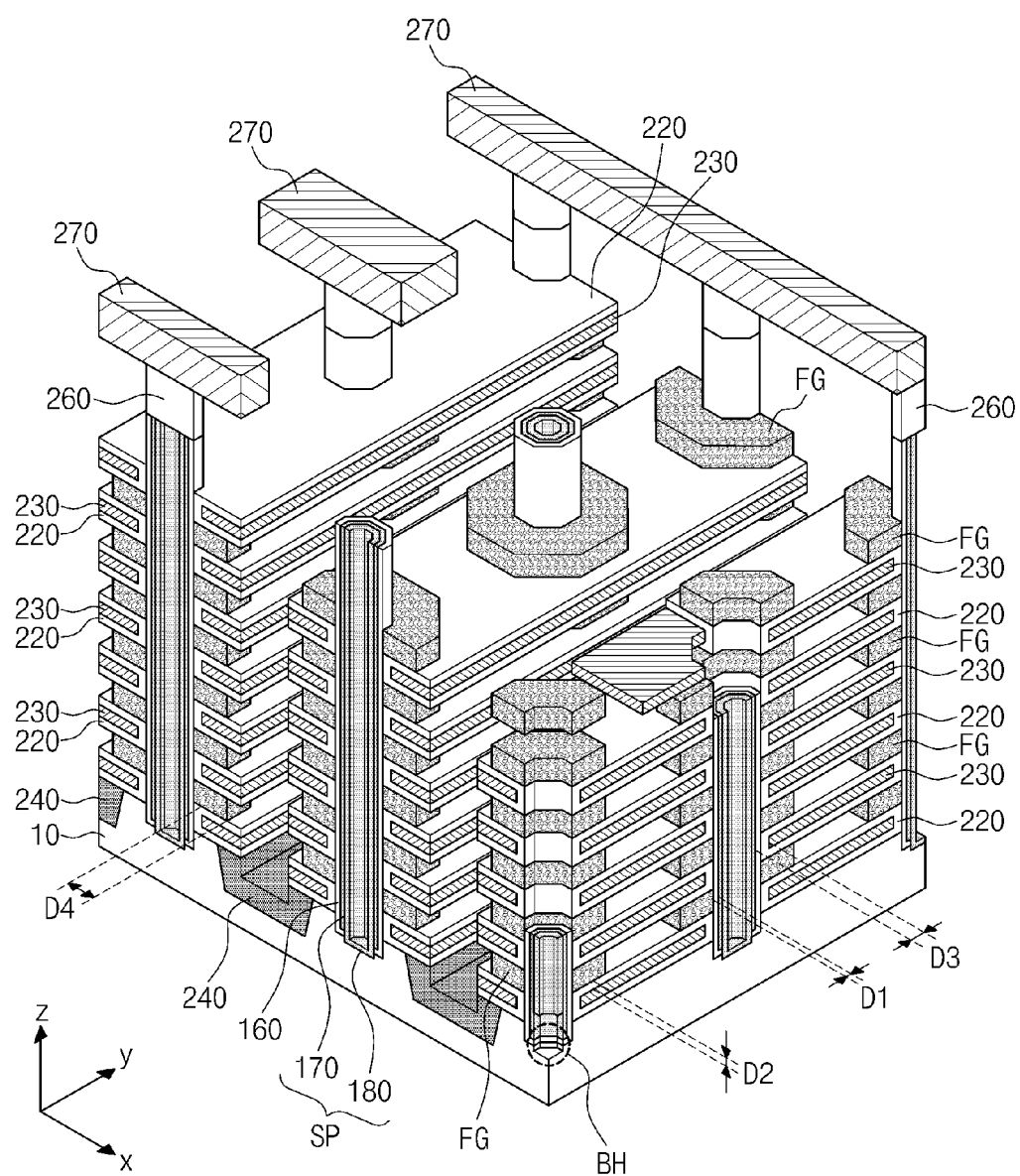
FIG. 14 is a perspective view illustrating a nonvolatile memory device manufactured by the method of FIGS. 6 through 13.

FIGS. 6 through 13 are perspective views illustrating a method of manufacturing a nonvolatile memory device according to an embodiment of the inventive concept, and FIG. 14 is a perspective view illustrating a nonvolatile memory device produced by the method of FIGS. 6 through 13.

Figure 6:
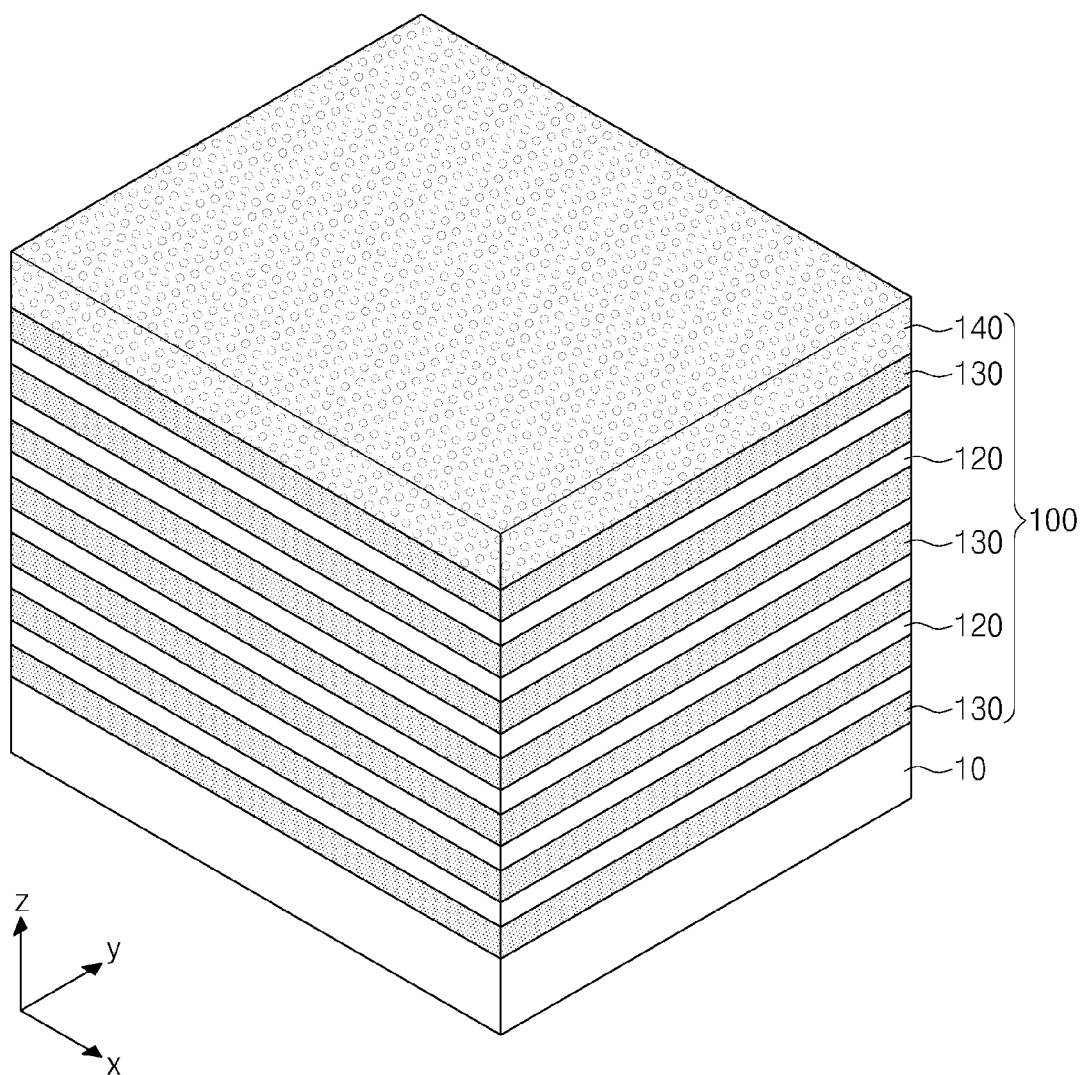
FIGS. 6 through 13 are perspective views illustrating a method of manufacturing a nonvolatile memory device according an embodiment of the inventive concept.

Referring to FIG. 6, a mold structure 100 is formed on a substrate 10. Substrate 10 typically comprises a material having a semiconductor property, an insulation material, or a semiconductor or conductor covered by an insulation material. For example, in some embodiments, substrate 10 comprises a silicon wafer.

In some embodiments, a lower structure including at least one transistor is disposed between substrate 10 and mold structure 100. However, for simplicity, an embodiment is described in which mold structure 100 is formed directly on substrate 10.

Mold structure 100 comprises a plurality of sacrificial mold layers 130 and a plurality of interlayer insulation layers 120. Interlayer insulation layers 120 and sacrificial mold layers 130 are alternately and repeatedly stacked as shown in the drawings. Sacrificial mold layer 130 is formed of a material having an etch selectivity with respect to interlayer insulation layer 120. That is, sacrificial mold layer 130 is formed of a material that can be etched while minimizing etching of interlayer insulation layer 120. This etch selectivity can be quantitatively expressed as a ratio of an etch rate of sacrificial mold layer 130 to an etch rate of interlayer insulation layer 120. In some embodiments, for example, sacrificial mold layer 130 can comprise a material having an etch selectivity between 1:10 and 1:200 with respect to interlayer insulation layer 120.

In some embodiments, interlayer insulation layer 120 comprises a silicon oxide layer or a silicon nitride layer, and sacrificial mold layer 130 comprises a material different from interlayer insulation layer 120, such as a silicon layer, a silicon oxide layer, a silicon carbide layer, or a silicon nitride layer. In the description that follows, it will be assumed that interlayer insulation layers 120 are silicon oxide layers and sacrificial mold layers 130 are silicon nitride layers.

Mold structure 100 further comprises a capping layer 140 on its uppermost surface. Capping layer 140 is formed of a material having an etch selectivity with respect to sacrificial mold layers 130 and interlayer insulation layers 120.

Figure 7:
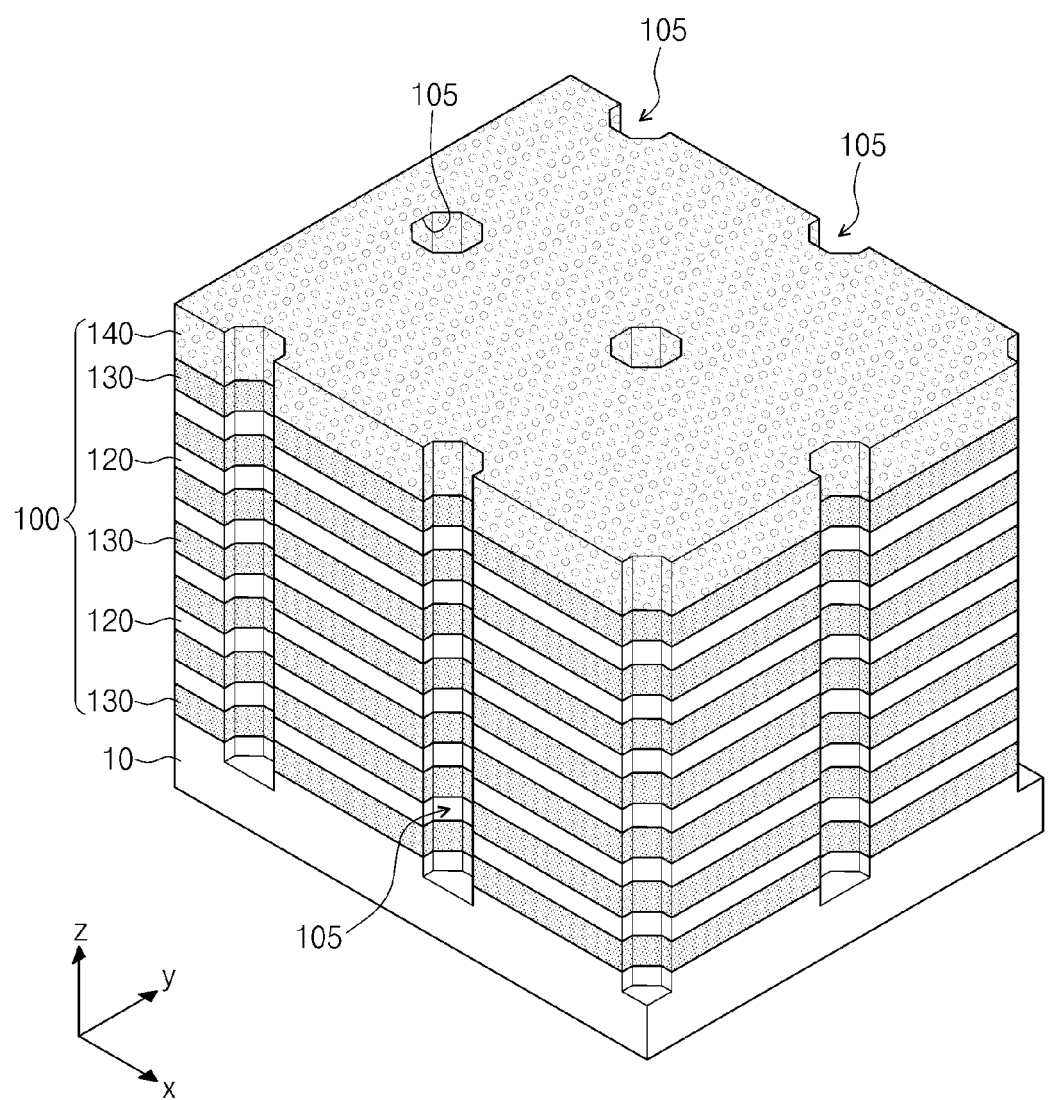

Referring to FIG. 7, openings 105 penetrating mold structure 100 are formed. Sidewalls of interlayer insulation layers 120 and sacrificial mold layers 130 are exposed by openings 105.

Openings 105 are formed with a hole shape having a depth that is at least five times larger than its width. Openings 105 are spaced apart from each other on the surface of substrate 10.

Openings 105 are formed by creating a mask pattern on mold structure 100 and anisotropically etching mold structure 100 using the mask pattern as an etch mask. Because mold structure 100 comprises two different types of layers, sidewalls of openings 105 may not be completely vertical relative to the surface of substrate 10. Moreover, the respective widths of openings 105 may narrow toward the surface of substrate 10. Width irregularities in openings 105 may cause irregularities in operating properties of three-dimensionally arranged transistors. A description of possible irregularities and methods of addressing the irregularities are disclosed in U.S. patent application Ser. No. 12/420,518, the disclosure of which is hereby incorporated by reference in its entirety.

Where mold structure 100 is directly formed on substrate 10, openings 105 expose a top surface of substrate 10 as shown in the drawings. Furthermore, as a result of over-etching during the anisotropic etching process, substrate 10 below opening 105 is recessed to a predetermined depth as shown in the drawings.

Figure 8:
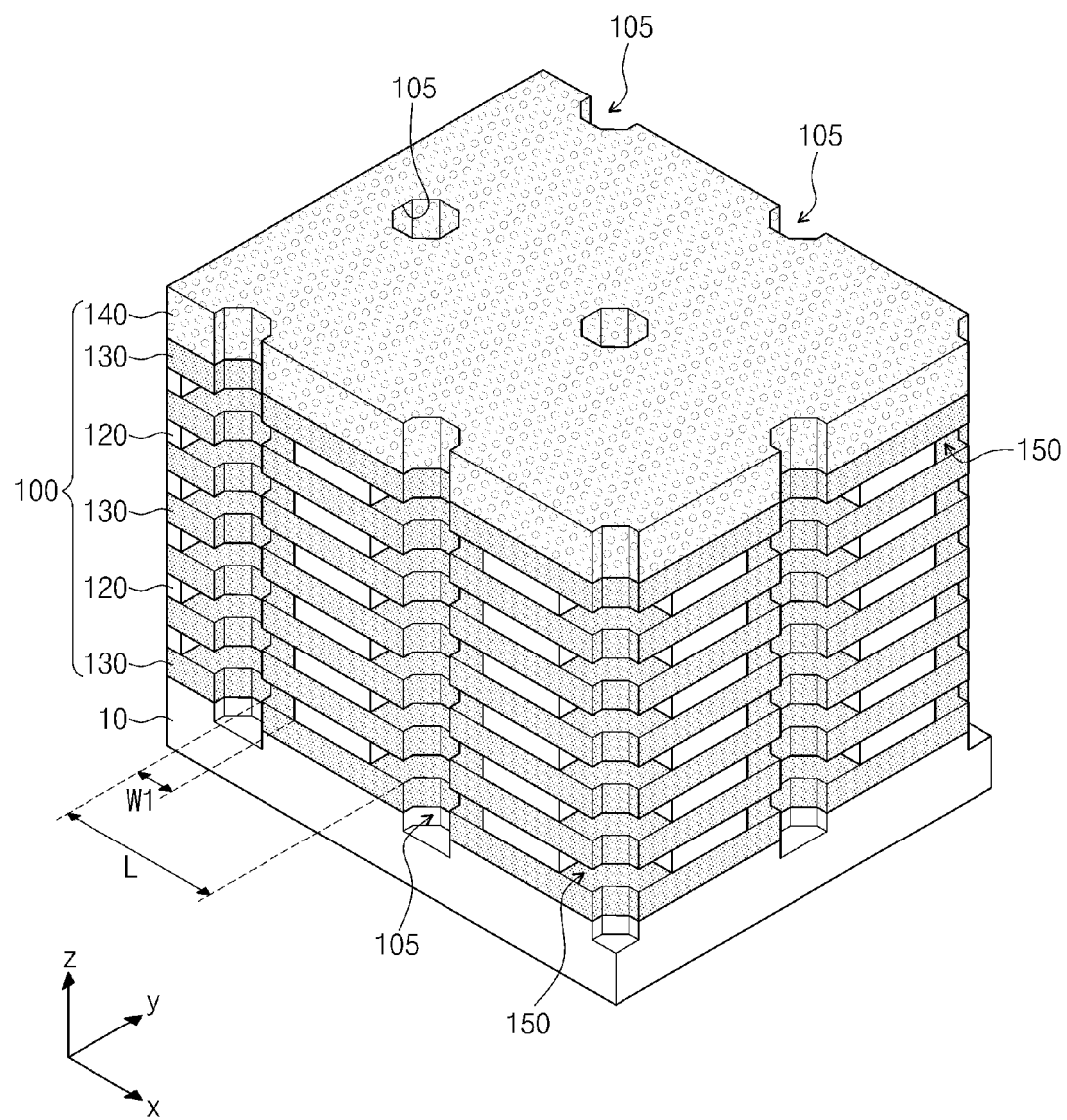

Referring to FIG. 8, floating gate molding regions 150 are formed by horizontally recessing sidewalls of interlayer insulation layers 120 exposed by openings 105. Floating gate molding regions 150 are gap regions that horizontally extend from openings 105. A horizontal depth or width W1 of floating gate molding regions 150 is less than one third of a distance between two adjacent openings 105.

Floating gate molding regions 150 are typically formed by horizontally etching interlayer insulation layers 120 using an etch recipe having an etch selectivity with respect to sacrificial mold layers 130. For example, where sacrificial mold layers 130 are silicon nitride layers and interlayer insulation layers 120 are silicon oxide layers, the horizontal etching can be performed using an etchant comprising hydrogen fluoride.

Figure 9:
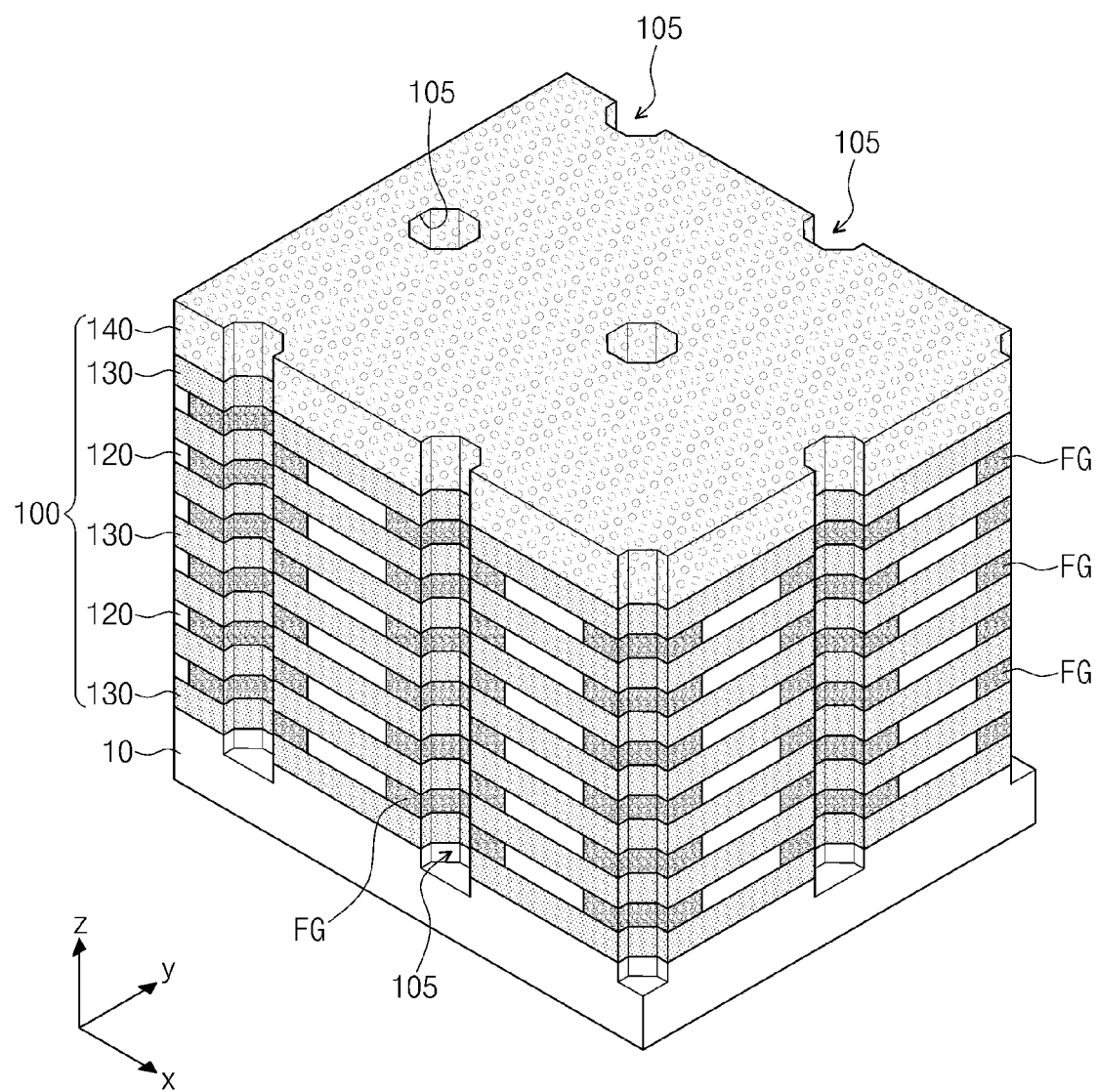

Referring to FIG. 9, floating gates FG are formed in floating gate molding regions 150. Floating gates FG are three-dimensionally arranged on substrate 10, and each of floating gates FG has an inner sidewall defining a through hole penetrated by opening 105. As shown in FIG. 14, each of floating gates FG comprises a disk having a through hole arranged in opening 105.

Floating gate FG is formed of a conductive material, such as doped polycrystalline silicon. The forming of floating gates FG typically comprises forming a conductive material to fill floating gate molding regions 150 and etching the conductive material to expose sidewalls of sacrificial mold layers 130 in opening 105.

Figure 10:
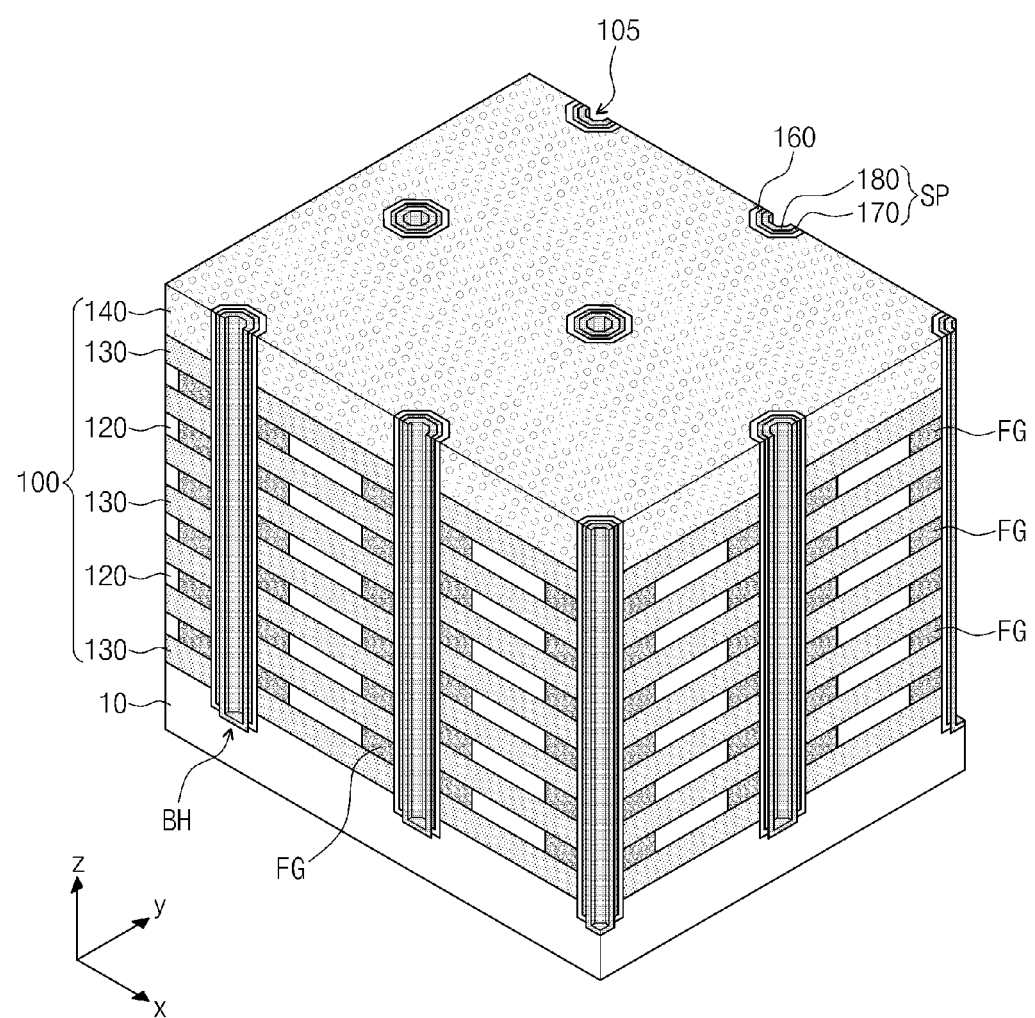

Referring to FIG. 10, a tunnel insulation pattern 160 and a semiconductor pattern SP are formed sequentially in each of openings 105. As shown in FIG. 14, tunnel insulation pattern 160 covers inner sidewalls of floating gates FG and inner sidewalls of sacrificial mold layers 130 in openings 105, but it leaves a bottom hole BH exposing the top surface of substrate 10. Semiconductor pattern SP contacts the top surface of substrate 10 through bottom hole BH and covers the inner sidewall of tunnel insulation pattern 160. In some embodiments, semiconductor pattern SP comprises a first semiconductor pattern 170 covering the inner wall of tunnel insulation pattern 160 and a second semiconductor pattern 180 contacting the top surface of substrate 10.

The forming of tunnel insulation pattern 160 and semiconductor pattern SP typically comprises sequentially forming a tunnel insulation layer and a first semiconductor layer covering the inner walls of openings 105 and then anisotropically etching the layers until the top surface of substrate 10 is exposed. Tunnel insulation pattern 160 and first semiconductor pattern 170 are formed with bottom hole BH exposing the top surface of substrate 10 at the bottom of openings 105. Next, after sequentially forming a second semiconductor layer covering an inner sidewall of the first semiconductor layer and a first buried insulation layer (not shown) filling openings 105, entire surfaces of the layers are etched to expose the top surface of mold structure 100.

Accordingly, second semiconductor pattern 180 is formed between the first buried insulation layer and first semiconductor pattern 170. Second semiconductor pattern 180 contacts the top surface of substrate 10 exposed through bottom hole BH. Tunnel insulation pattern 160 and first semiconductor pattern 170 are formed with a cylindrical shape having bottom hole BH exposing the top surface of substrate 10, and second semiconductor pattern 180 is formed with a cup shape having a bottom surface that contacts the top surface of substrate 10.

As a result of over-etch during the forming of first semiconductor pattern 170, the top surface of substrate 10 exposed by bottom hole BH may be additionally recessed. Moreover, a portion of tunnel insulation pattern 160 below first semiconductor pattern 170 is not etched during this etching process, and therefore tunnel insulation pattern 160 has a bottom part interposed between the bottom surface of first semiconductor pattern 170 and the top surface of substrate 10. In a modified embodiment, an etching step using first semiconductor pattern 170 as an etch mask is further performed to etch an exposed surface of tunnel insulation pattern 160. In this case, an under-cut region is formed below first semiconductor pattern 170, and the under-cut region is filled by second semiconductor pattern 180.

Tunnel insulation pattern 160 is an insulation layer formed using an atomic layer deposition (ALD) or chemical vapor deposition (CVD) technique. For example, tunnel insulation pattern 160 can be a silicon oxide layer formed using a CVD technique or a multi-layer thin layer comprising the same. Tunnel insulation pattern 160 typically has a thickness of about ⅟50 to ⅕ of the width of openings 105.

First and second semiconductor patterns 170 and 180 each comprise a polycrystalline silicon layer formed using an ALD or CVD technique. Additionally, first and second semiconductor patterns 170 and 180 typically have thicknesses of about ⅟50 to ⅕ of the width of openings 105. In some embodiments, first and second semiconductor patterns 170 and 180 are formed using an epitaxial technique. Examples of such epitaxial techniques are disclosed in Korean Patent Application No. 2010-0009628 filed on Feb. 2, 2010, the disclosure of which is hereby incorporated by reference in its entirety. In some embodiments, first and second semiconductor patterns 170 and 180 comprise organic semiconductor layers or carbon nano structures.

Figure 11:
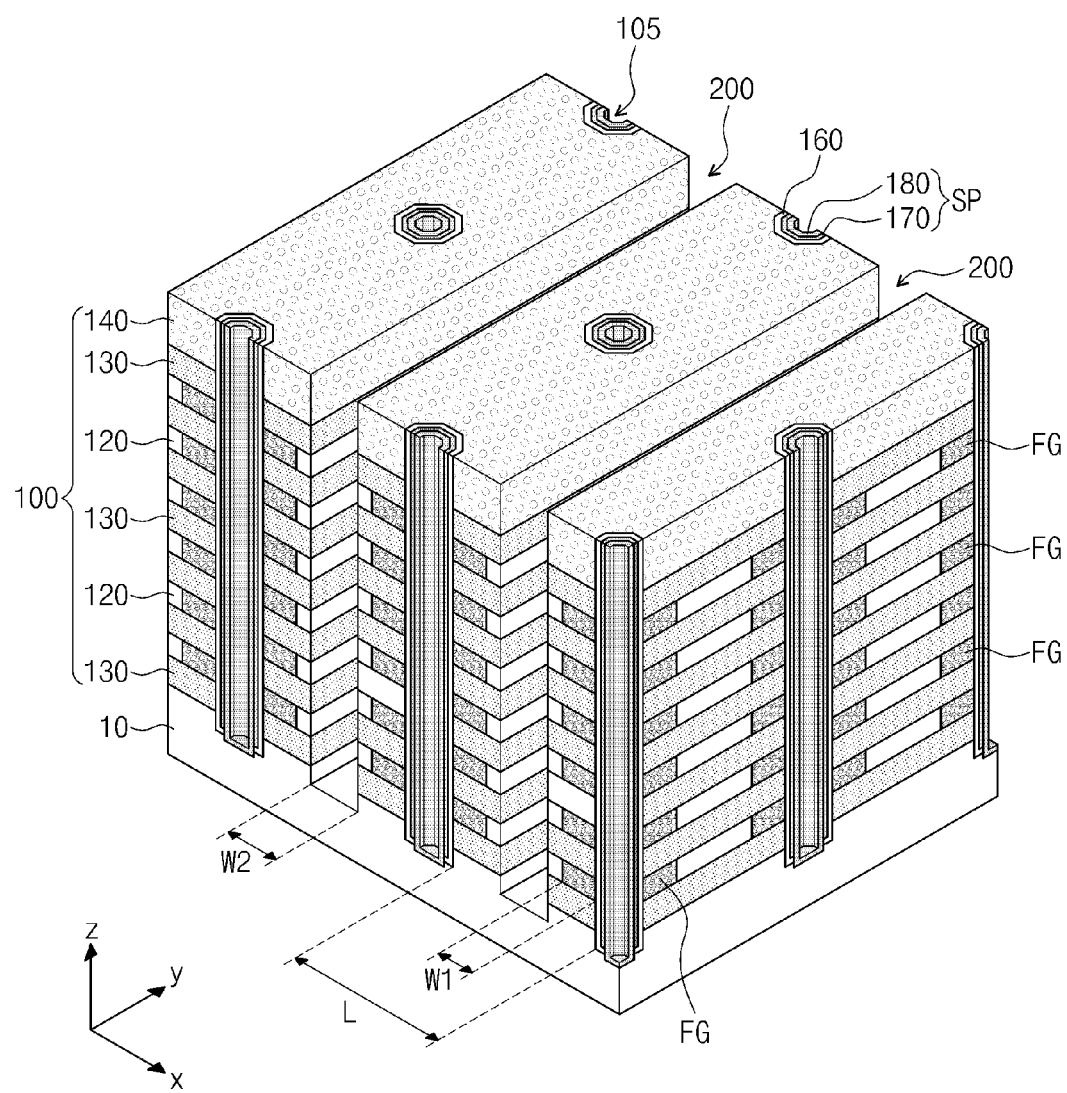

Referring to FIG. 11, trenches 200 are formed in mold structure 100. Trenches 200 expose sidewalls of sacrificial mold layers 130 and interlayer insulation layers 120. Trenches 200 are spaced from openings 105 and cross over between them as shown in the drawings.

In some embodiments, trench 200 is formed not to expose outer walls of floating gate FG. That is, width W2 of trench 200 is narrower than a difference between a distance L between adjacent openings 105 and two times horizontal depth W1 of floating gate molding region 150 (i.e., W2<L−2×W1). However, in some embodiments, a portion of floating gate FG is exposed by trench 200.

The forming of trenches 200 comprises forming an etch mask on top of mold structure 100, and anisotropically etching layers below the etch mask until a top surface of substrate 10 is exposed. As a result of over-etch during the anisotropic etching substrate 10 below trench 200 is recessed with a predetermined depth.

Because trench 200 and opening 105 are formed to penetrate mold structure 100, trenches 200 may have a reduced width as they approach the top surface of substrate 10, similar to opening 105. The width irregularity of trenches 200 may cause irregularities in operating properties of three-dimensionally arranged transistors. A description of such irregularities and methods of addressing them are disclosed in U.S. patent application Ser. No. 12/420,518.

In the embodiment of FIG. 11, a pair of trenches 200 is formed on opposite sides of each of openings 105. Accordingly, the number of openings 105 and trenches 200 in an x-axis direction with the same y coordinate is substantially the same. However, in other embodiments, the number and arrangement of these features can vary. For example, Korean Patent Application No. 2009-0126854 filed on Dec. 18, 2009 discloses various alternative arrangements of trenches and openings.

Referring to FIG. 12, wordline molding regions 210 are formed between interlayer insulation layers 120 by selectively removing the exposed sacrificial mold layers 130. Wordline molding regions 210 form gaps that extend horizontally from trenches 200 and expose sidewalls of semiconductor pattern SP and top surfaces or bottom surfaces of floating gate FG. More specifically, an outer boundary of wordline molding region 210 is limited by interlayer insulation layers 120 disposed on/below it and trenches 200 disposed at both sides of it. An internal boundary of wordline molding region 210 is defined by tunnel insulation pattern 160 penetrating it vertically.

The formation of wordline molding regions 210 comprises etching horizontally sacrificial mold layers 130 using an etch recipe having an etch selectivity with respect to floating gates FG and tunnel insulation pattern 160. For example, where sacrificial mold layers 130 are silicon nitride layers, interlayer insulation layers 120 are silicon oxide layers, and floating gate FG comprises polycrystalline silicon, the horizontal etch process is performed using an etchant comprising phosphoric acid.

Referring to FIG. 13, a wordline structure is formed to fill wordline molding regions 210. The wordline structure comprises an inter gate insulation pattern 220 covering an inner wall of wordline molding region 210 and a wordline 230 filling a remaining space of wordline molding region 210.

The forming of the wordline structure comprises sequentially forming an inter gate insulation layer and a wordline conductive layer filling wordline molding regions 210 and removing the wordline conductive layer in trenches 200 to leave wordlines 230 in wordline molding regions 210. Inter gate insulation pattern 220 is formed to cover at least the top surface, the bottom surface, and one sidewall of wordline molding region 210. That is, inter gate insulation pattern 220 continuously extends from between floating gate FG and wordline WL to cover the sidewalls of tunnel insulation pattern 160 or semiconductor pattern SP.

Like tunnel insulation pattern 160, inter gate insulation patterns 220 can comprise one thin layer or a plurality of thin layers. For example, inter gate insulation patterns 220 can comprise a silicon oxide layer, a silicon nitride layer, and a silicon oxide layer, which are sequentially stacked, and at least one of them can be replaced with a silicon oxide nitride layer and a high-k dielectric. In some embodiments, inter gate insulation pattern 220 is formed thicker than tunnel insulation pattern 160.

The wordline conductive layer typically comprises at least one of doped silicon, metal material, metal nitride layers, and metal silicide. For example, wordline conductive layer can comprise a tantalum nitride layer or a tungsten layer. In some embodiments, the wordline conductive layer is formed to cover the inner wall of trench 200. In such embodiments, the forming of wordlines 230 comprises removing the wordline conductive layer in trench 200 using an anisotropic etching method. In other embodiments, the wordline conductive layer is formed to fill trench 200. In such embodiments, the forming of wordlines 230 comprises anisotropically etching the wordline conductive layer in trenches 200.

In some embodiments, impurity regions 240 are formed after wordlines 230. Impurity regions 240 can be formed through an ion implantation process, and they can be formed in substrate 10 exposed through trench 200. Impurity regions 240 have a different conductivity type than substrate 10. On the other hand, a region (hereinafter, a contact region) of substrate 10 contacting semiconductor pattern SP has the same conductivity type as substrate 10. Accordingly, substrate 10 and semiconductor pattern SP along with impurity regions 240 form a PN-junction.

Impurity regions 240 can be used as common source lines CSL described with reference to FIG. 5. Impurity regions 240 can be connected to each other to be in an equipotential state or they can be electrically isolated to be in different potential states.

After impurity regions 240 are formed, an electrode separation pattern 250 filling trenches 200, upper plugs 260 contacting each of semiconductor patterns SP, and upper wirings 270 connecting upper plugs 260 are formed.

The forming of electrode separation pattern 250 comprises forming an electrode separation layer on the structure having impurity regions 240 and then etching the resulting structure to expose the top surface of mold structure 100. The electrode separation layer can be formed of at least one of a silicon oxide layer, a silicon nitride layer, and a silicon oxide nitride layer. Additionally, the etching process can be performed using a planarization technique such as chemical-mechanical polishing or an etch-back technique. In some embodiments, capping layer 140 constituting mold structure 100 is removed during the etching process.

Upper wirings 270 are formed to cross over the wordline structure. In some embodiments, upper wirings 270 are used as bitlines connecting to one side of a plurality of cell strings in a NAND flash memory.

Figure 15:
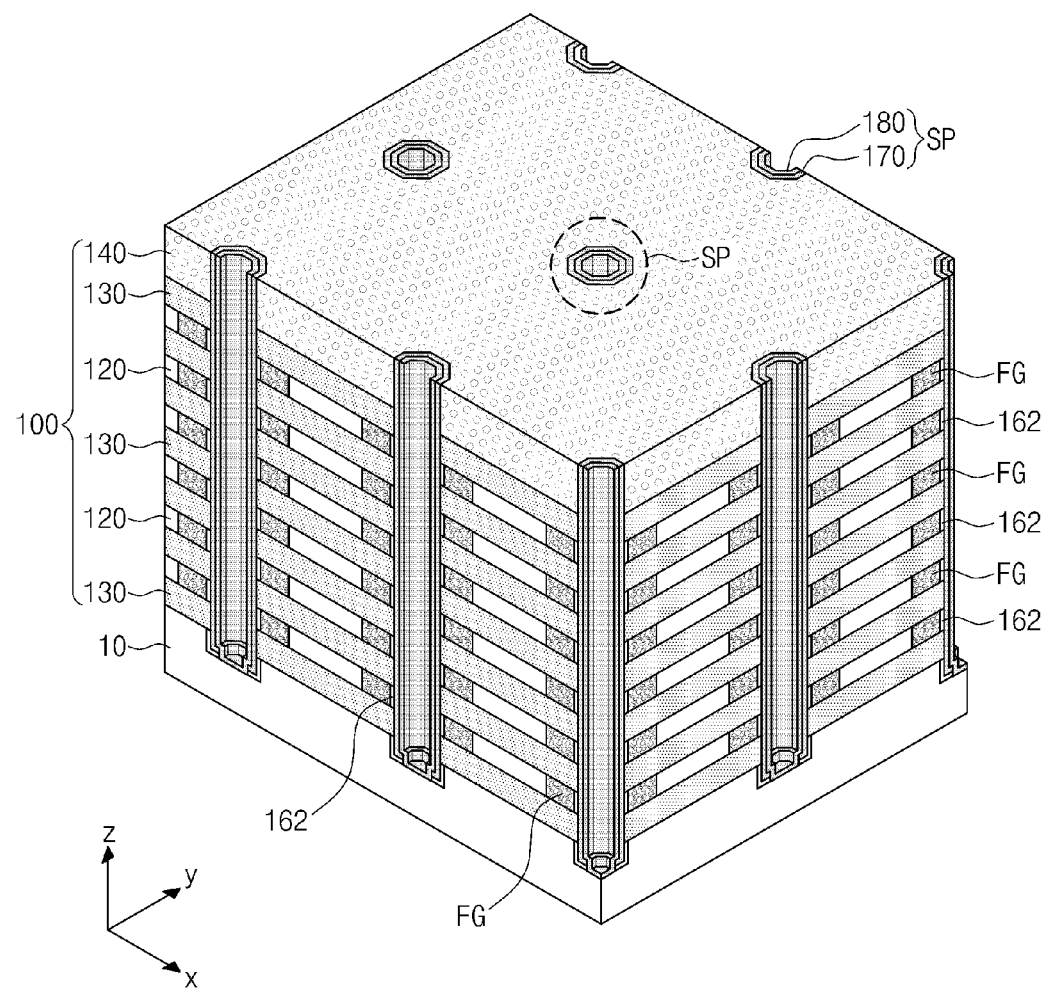
FIGS. 15 and 16 are perspective views illustrating a variation of the nonvolatile memory device and method of FIGS. 6 through 14.
Figure 16:
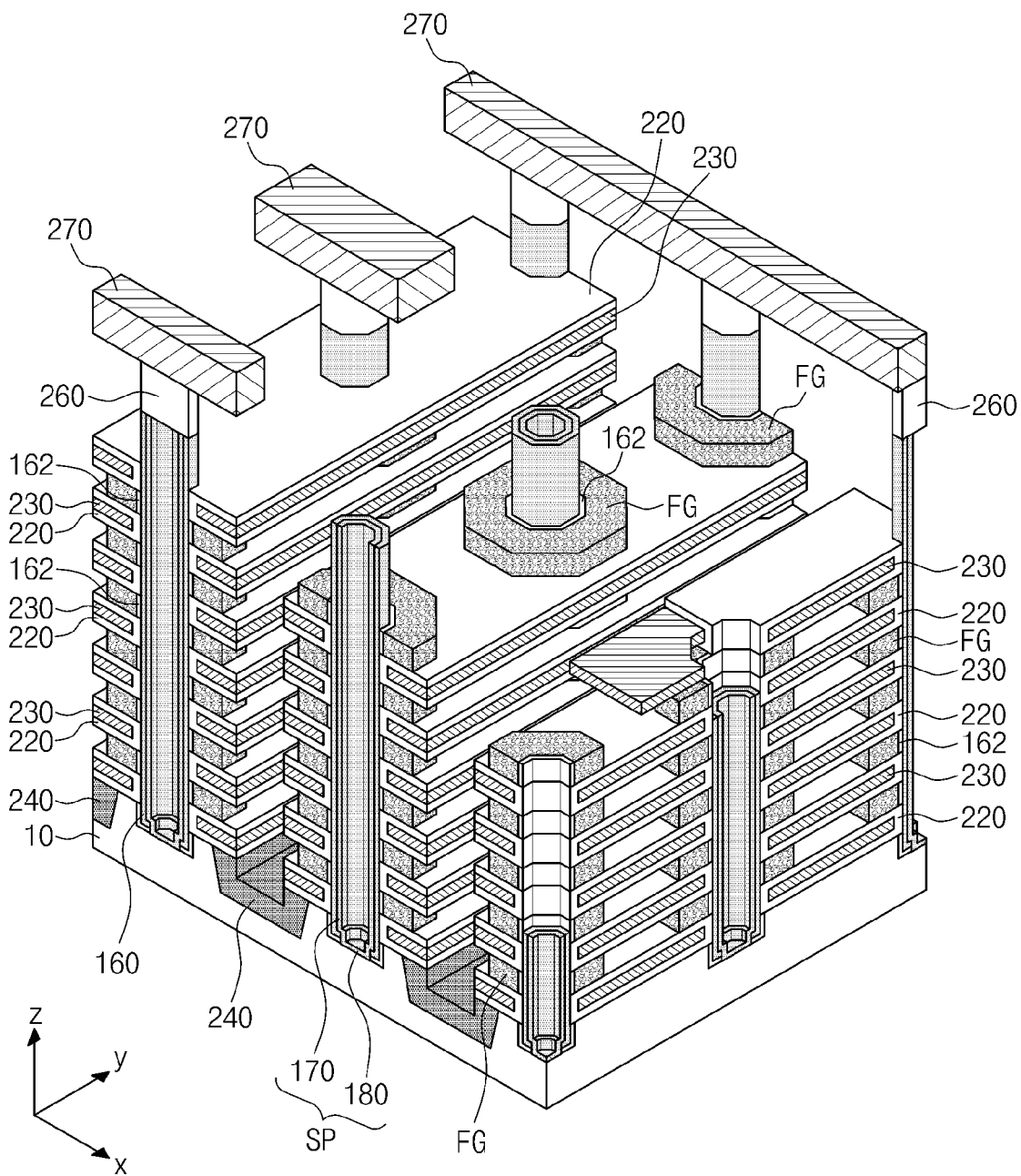

FIGS. 15 and 16 are perspective views illustrating a variation of the nonvolatile memory device and method of FIGS. 6 through 14. In the description that follows, a discussion of features identical to those of FIGS. 6 through 14 will be minimized in order to avoid redundancy.

Referring to FIGS. 9 and 15, tunnel insulation patterns 162 locally covering the inner sidewalls of floating gates FG are formed. Floating gate FG can be formed of silicon, and tunnel insulation patterns 162 can comprise a silicon oxide layer formed by thermally oxidizing surfaces of floating gates FG exposed through opening 105. This thermal oxidation process allows the local formation of tunnel insulation pattern 162. As a result, as shown in FIG. 16, inter gate insulation pattern 220 may directly contact sidewalls of semiconductor pattern SP.

FIGS. 17 through 21 are perspective views illustrating another variation of the nonvolatile memory device and the method of FIGS. 6 through 14.

Figure 17:
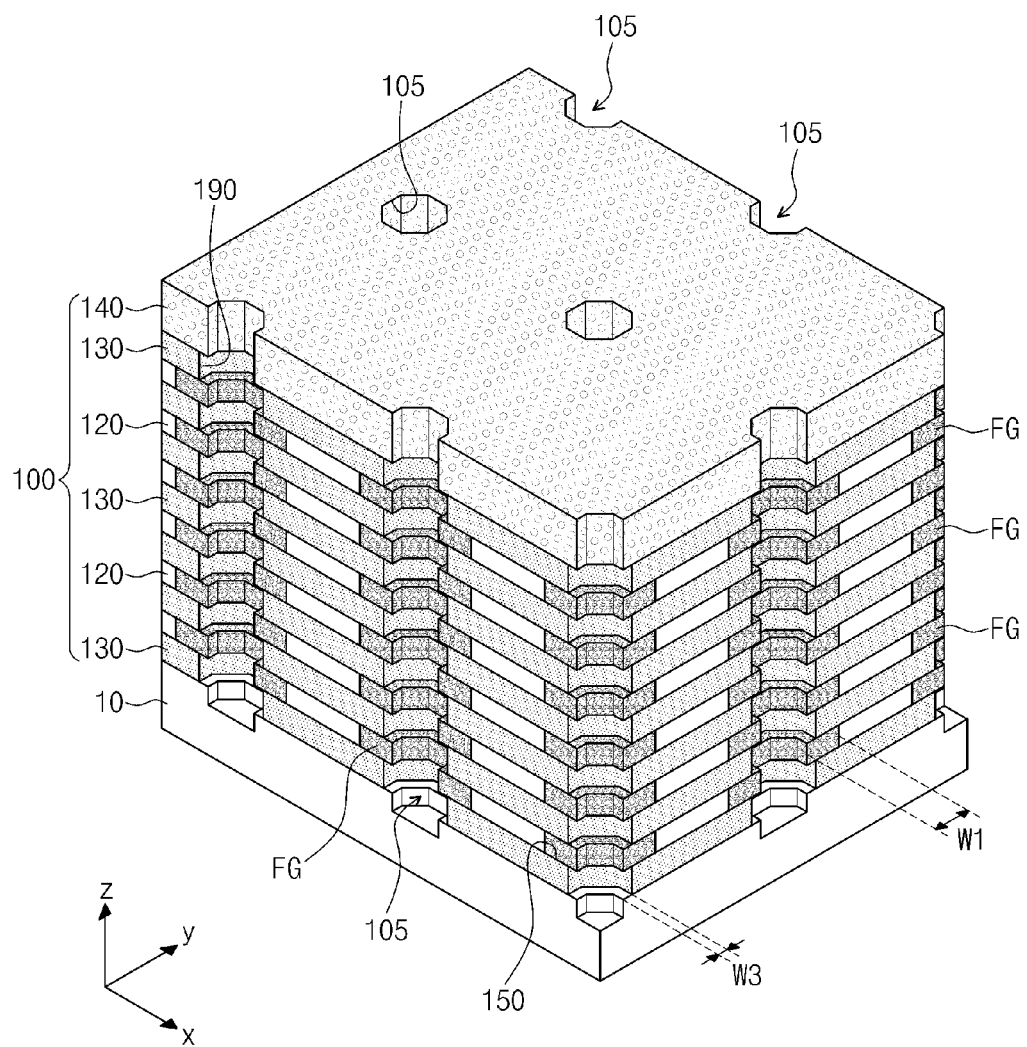
FIGS. 17 through 21 are perspective views illustrating additional variations of the nonvolatile memory device and method of FIGS. 6 through 14.

Referring to FIGS. 9 and 17, after floating gates FG are formed, spacer molding regions 190 are formed between floating gates FG. Spacer molding regions 190 are formed by horizontally recessing sidewalls of sacrificial mold layers 130 exposed through opening 105 using an etch recipe having an etch selectivity with respect to floating gates FG. As shown in FIG. 17, a horizontal depth W3 of spacer molding region 190 is less than width W1 of floating gate molding region 150.

Figure 18:
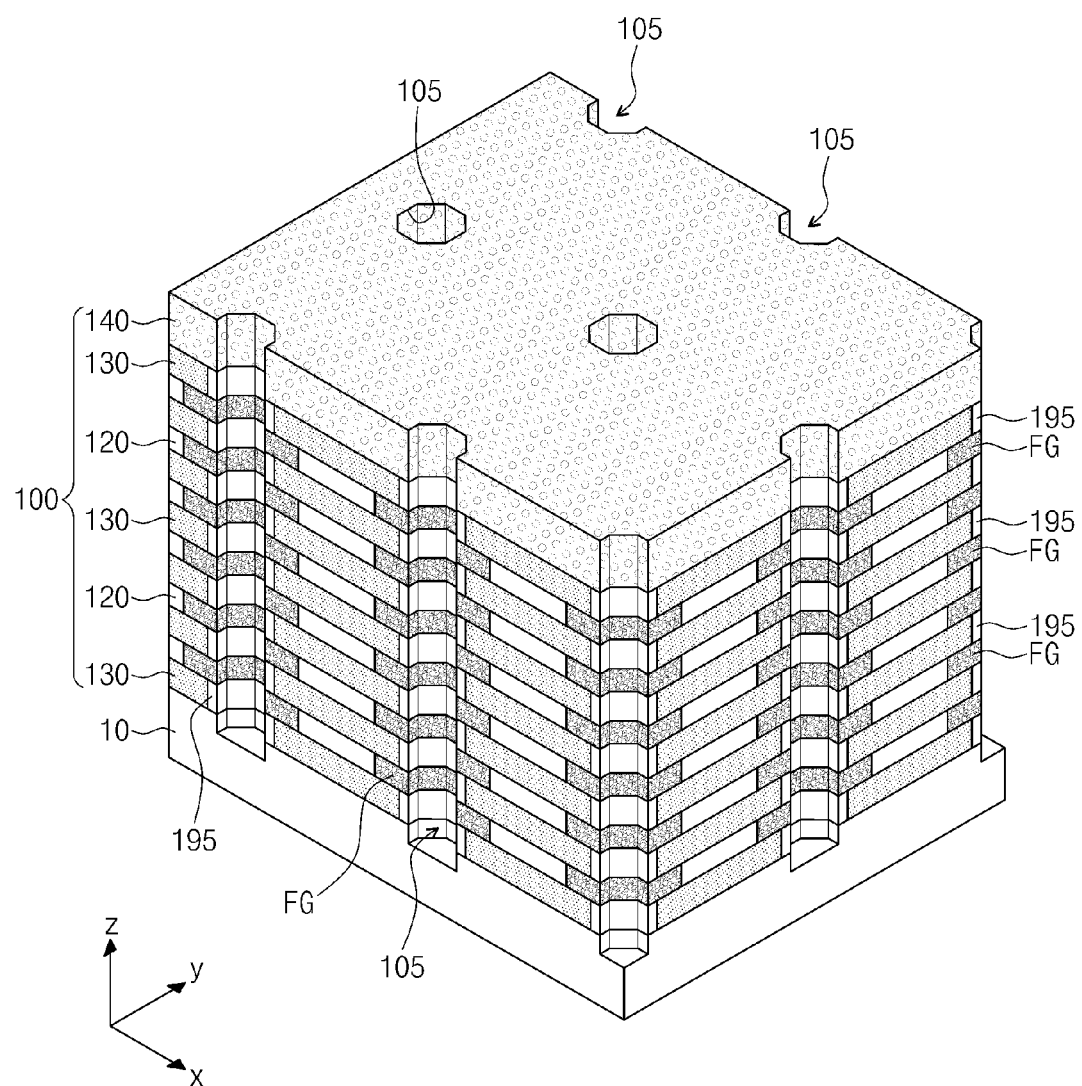

Referring to FIG. 18, spacer insulation pattern 195 is formed to fill spacer molding region 190. Spacer insulation pattern 195 comprises a material having an etch selectivity with respect to sacrificial mold layer 130. In some embodiments, spacer insulation pattern 195 is formed of the same materials as interlayer insulation layers 120. For example, where sacrificial mold layer 130 is a silicon nitride layer, spacer insulation pattern 195 can be a silicon oxide layer.

Figure 19:
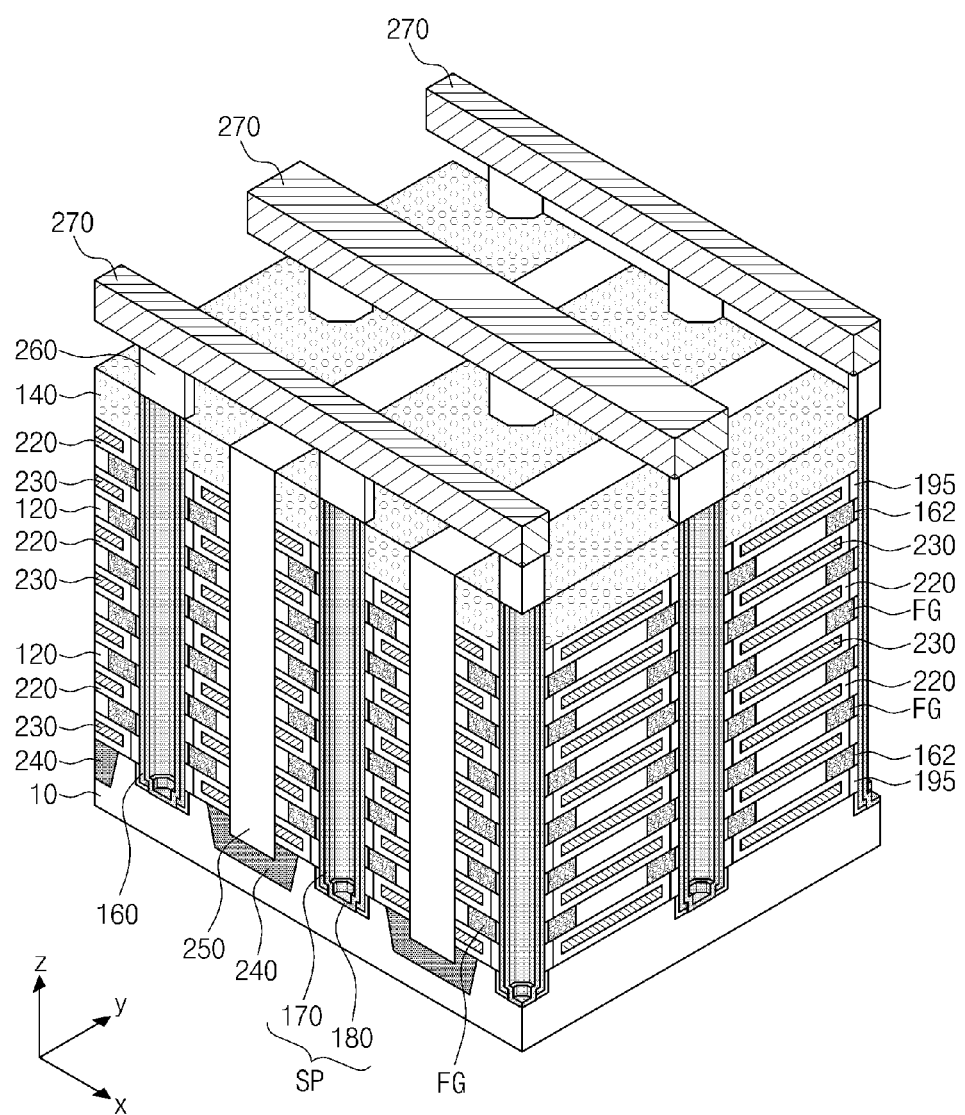
Figure 20:
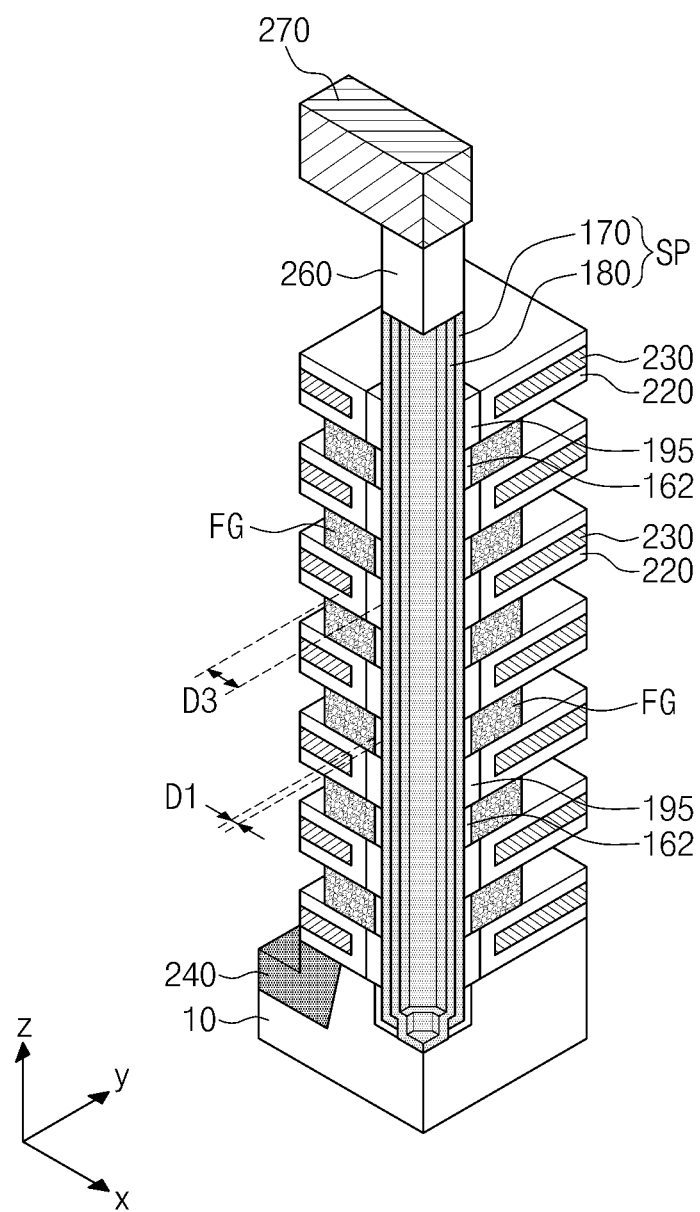

Next, as shown in FIGS. 19 and 20, tunnel insulation pattern 162 and a semiconductor pattern SP are formed in opening 105. Then, after sacrificial mold layers 130 are replaced with wordline structures, upper plugs 260 and upper wirings 270 are formed. Because tunnel insulation pattern 162 is formed through the thermal oxidation process described with reference to FIG. 15, it may locally cover inner sidewalls of floating gates FG. Additionally, the replacement process can be realized using the method described with FIGS. 11 through 13 and as a result, the wordline structure comprises inter gate insulation pattern 220 and wordline 230 as shown in FIGS. 19 and 20.

Referring to FIG. 20, spacer insulation pattern 195 further spaces wordline 230 from semiconductor pattern SP. Accordingly, spacer insulation pattern 195 contributes to increasing a difference D3-D1 between separation distances D1 and D3 from floating gate FG and wordlines 230 to semiconductor pattern SP.

Figure 21:
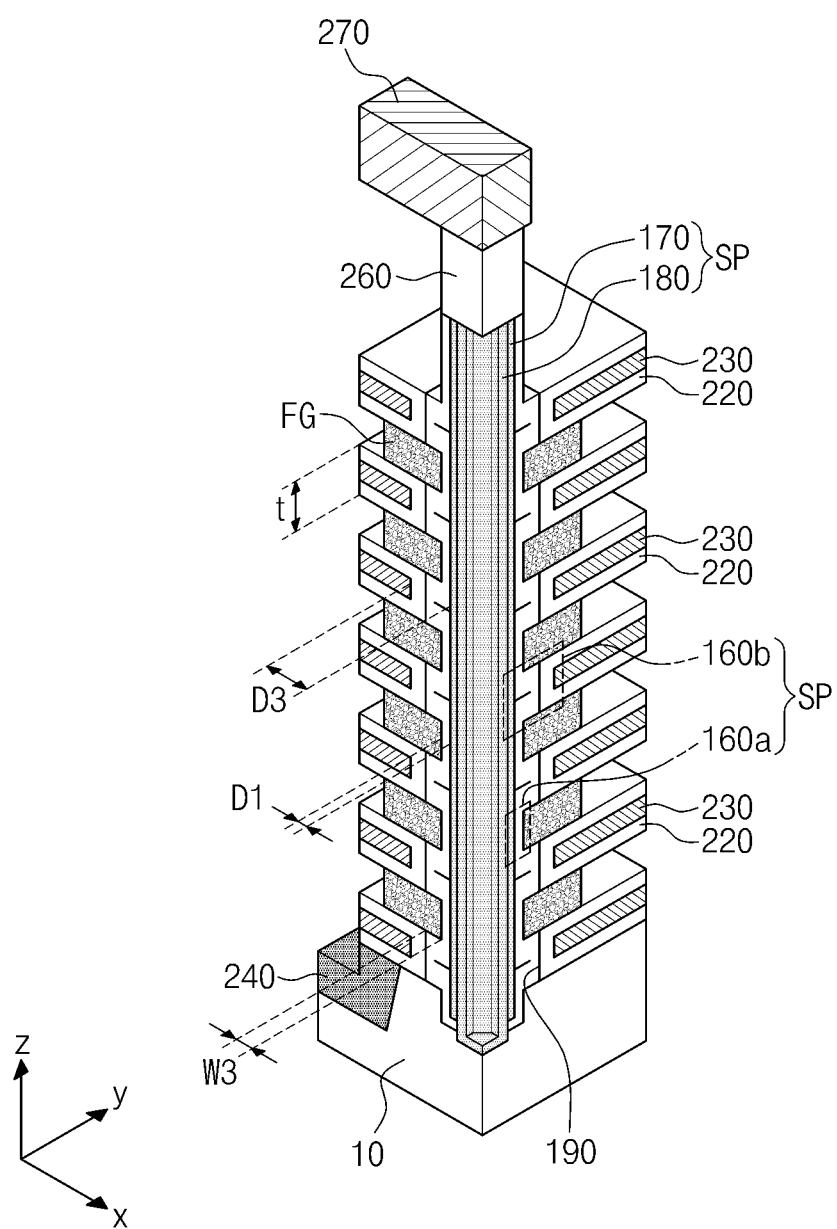

As described with reference to FIG. 10, even where tunnel insulation pattern 160 is formed through a deposition technique, where a thickness "t" of sacrificial mold layer 130 is small, tunnel insulation pattern 160 can fill spacer molding region 190. For example, where the thickness "t" of sacrificial mold layer 130 or the wordline structure is less than two times the deposition thickness D1 of tunnel insulation pattern 160, as shown in FIG. 21, spacer molding region 190 is filled by tunnel insulation pattern 160. Tunnel insulation pattern 160 thus forms a tunnel region 160a adjacent to floating gate FG and a spacer region 160b adjacent to wordlines 230. A thickness difference between spacer region 160b and tunnel region 160a is a width or horizontal depth W3 of spacer molding region 190.

FIGS. 22 through 30 are perspective views illustrating yet another variation of the nonvolatile memory device and method of FIGS. 6 through 14.

Figure 22:
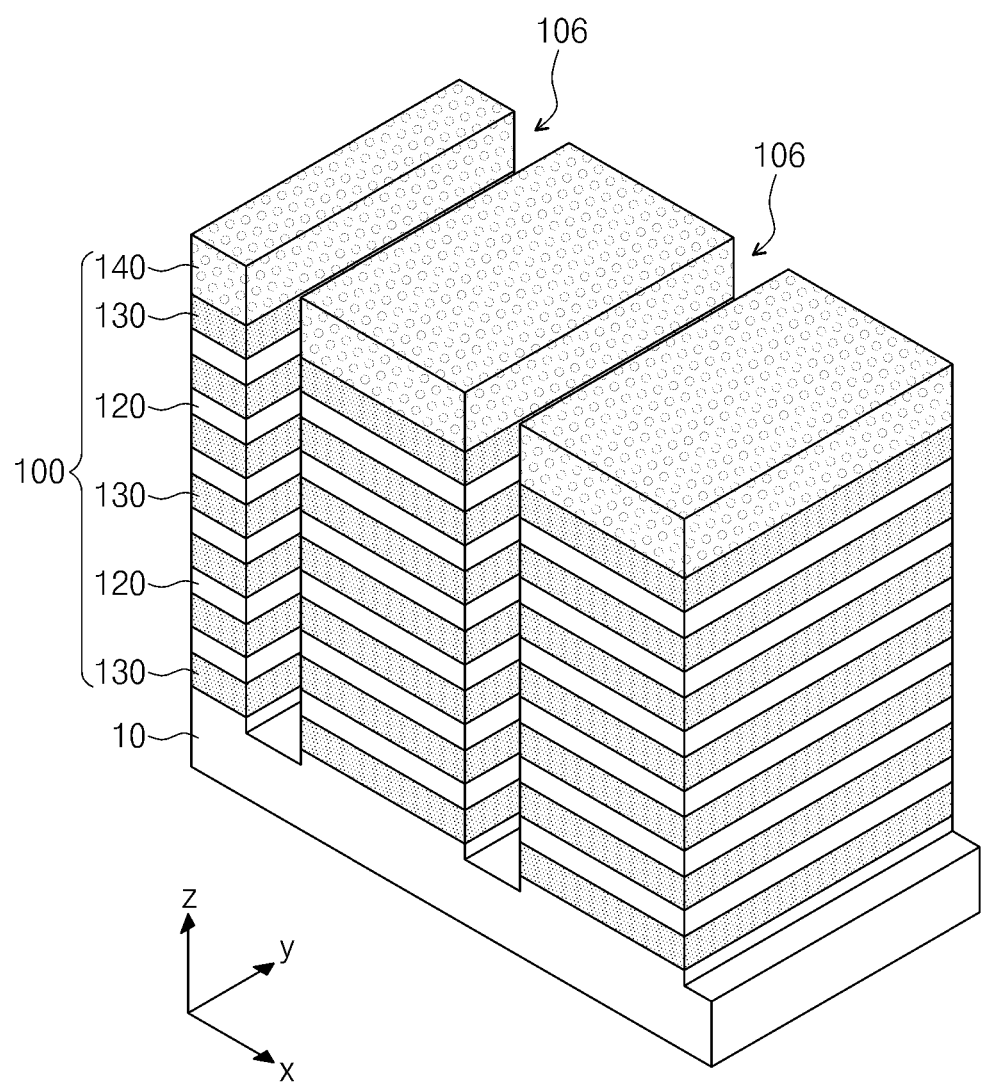
FIGS. 22 through 30 are perspective views illustrating still other variations of the nonvolatile memory device and method of FIGS. 6 through 14.

Referring to FIGS. 6 and 22, openings 106 penetrating mold structure 100 are formed. Openings 106 comprise a portion of a hexahedral shape, where aspect ratios of sections projected on an xy plane and an xz plane are at least five. That is, the lengths of y and z directions of opening 106 may have a shape that is more than five times the length of its x direction.

Figure 23:
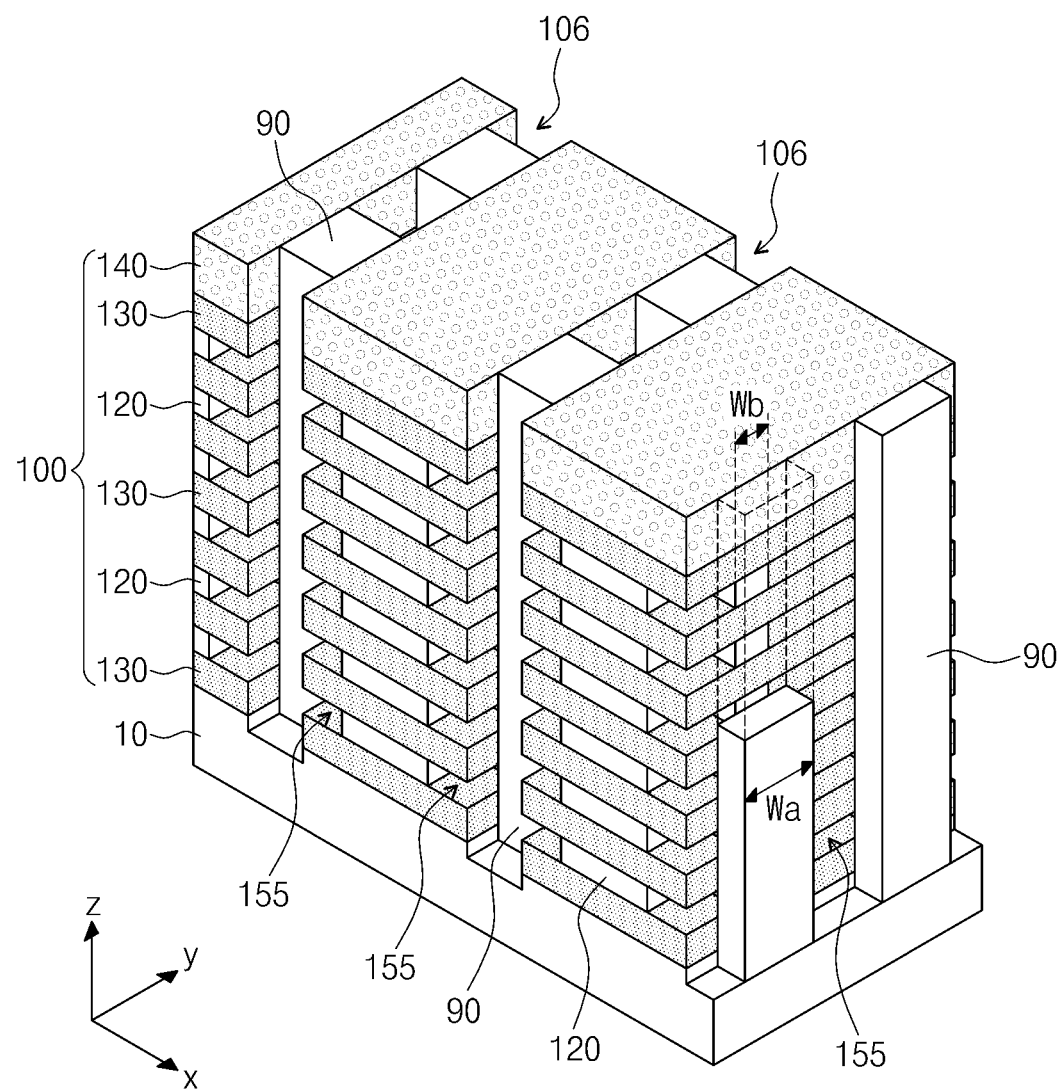

Referring to FIG. 23, a plurality of respectively spaced device isolation patterns 90 are formed in opening 106. The sidewalls of interlayer insulation layers 120 exposed through opening 106 are horizontally etched using device isolation patterns 90 as an etch mask. Accordingly, between sacrificial mold layers 130, gap regions, i.e., floating gate molding regions 155, are formed by horizontally extending openings 106. The etch process is performed using an isotropic etch method and in this case, as shown in the drawings, distance Wb between floating gate molding regions 155 is less than width Wa of device isolation pattern 90.

Figure 24:
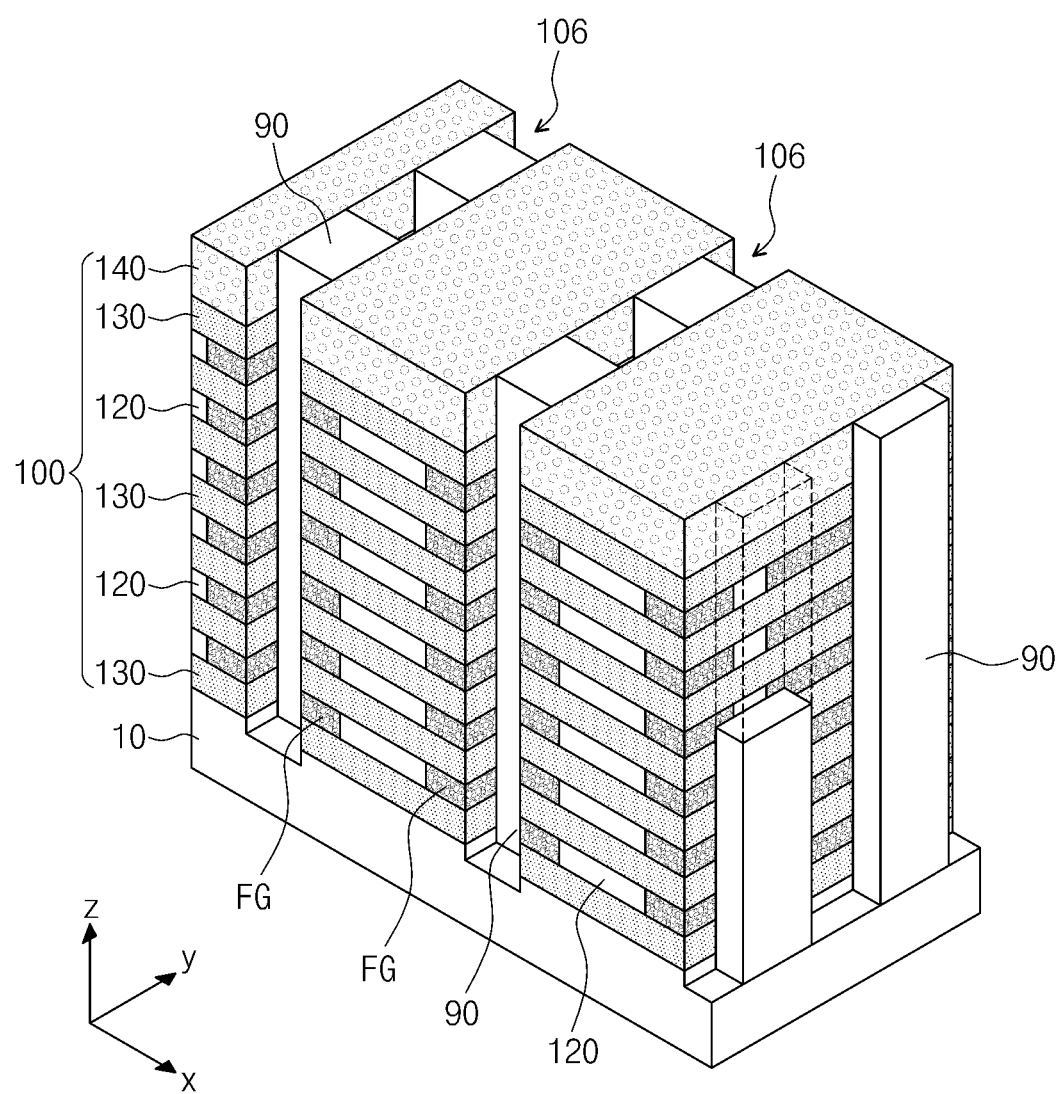
Figure 25:
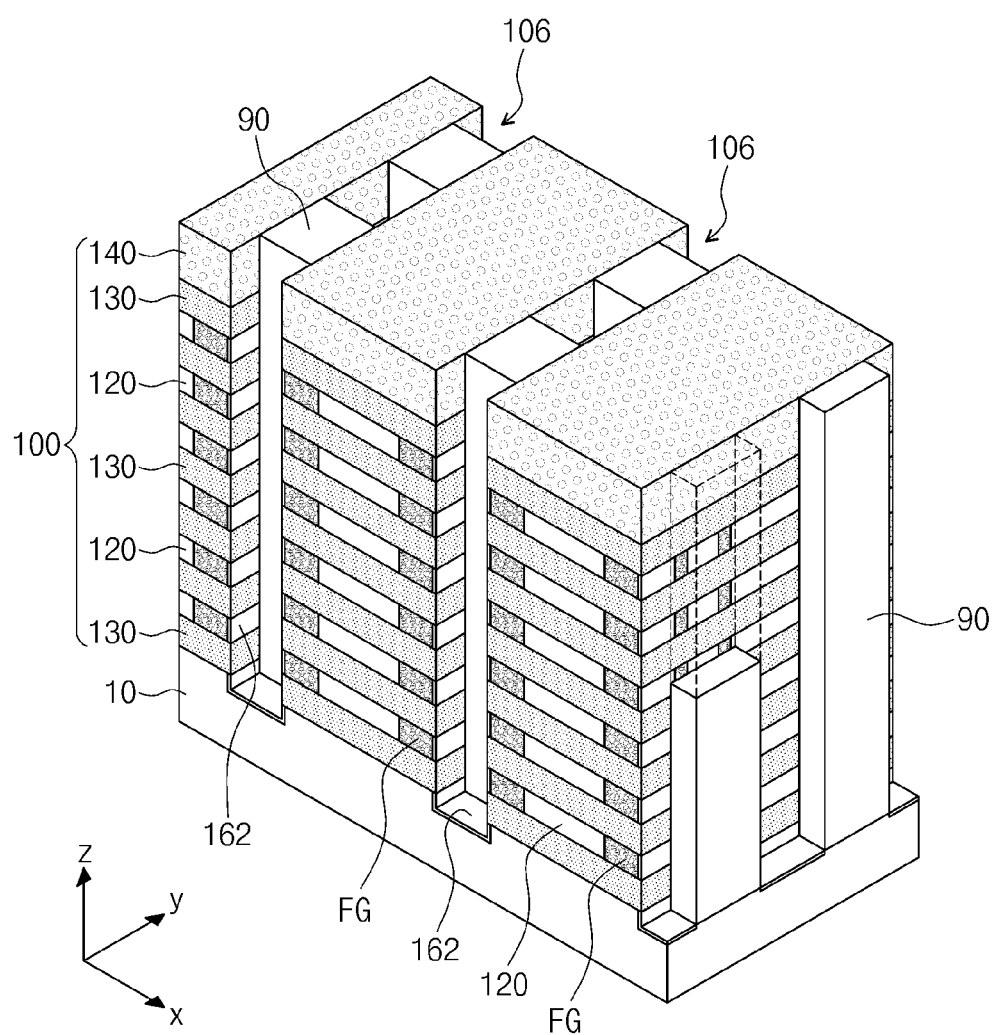
Figure 26:
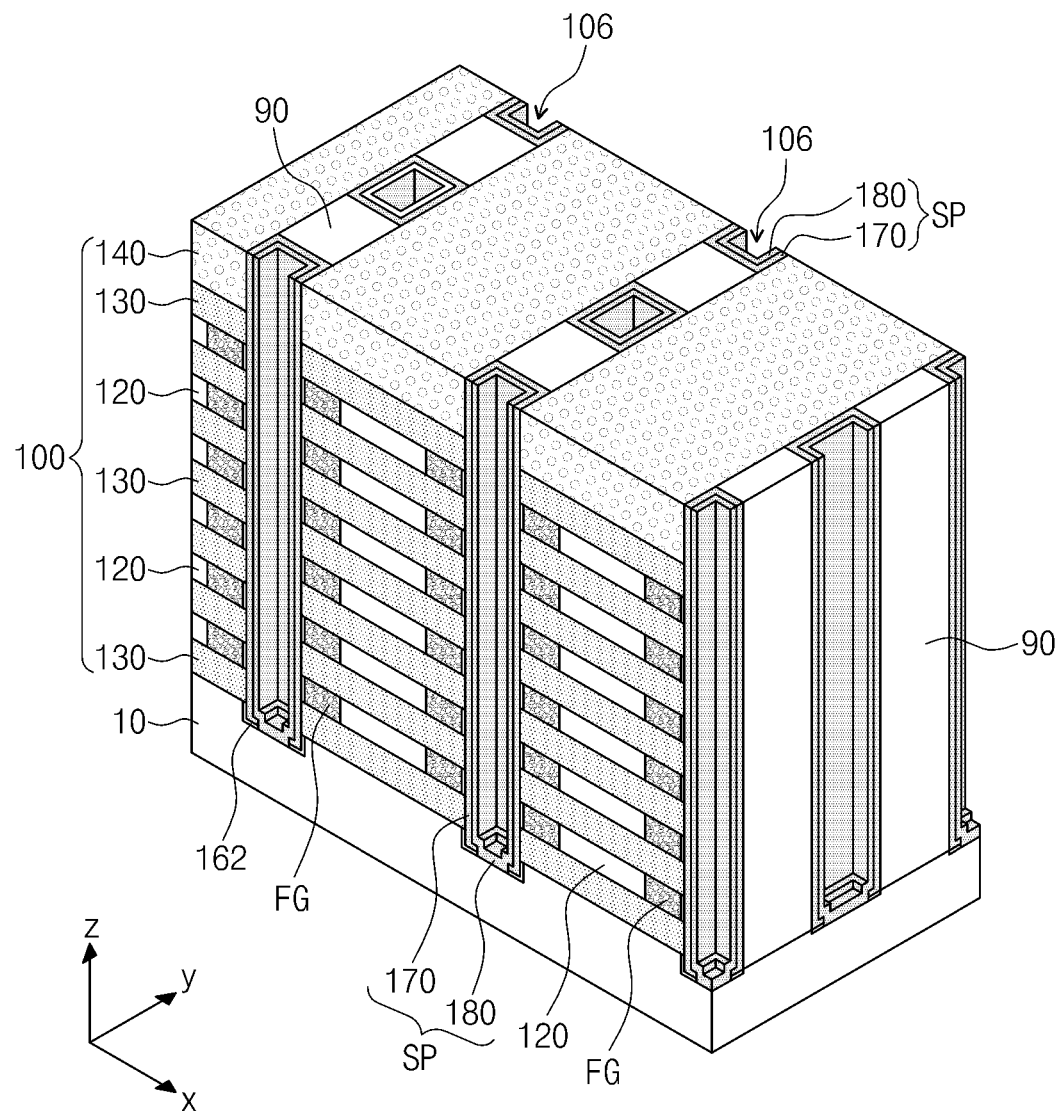
Figure 27:
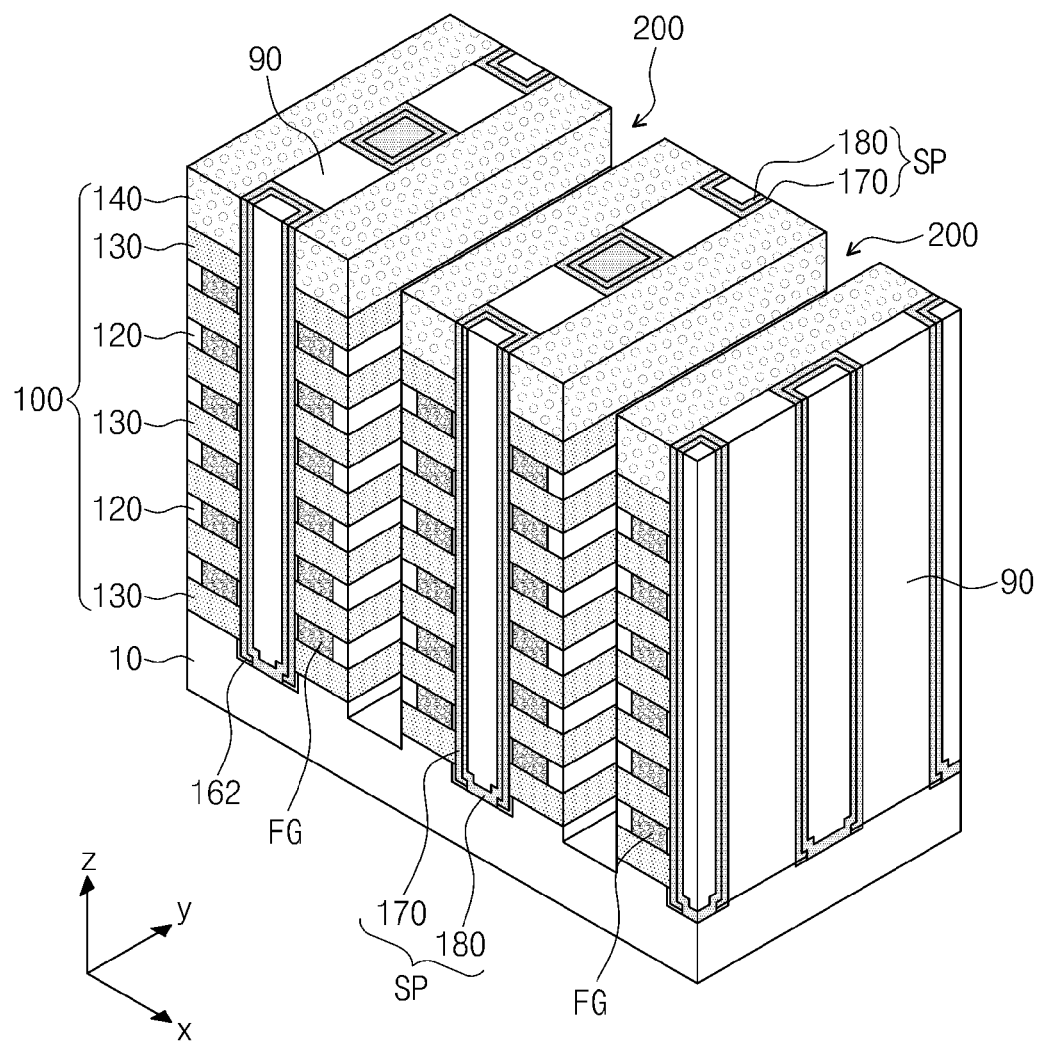

Next, as shown in FIG. 24, floating gates FG filling floating gate molding region 155 are formed, and as shown in FIG. 25, the sidewalls of floating gates FG exposed by device isolation pattern 90 in opening 106 and tunnel insulation patterns 162 on the top surface of substrate 10 are formed. Next, as shown in FIG. 26, after semiconductor pattern SP contacting the top surface of substrate 10 is formed between device isolation patterns 90, as shown in FIG. 27, trenches 200 are formed to penetrate mold structure 100 and exposing the sidewalls of sacrificial mold layers 130 and interlayer insulation layers 120.

Figure 28:
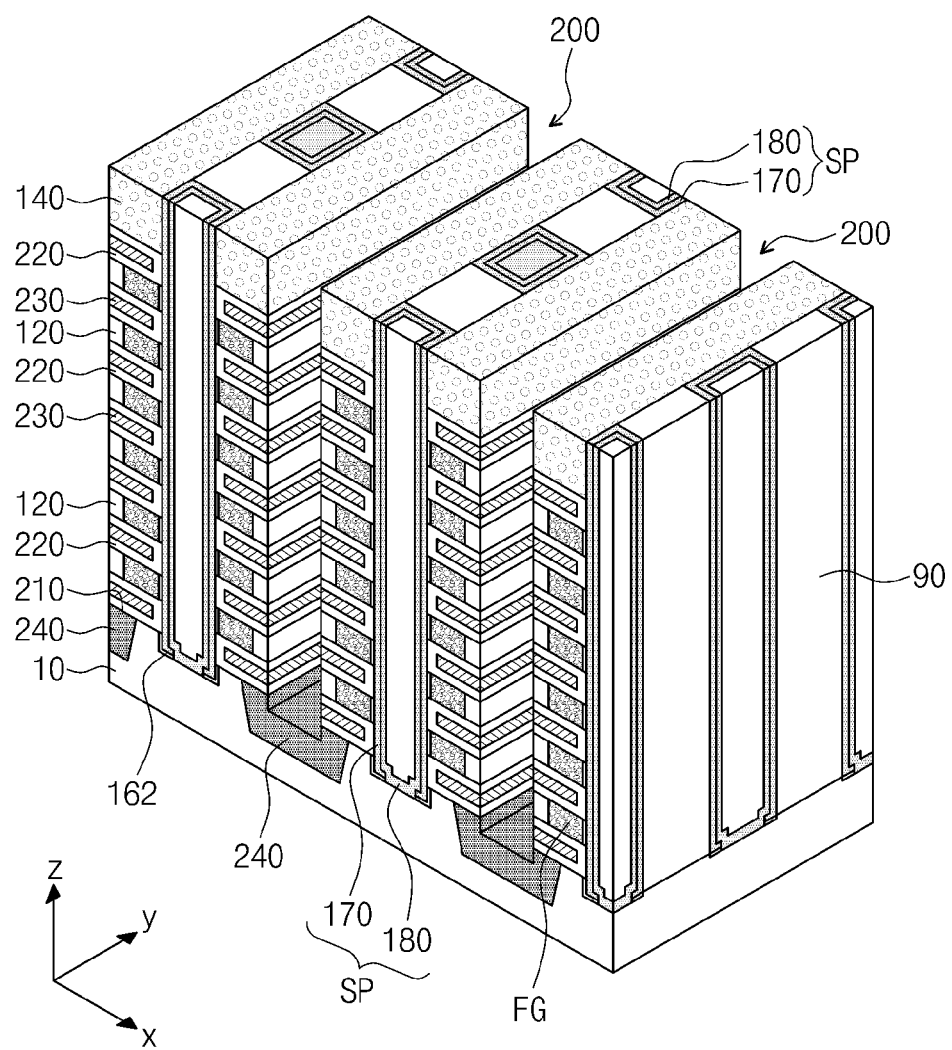
Figure 29:
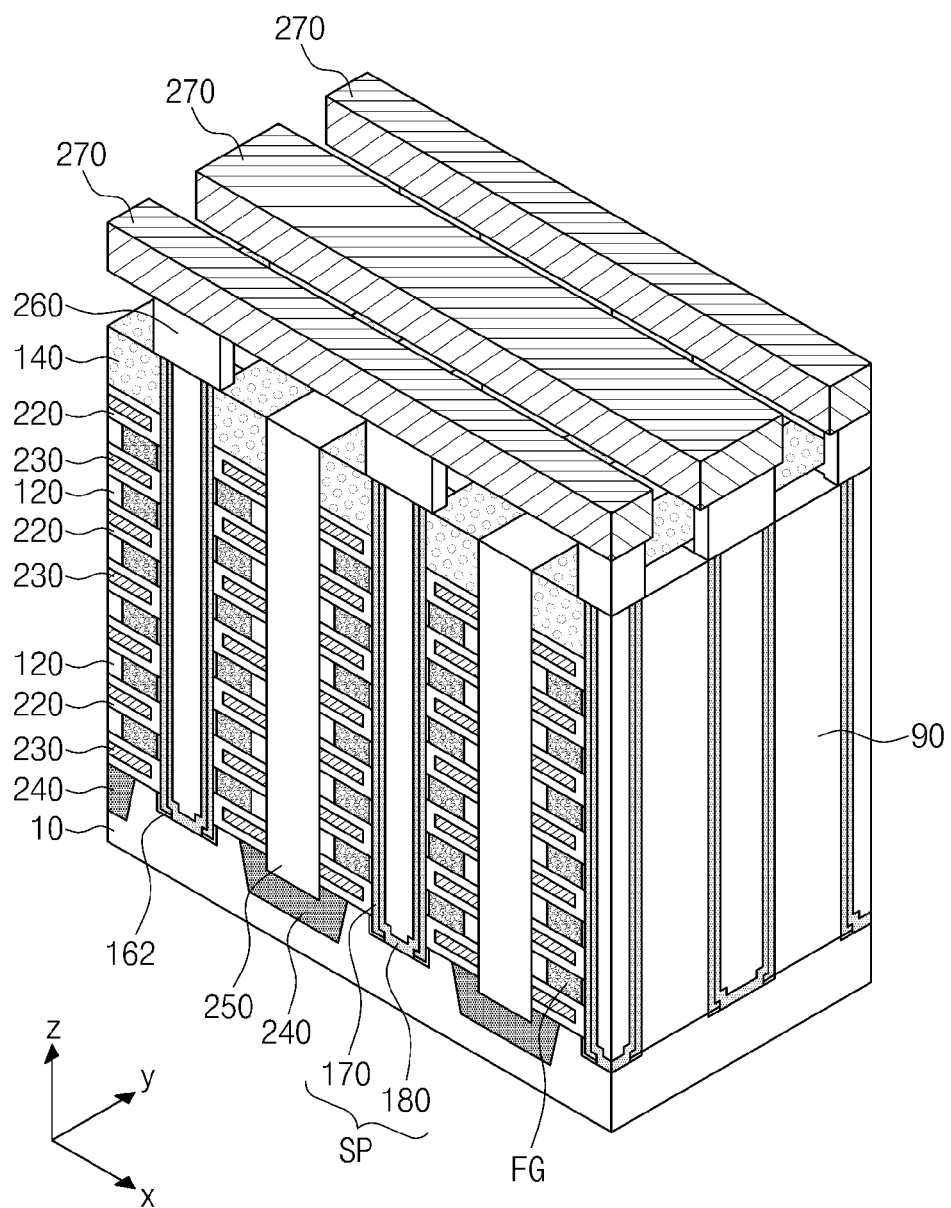

Next, as shown in FIG. 28, after wordline molding regions 210 are formed between interlayer insulation layers 120 by selectively removing the exposed sacrificial mold layers 130, inter gate insulation pattern 220 covering the inner wall of the wordline molding region 210 and wordlines 230 filling the remaining space of wordline molding region 210 are formed. Next, impurity regions 240 are formed in substrate 10 exposed through trenches 200, and electrode separation pattern 250 is formed in trenches 200. Next, as shown in FIG. 29, upper plugs 260 contacting the respective semiconductor patterns SP and upper wirings 270 connecting upper plugs 260 are formed.

Figure 30:
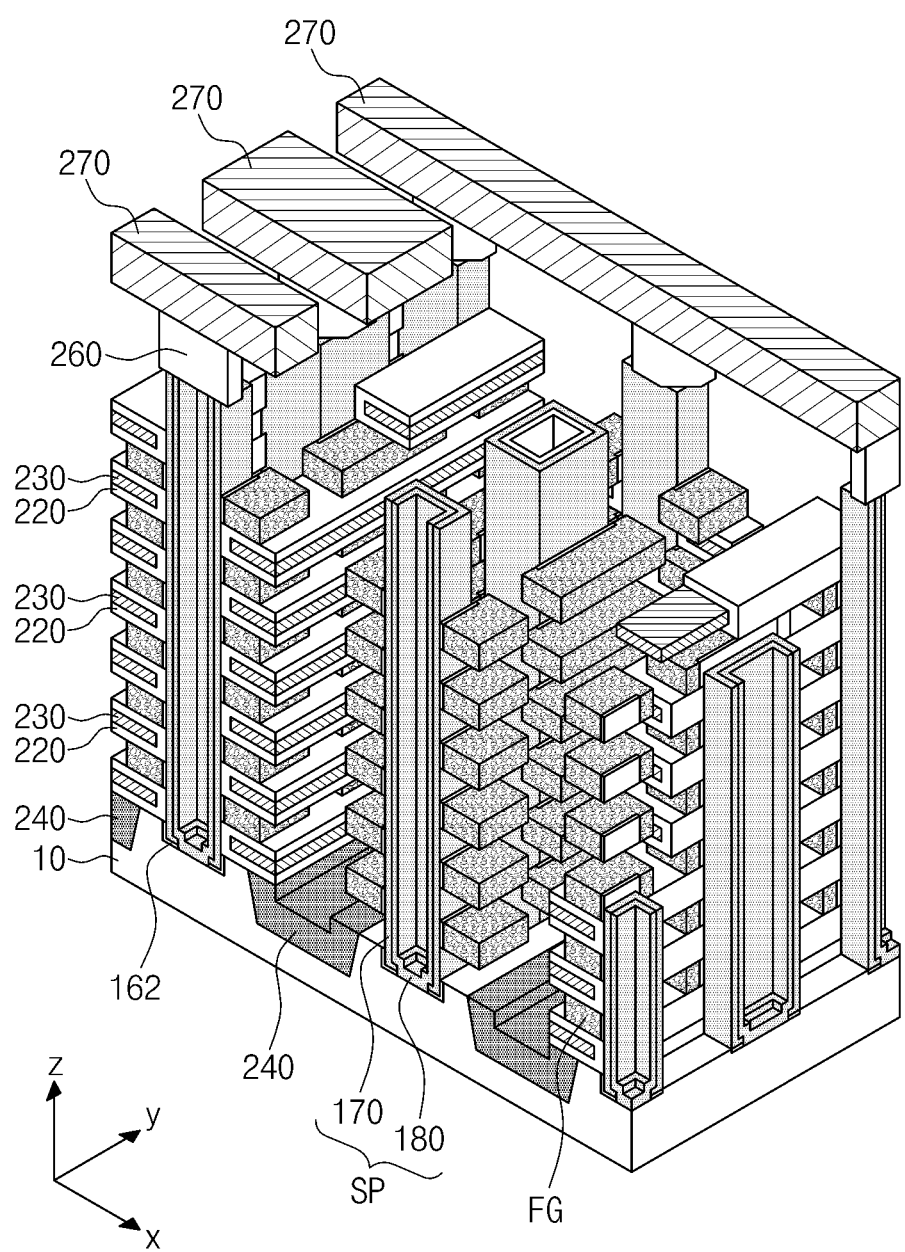

Referring to FIG. 30, respectively separated wordlines 230 are disposed at both sides of semiconductor pattern SP. Additionally, floating gates FG also are separately formed at both sides of semiconductor pattern SP. The number of floating gates FG is proportional to a memory capacity of the memory device, so the memory device comprising floating gates FG separately disposed at both sides of semiconductor pattern SP can have an increased memory capacity compared to memory devices of other embodiments.

In some embodiments, semiconductor pattern SP is divided into two portions that are correspondingly disposed at one sidewall and the other sidewall of opening 106 and are respectively separated. In such embodiments, opening 106 can be formed with a hexahedral shape as described above, and consequently, a surface of floating gate FG adjacent to semiconductor pattern SP is substantially flat. For example, the surface of floating gate FG may have a curvature radius that is ten times greater than the thickness of wordline 230.

FIGS. 31 through 36 are perspective views illustrating a method of manufacturing a nonvolatile memory device according to another embodiment of the inventive concept. FIG. 37 is a perspective view illustrating a nonvolatile memory device manufactured by the method of FIGS. 31 through 36. In the description that follows, features that have been described above are not further described in order to avoid redundancy.

Figure 31:
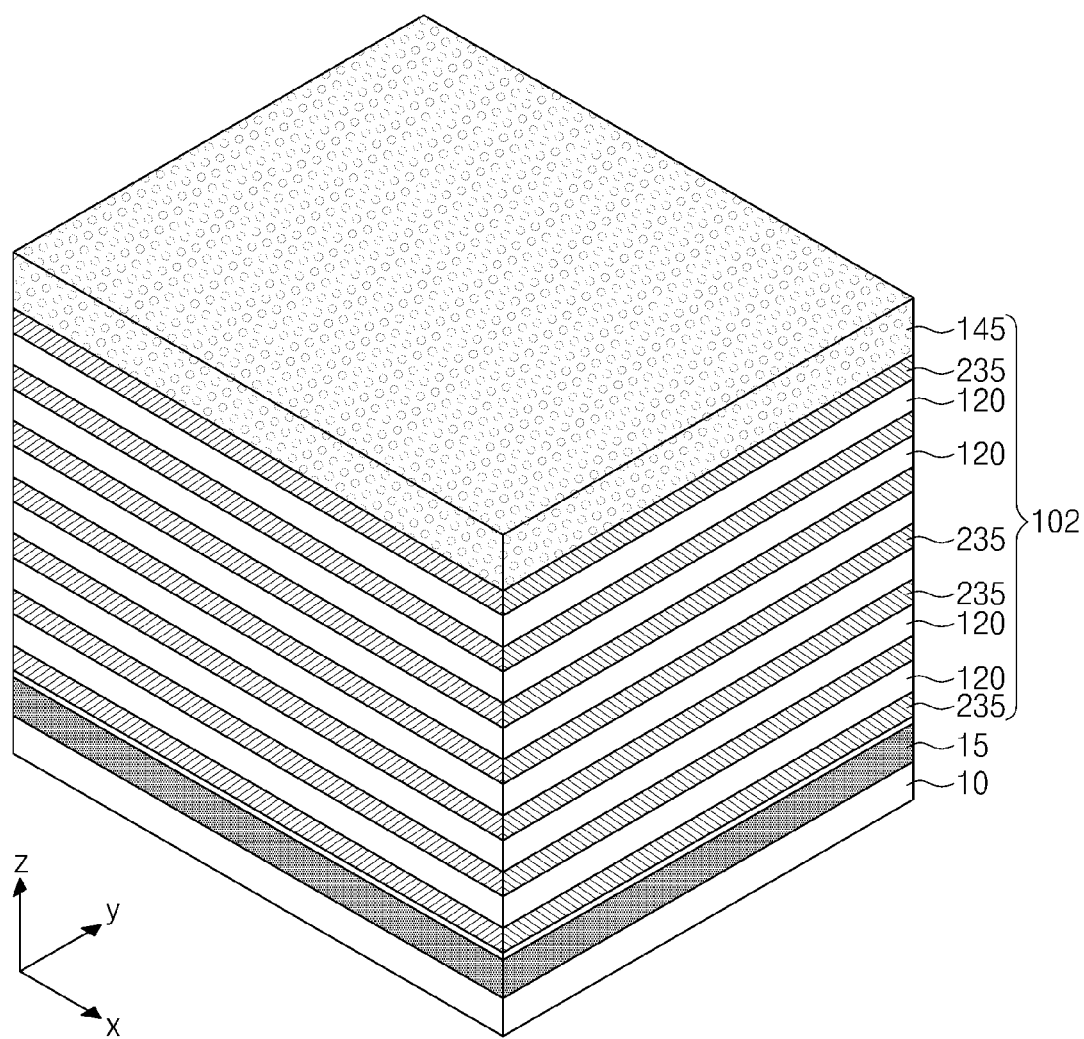
FIGS. 31 through 36 are perspective views illustrating a method of manufacturing a nonvolatile memory device according to another embodiment of the inventive concept.

Referring to FIG. 31, a mold structure 102 is formed on substrate 10. Mold structure 102 comprises interlayer insulation layers 120, a plurality of gate conductive layers 235, and at least one capping layer 145. Gate conductive layers 235 can be used as wordlines WL0 through WL7 in the memory device of FIG. 5 and can be used as one of string selection lines SSL0 and SSL1, ground selection lines GSL0 and GSL1, and first and second dummy lines DL1 and DL2. Additionally, before mold structure 102 is formed, an impurity region 15 functioning as common source line CSL of FIG. 5 can be further formed on substrate 10.

In some embodiments, interlayer insulation layers 120 are formed of at least one insulation material (e.g., silicon oxide), gate conductive layers 235 are formed of at least one conductive material (e.g., doped polycrystalline silicon), and capping layer 145 is formed of a material having an etch selectivity with respect to at least one of inter layer insulation layers 120 and gate conductive layers 235 (e.g., silicon nitride).

Figure 32:
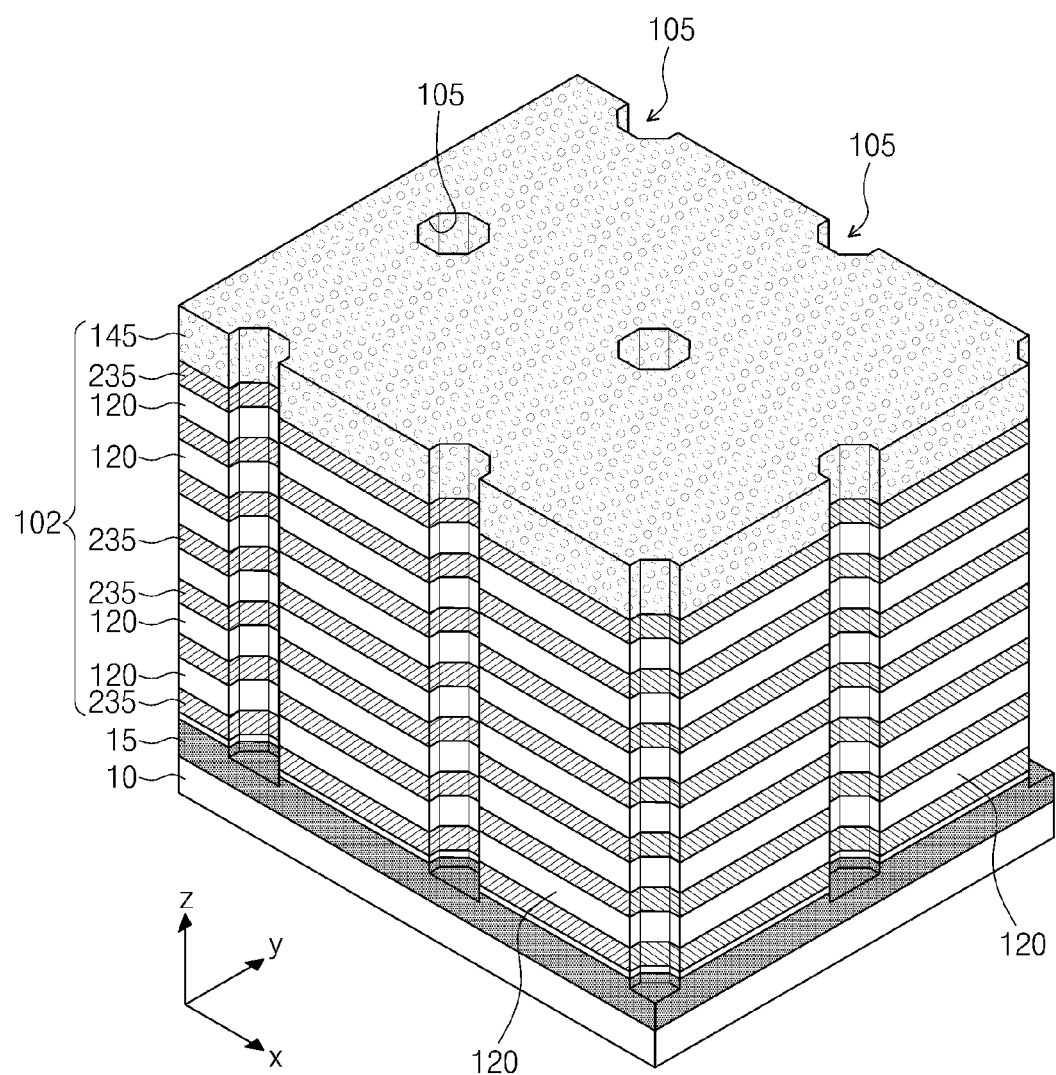

Referring to FIG. 32, openings 105 are formed in mold structure 102 to expose the top surface of substrate 10 or impurity region 15. Interlayer insulation layers 120, gate conductive layers 235, and capping layer 145 have sidewalls exposed by openings 105.

Figure 33:
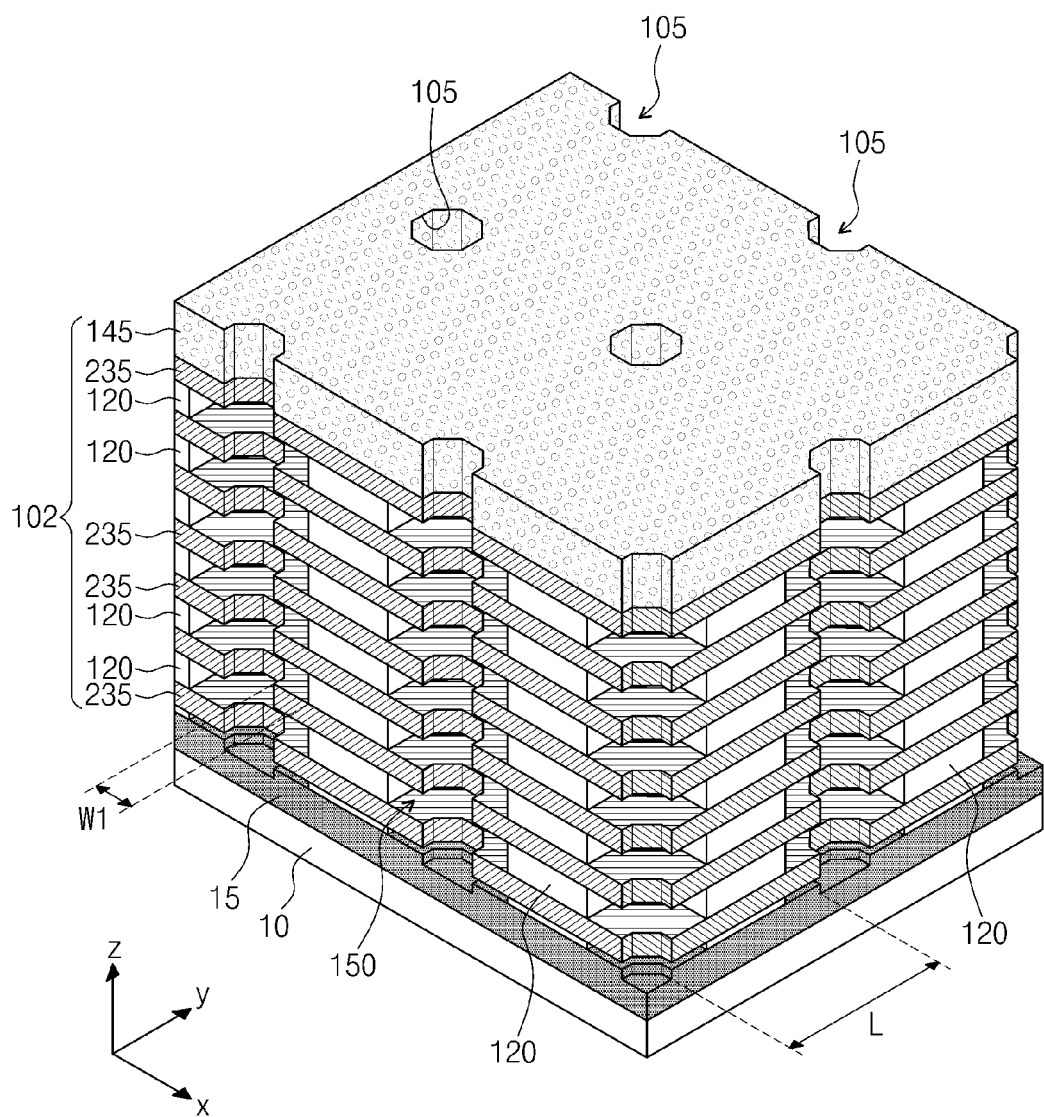

Referring to FIG. 33, floating gate molding regions 150 are formed by horizontally recessing sidewalls of interlayer insulation layers 120 exposed by openings 105. Floating gate molding regions 150 form gap regions that extend horizontally from openings 105. A horizontal depth W1 of floating gate molding region 150 can be selected from a range satisfying a condition that is less than one third of the distance between adjacent two openings 105.

Figure 34:
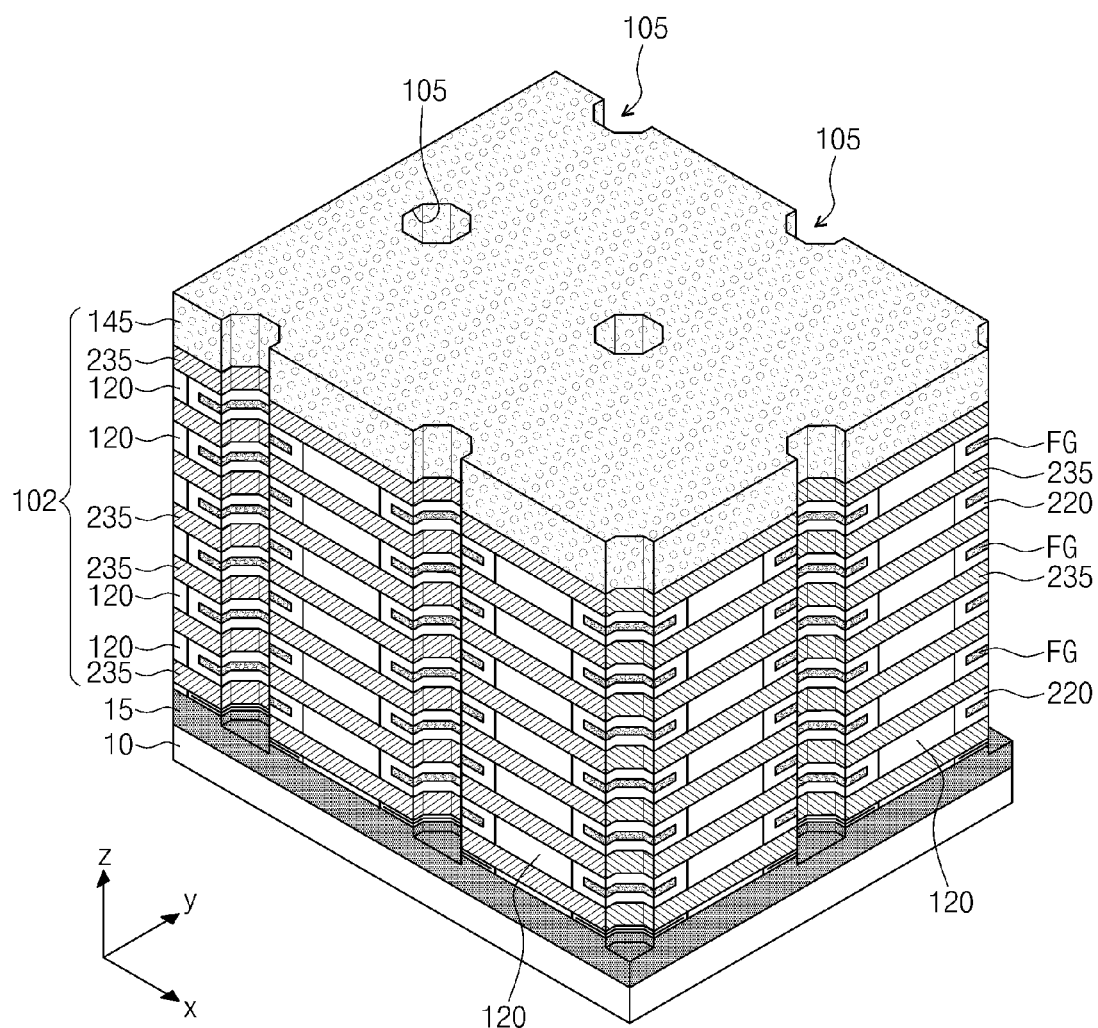

Referring to FIG. 34, floating gate structures are formed in the respective floating gate molding regions 150. Each of the floating gate structures comprises an inter gate insulation pattern 220 covering an inner wall of one of floating gate molding regions 150 and a floating gate FG filling a remaining space of the one of floating gate molding regions 150.

The forming of the floating gate structures comprises forming an inter gate insulation layer and a floating gate conductive layer sequentially covering floating gate molding regions 150 and removing the inter gate insulation layer and the floating gate conductive layer in openings 105 to expose respective sidewalls of gate conductive layers 235.

The inter gate insulation layer and the floating gate conductive layer can each be formed using a CVD or ALD technique. Additionally, inter gate insulation patterns 220 can comprise one or more thin layers. For example, inter gate insulation patterns 220 can comprise a silicon oxide layer, a silicon nitride layer, and a silicon oxide layer, which are sequentially stacked; however, at least one of these layers can be replaced with a high-k dielectric. Floating gate FG is typically formed of a conductive material, such as doped polycrystalline silicon.

Figure 35:
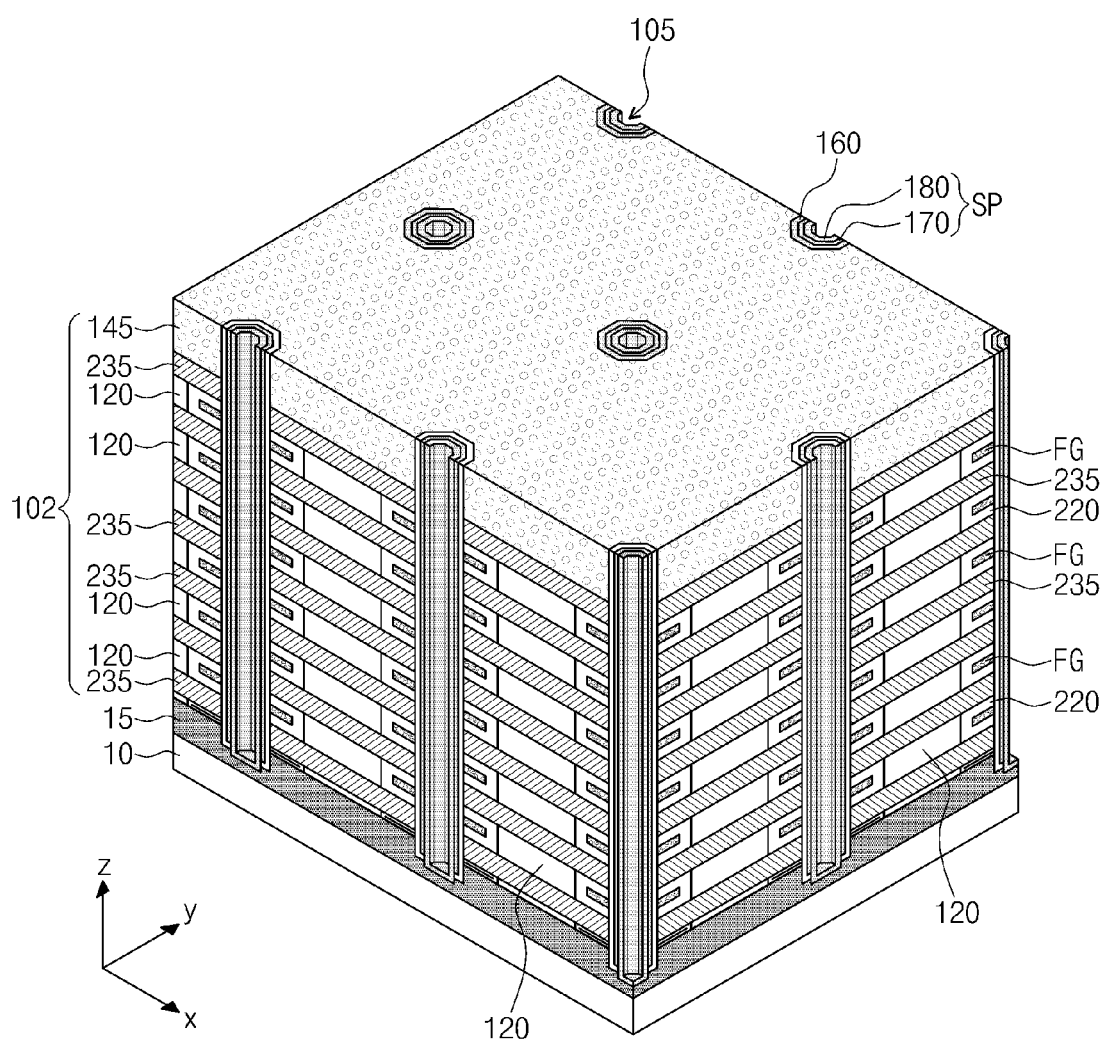

Referring to FIG. 35, tunnel insulation pattern 160 and semiconductor pattern SP sequentially covering the inner walls of openings 105 are formed. These features can be formed using the method described with reference to FIG. 10. As a result, as shown in FIG. 37, tunnel insulation pattern 160 can be formed with a cylindrical shape having bottom hole BH exposing the top surface of substrate 10 and covering the inner sidewalls of floating gates FG. Semiconductor pattern SP contacts the top surface of substrate 10 through bottom hole BH of tunnel insulation pattern 160. Additionally, semiconductor pattern SP comprises first semiconductor pattern 170 covering the inner wall of tunnel insulation pattern 160 and second semiconductor pattern 180 contacting the top surface of substrate 10.

Figure 36:
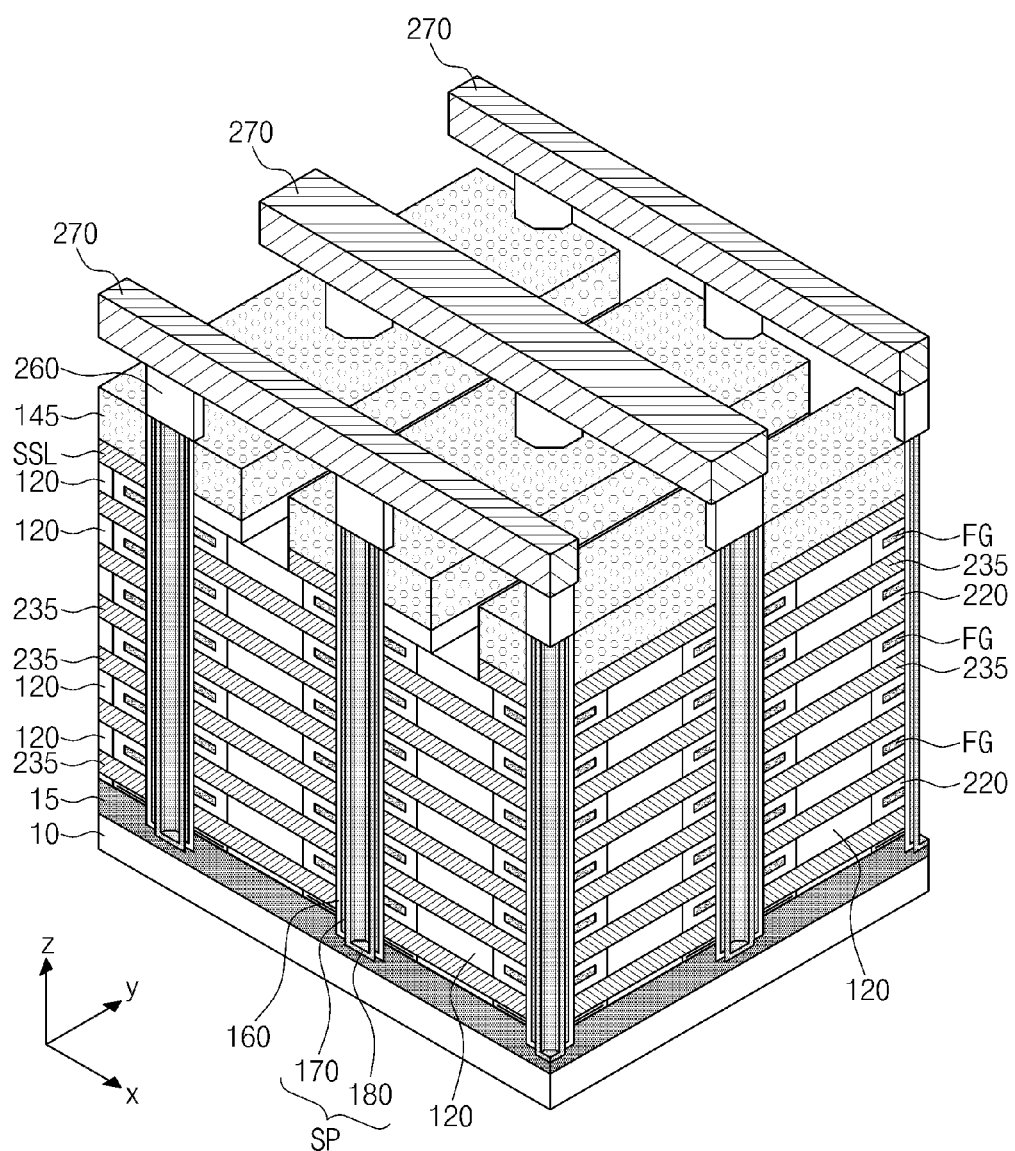
Figure 37:
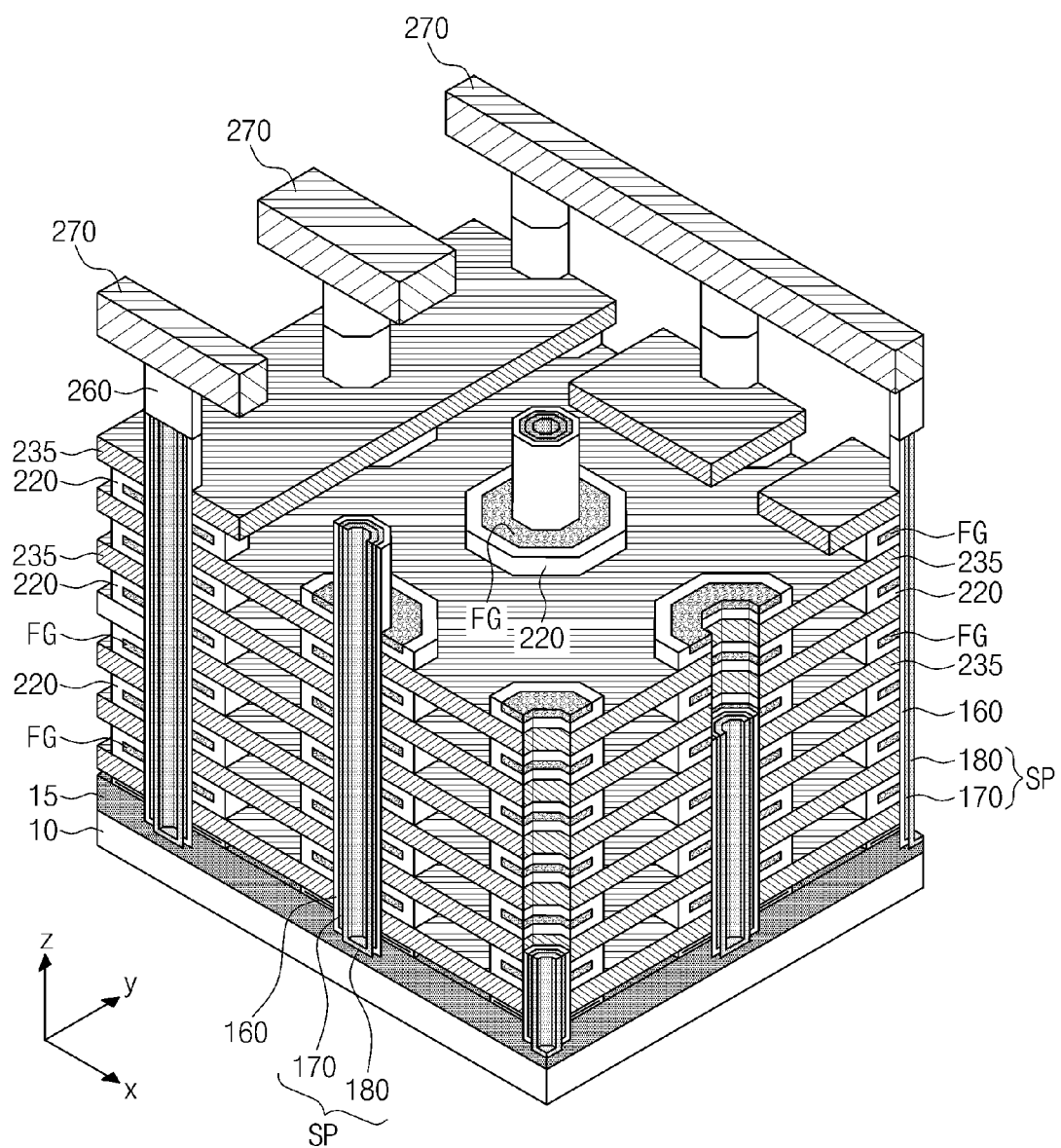
FIG. 37 is a perspective view illustrating a nonvolatile memory device manufactured by the method of FIGS. 31 through 36.

Referring to FIG. 36, after string selection lines SSL are formed by patterning the uppermost layer of gate conductive layers 235, upper plugs 260 contacting the respective semiconductor patterns SP and upper wirings 270 connecting upper plugs 260 are formed.

In this embodiment, string selection lines SSL and upper wirings 270 are formed to cross over each other. Additionally, each of string selection lines SSL is formed to surround one of semiconductor patterns SP having the same x coordinate. In modified embodiments, at least two layers disposed at the uppermost portion of gate conductive layers 235 can be used as string selection lines SSL.

Figure 38:
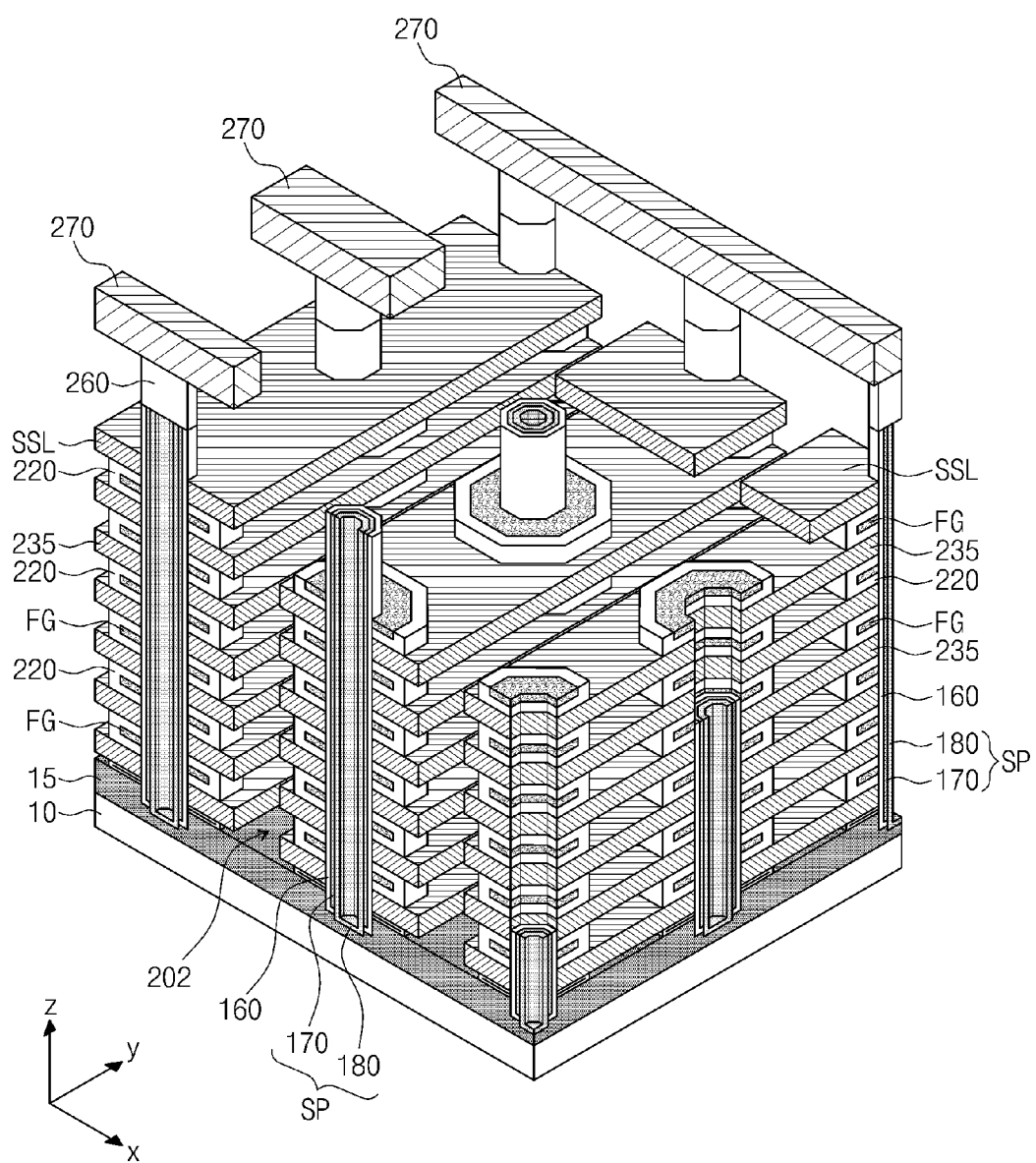
FIG. 38 is a perspective view illustrating a variation of the nonvolatile memory device and method of FIGS. 31 through 37.

FIG. 38 is a perspective view illustrating a variation of the nonvolatile memory device and the method of FIGS. 31 through 36. This variation can be used to form the nonvolatile memory device of FIG. 5. For conciseness, a description of features described above will be omitted.

Referring to FIG. 38, wordline separation regions 202 are formed in gate conductive layers 235 between string selection lines SSL. Accordingly, gate conductive layers 235 are horizontally separated at a portion of at least a cell array region.

In some embodiments, gate conductive layers 235 used as at least wordlines can be electrically connected crossing over wordline separation region 202. This electrical connection can be realized through contact plugs connecting each portion of gate conductive layer 235 separated by wordline separation region 202 and conductive lines connecting the contact plugs.

Figure 39:
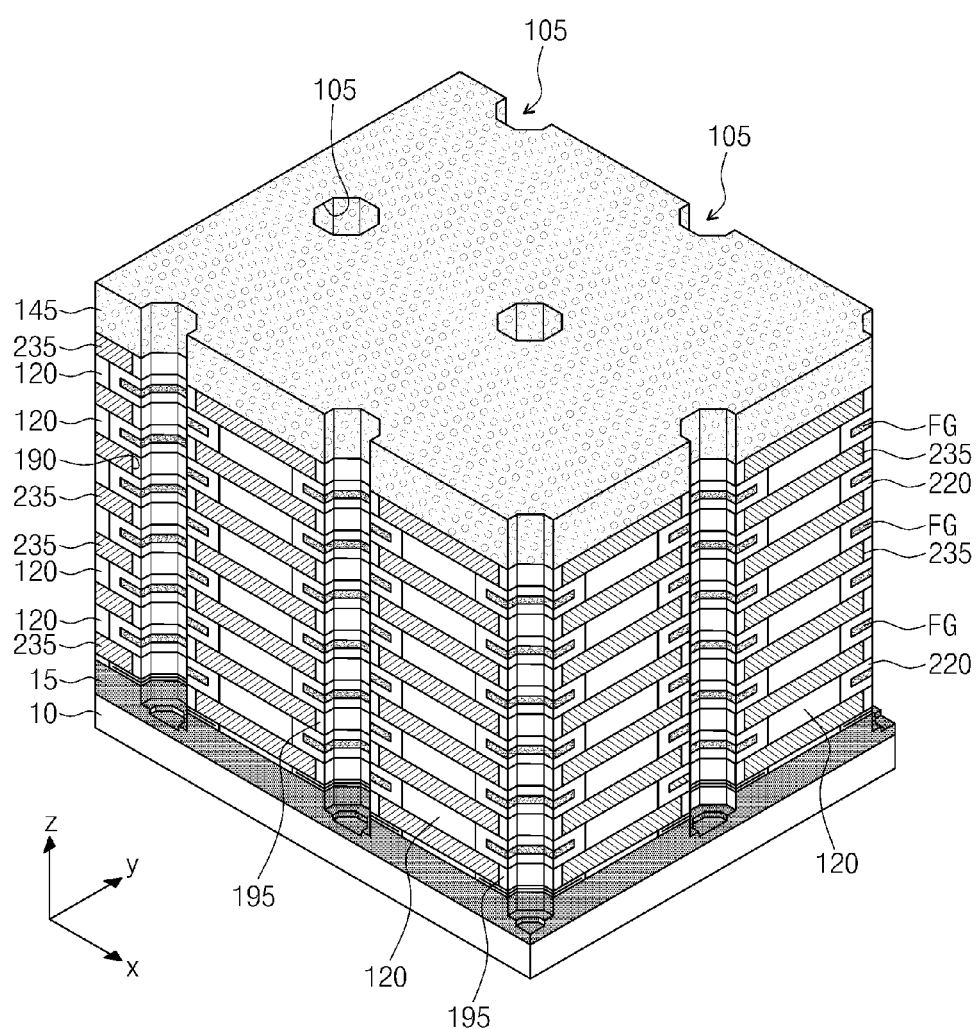
FIGS. 39 and 40 are perspective views illustrating a variation of the nonvolatile memory device and method of FIGS. 31 through 37.
Figure 40:
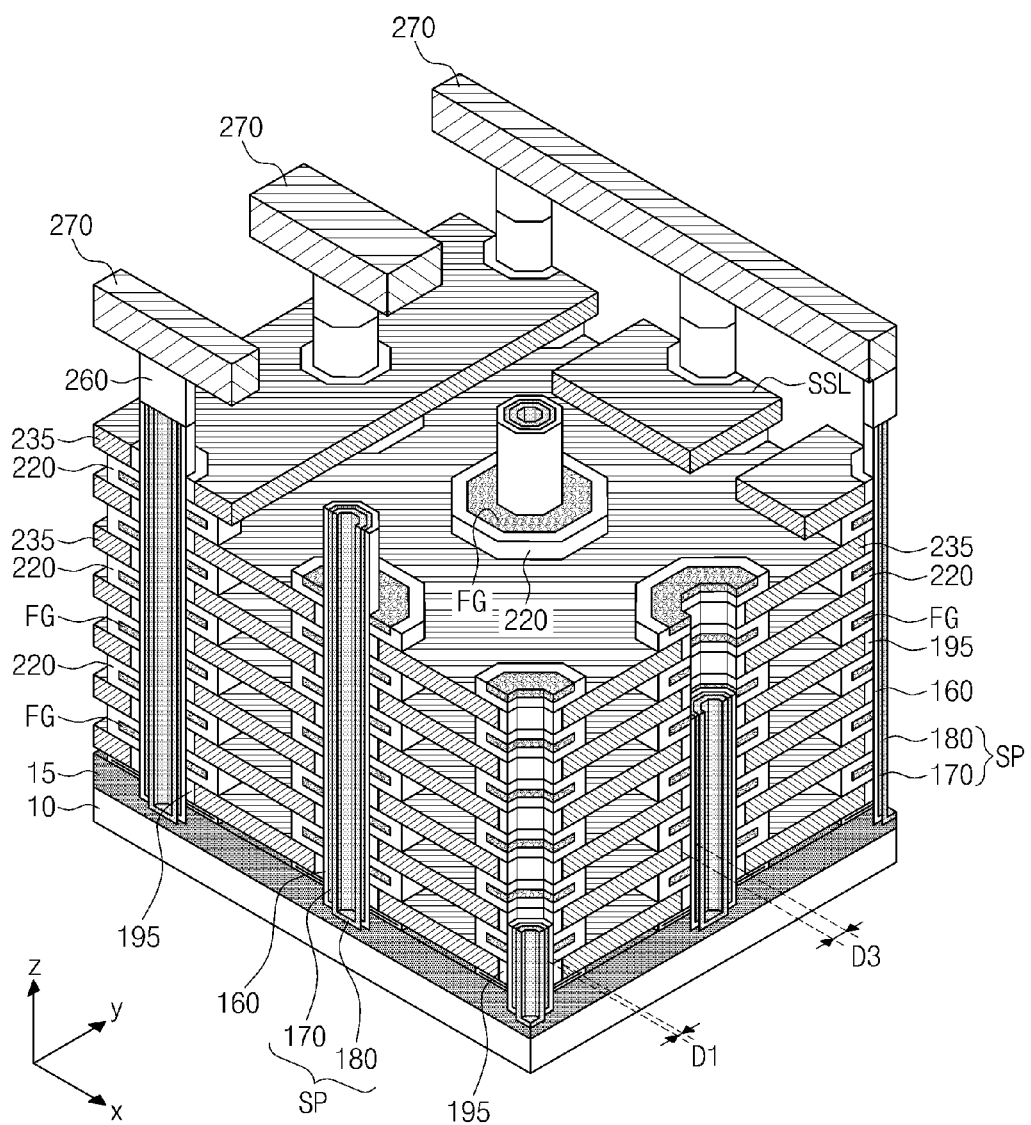

FIGS. 39 and 40 are perspective views illustrating a modification of the nonvolatile memory device and the method of manufacturing the same according to the second embodiment. For conciseness, a description of technical features already described above will be omitted below.

Referring to FIGS. 34 and 39, after the forming of floating gates FG, the sidewalls of gate conductive layers 235 exposed through openings 105 are horizontally recessed. Accordingly, spacer molding regions 190, i.e., a gap region extending from opening 105, are formed between inter gate insulation patterns 220. Spacer molding regions 190 are filled with spacer insulation patterns 195 as shown in FIGS. 39 and 40.

Later, the processes described with reference to FIGS. 35 and 36 are performed. As a result, as shown in FIG. 40, tunnel insulation pattern 160, semiconductor pattern SP, and string selection lines SSL sequentially covering the inner wall of each of openings 105 are formed. Later, upper plugs 260 contacting the respective semiconductor patterns SP and upper wirings 270 connecting upper plugs 260 are further formed.

Spacer insulation patterns 195 cause a distance D3 between semiconductor pattern SP and gate conductive layer 235 to increase more than a distance D1 between semiconductor pattern SP and floating gate FG.

In some embodiments, spacer molding regions 190 are formed before floating gates FG. In such embodiments, spacer molding regions 190 are filled by inter gate insulation pattern 220. Furthermore, in certain embodiments, the tunnel insulation pattern is formed through the thermal oxidation process described with reference to FIG. 15, so that it is locally formed at the exposed sidewall of floating gate FG.

Figure 41:
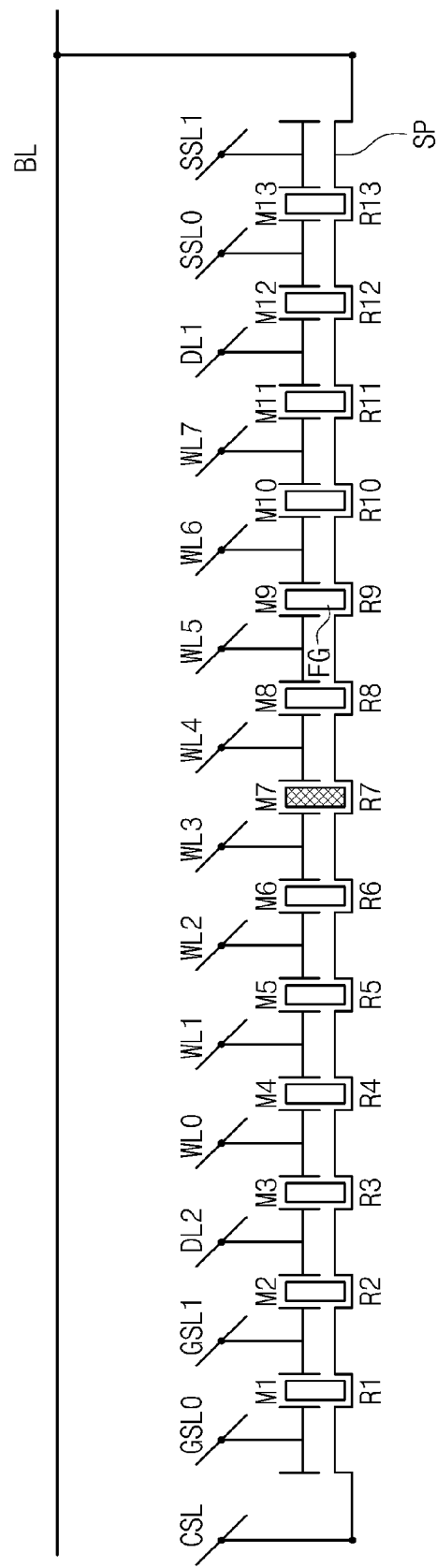
FIG. 41 is a circuit diagram illustrating a method of operating a nonvolatile memory device according to an embodiment of the inventive concept.

FIG. 41 is a circuit diagram illustrating a method of operating a memory device according to an embodiment of the inventive concept, and FIGS. 42 and 43 are tables illustrating one aspect of program and read operations of a memory device according to an embodiment of the inventive concept. In FIGS. 42 and 43, reference letters M1 through M13 represent floating gates FG or memory elements in one selected cell string shown in FIG. 41, and reference letters R1 through R13 represent portions (hereinafter, channel regions) of a semiconductor pattern SP adjacent to the respective memory elements M1 through M13.

FIGS. 42 and 43 illustrate one aspect of operations for programming and reading a selected memory cell comprising floating gate M7 of FIG. 41. In FIGS. 42 and 43, second and third columns represent electric potentials of floating gates M1 through M13 and electric potentials of channel regions R1 through R13, which are required for program and read operations of the selected memory cell. The second column of FIG. 42 in the format of [min, max] represents that a corresponding floating gate has a value between "min" and "max".

Referring to FIG. 42, the selected memory cell is programmed using Fowler-Nordheim tunneling (hereinafter, FN-tunneling). Accordingly, where a potential difference sufficient to cause FN-tunneling is generated between floating gate M7 of the selected memory cell and corresponding channel region R7, the selected memory cell is programmed. The program operation of the selected memory cell using FN-tunneling is accomplished only if floating gate M7 has a higher electric potential than a critical program potential Vpc and channel region R7 has an electric potential applied to a bitline BL (i.e., a bitline potential V_BL).

Critical program potential Vpc is defined as a minimum value of a floating gate potential that can cause FN-tunneling through a tunnel insulation layer of a memory cell in an erase state. However, critical program potential Vpc is a relative value with respect to bitline potential V_BL and can depend not only on a material and a thickness of a tunnel insulation layer between a floating gate and a semiconductor pattern, but also energy band structures of the floating gate and the semiconductor pattern. In some embodiments, bitline potential V_BL is a ground voltage GND.

Channel region R7 receives bitline potential V_BL where channel region R7 is electrically connected to bitline BL but is electrically isolated from common source line CSL. Accordingly, it is required that 1) channel regions R8 through R13 disposed between channel region R7 and bitline BL are turned on or in an inverted stage, and 2) at least one of channel regions R1 and R2 adjacent to common source line CSL is turned off.

Requirement 1) can be accomplished where each of floating gates M8 through M13 has a higher electric potential than minimum value Von of an electric potential that inverts a channel region adjacent to each of them. However, where floating gates M8 through M13 have a higher electric potential than critical program potential Vpc, corresponding floating gates can be unintentionally programmed. This unintentional programming can be prevented where floating gates M8 through M13 have an electric potential between an electric potential of the minimum value Von and critical program potential Vpc. Requirement 2) can be accomplished where floating gates M1 and M2 have a lower electric potential than minimum value Von.

Referring to FIG. 43, information stored in the selected memory cell is read by sensing a read current Iread between common source line CSL and bitline BL. More specifically, floating gates M1 through M6 and M8 through M13, other than floating gate M7 of the selected memory cell, have higher electric potentials than minimum value Von that can invert corresponding channel regions R1 through R6 and R8 through R13. Accordingly, channel regions R1 through R6 have the same electric potential V_S as common source line CSL, and channel regions R8 through R13 have bitline potential V_BL. The size of read voltage Vread is determined by whether channel region R7 is inverted, and whether channel region R7 is inverted is determined by an electric potential (i.e., stored information) of floating gate M7. Accordingly, read current Iread is dominantly determined by an electric potential of floating gate M7.

As indicated by the foregoing, FIGS. 42 and 43 illustrate minimum requirements for the size of an electric potential that the floating gates should receive in program and read operations. According to certain embodiments, these electric potentials of floating gates are determined by electric potentials of wordlines adjacent to the corresponding floating gate. Accordingly, the electric potentials of floating gates described with reference to FIGS. 42 and 43 are distinguished from voltages applied to the wordlines. Additionally, because the electric potentials of floating gates described with reference to FIGS. 42 and 43 represent minimum requirements necessary for program and read operations, they are not specific values but they are values selected from a predetermined range. For example, an electric potential satisfying the condition of [Von, Vpc] can be a certain value between respectively different values Von and Vpc. At this point, specific values of Von and Vpc depend on kinds and thicknesses of materials constituting a memory device. However, specific values of Von and Vpc can be determined based on dependencies and physical relationships between first through third capacitors C1 through C3 described with reference to FIG. 1.

Figure 44:
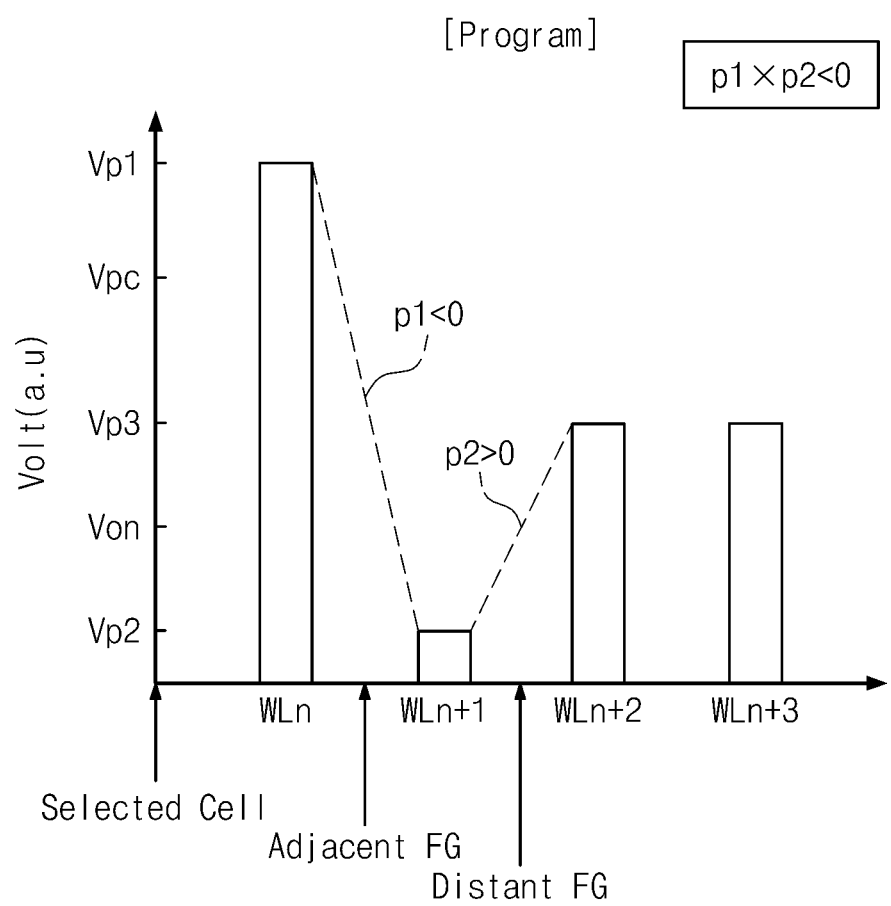
FIG. 44 is a voltage diagram illustrating an aspect of a program operation of a memory device according to an embodiment of the inventive concept.
Figure 45A:
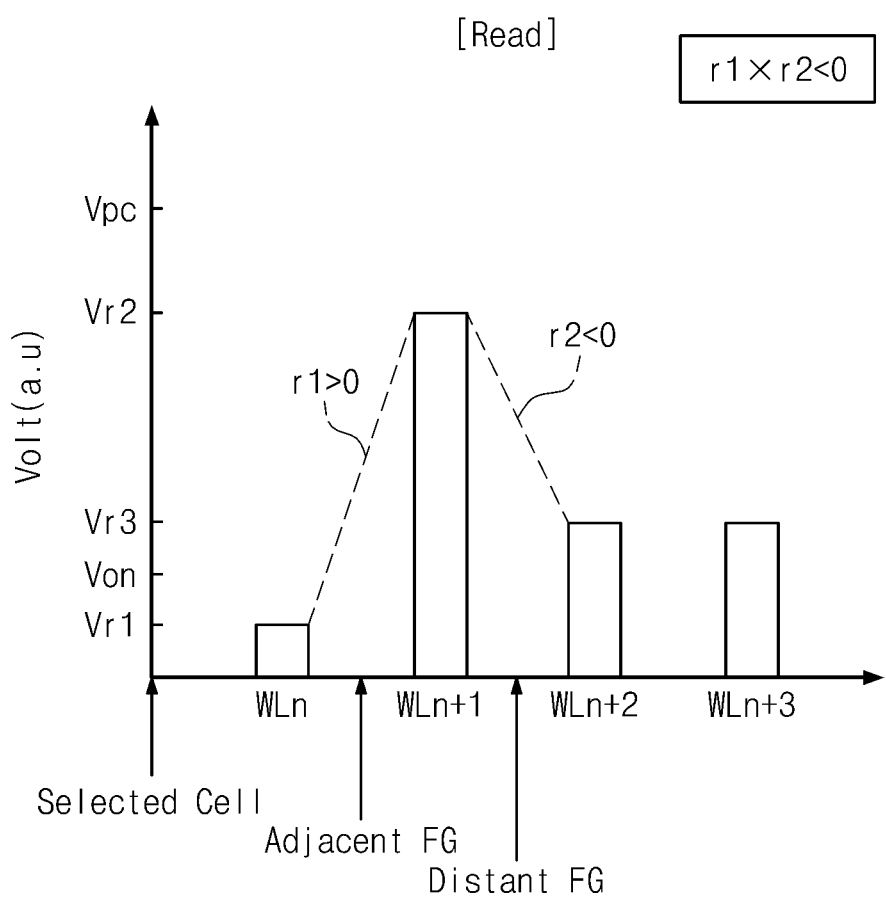
FIGS. 45A and 45B are voltage diagrams illustrating an aspect of a read operation of a memory device according to an embodiment of the inventive concept.
Figure 45B:
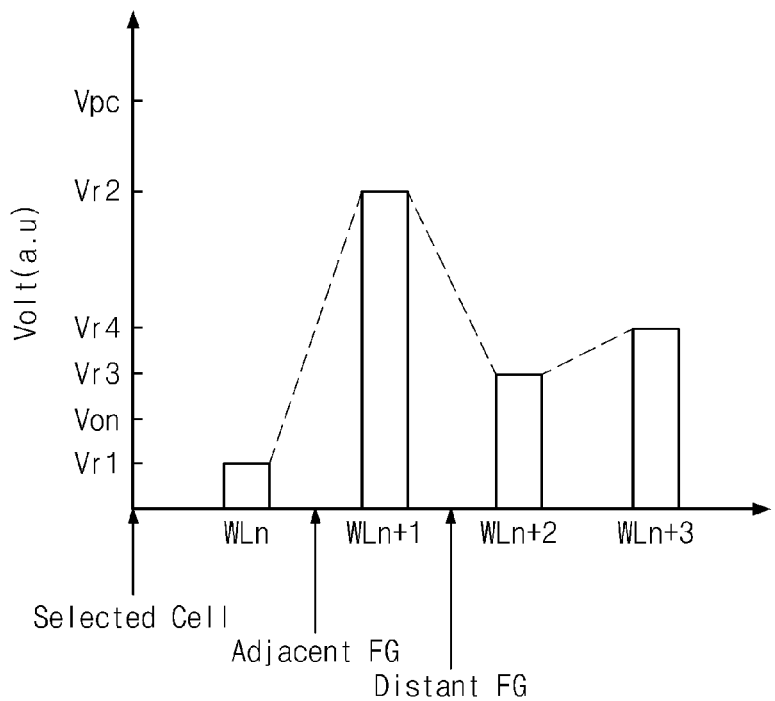
Figure 46:
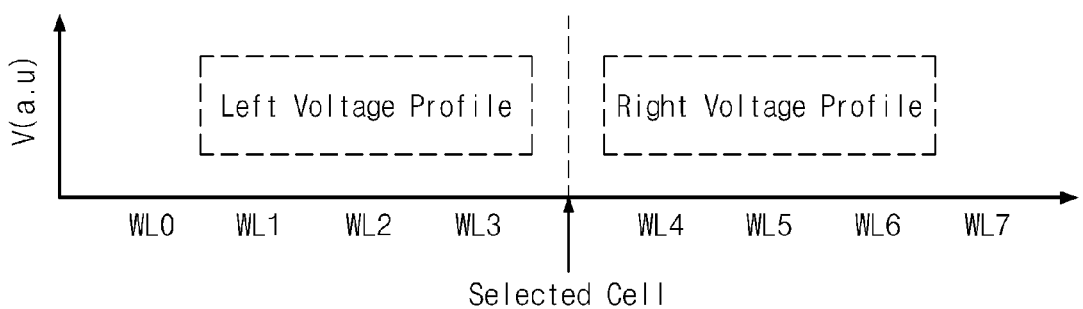
FIGS. 46 to 48 are voltage diagrams illustrating wordline voltages in various operations of a memory device according to embodiments of the inventive concept.
Figure 47:
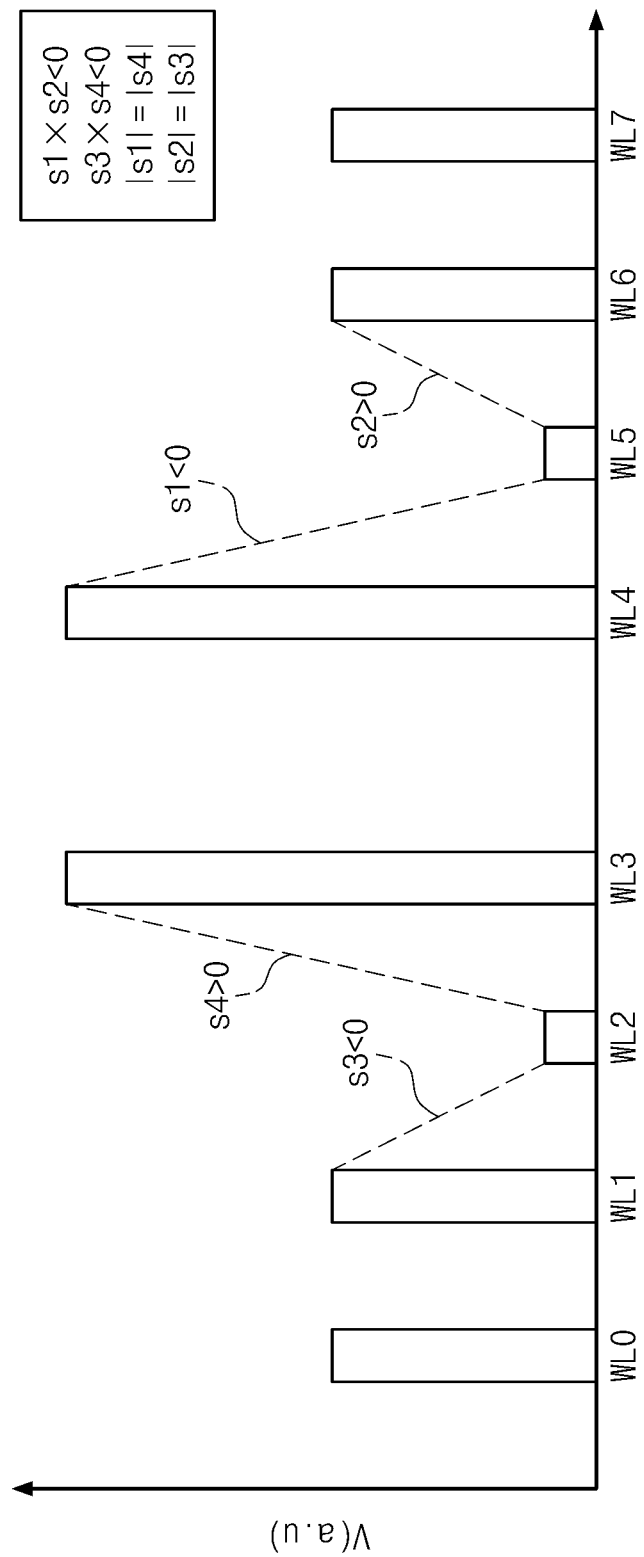
Figure 48:
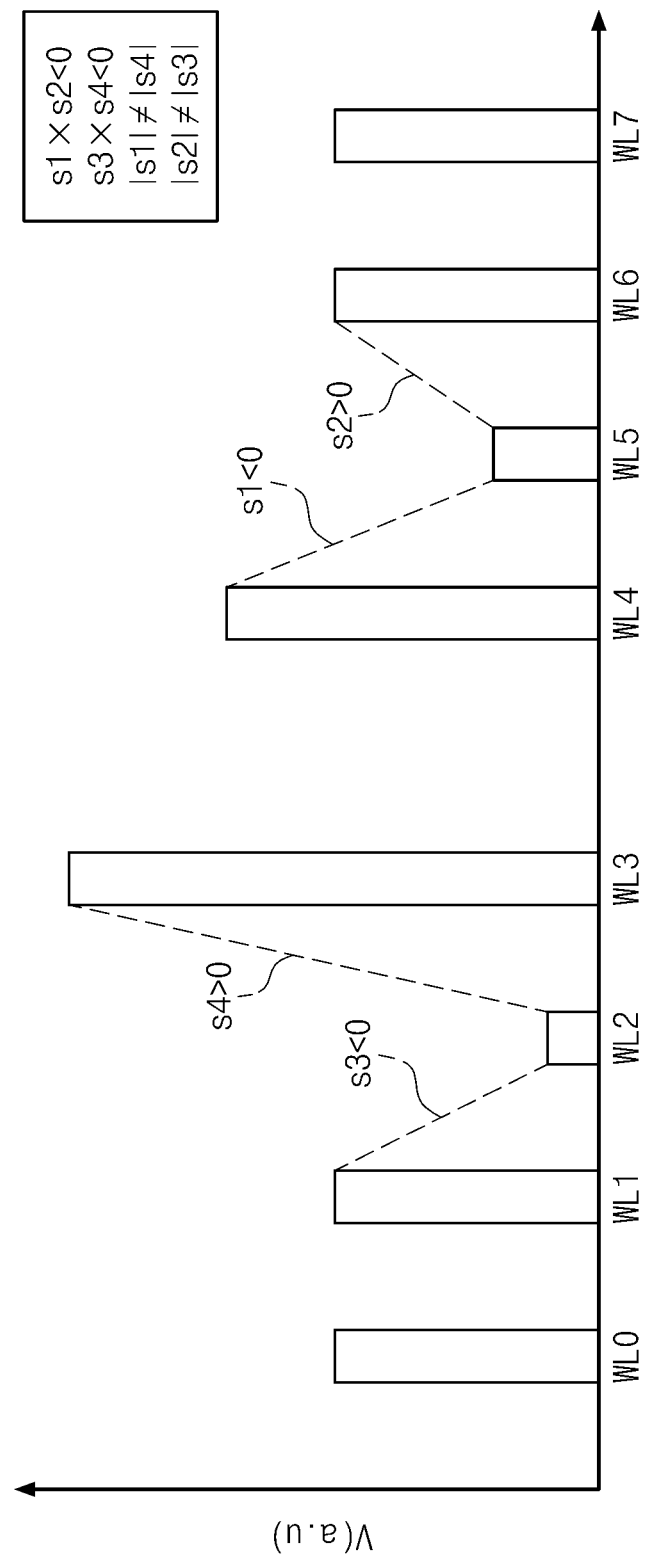

Referring to FIGS. 44 through 48, wordline voltages satisfying the above minimum requirements about the electric potentials of floating gates will be described. FIG. 44 is a voltage diagram illustrating one aspect of a program operation of a memory device according an embodiment of the inventive concept, and FIGS. 45A and 45B are voltage diagrams illustrating one aspect of a read operation of a memory device according to an embodiment of the inventive concept. FIGS. 46 through 48 are voltage diagrams illustrating wordline voltages for an operation of a memory device according to an embodiment of the inventive concept. The wordline voltages described below are examples that can be considered to satisfy minimum requirements of electric potentials of floating gates. However, the inventive concept is not limited by these examples.

Referring to FIG. 44, while a selected memory cell is programmed, first, second, and third program voltages Vp1, Vp2, and Vp3 having respectively different sizes are applied to three wordlines WLn, WLn+1, and WLn+2 disposed sequentially on one side of the selected memory cell.

As described with reference to FIG. 42, the floating gate of the selected memory cell is required to have a higher electric potential than critical program potential Vpc. To satisfy this requirement, first program voltage Vp1 applied to wordline WLn that is the closest to the selected memory cell is higher than critical program potential Vpc. That is, Vp1>Vpc.

To prevent an adjacent floating gate FG disposed between wordlines WLn and WLn+1 from being programmed by first program voltage Vp1, second program voltage Vp2 is lower than an electric potential of critical program potential Vpc. That is, Vp2<Vpc. Furthermore, where a coupling ratio between wordlines and floating gates is sufficiently large, second program voltage Vp2 is lower than an electric potential of minimum value Von. That is, Vp2<Von<Vpc.

Adjacent floating gate FG has a higher electric potential than minimum value Von that inverts a channel region adjacent thereto by first program voltage Vp1, but has a lower electric potential than critical program potential Vpc by second program voltage Vp2. Accordingly, adjacent floating gate FG satisfies the above-mentioned requirements of [Von, Vpc] described with reference to FIG. 42.

Meanwhile, to allow the requirement of [Von, Vpc] to be satisfied in a distant floating gate FG disposed between wordlines WLn+1 and WLn+2, third program voltage Vp3 is higher than an electric potential of minimum value Von and lower than an electric potential of the critical program potential Vpc. That is, Von<Vpc3<Vpc.

Accordingly, as shown in FIG. 44, first through third program voltages VP1, VP2, and Vp3 are selected to have the following characteristics.

$$P1<0 \qquad \qquad 1)$$

$$P2>0 \qquad \qquad 2)$$

P1 is a slope between wordlines WLn and WLn+1 of a curve (hereinafter, a program voltage curve) connecting voltages applied to adjacent wordlines during a program operation. P2 is a slope between wordlines WLn+1 and WLn+2 of the program voltage curve. That is, first through third program voltages Vp1 through Vp3 are selected to have the following characteristics.

$$P1 \times P2 < 0 \qquad \qquad 3)$$

Referring to FIG. 45A, while the selected memory cell is programmed, first, second, and third read voltages Vr1, Vr2, and Vr3 having respectively different sizes are applied to three wordlines WLn, WLn+1, and WLn+2 disposed sequentially on one side of the selected memory cell.

To prevent an electric potential of a floating gate of the selected memory cell from being changed by voltages applied to the wordlines, first read voltage Vr1 is lower than minimum value Von. That is, Vr1<Von. However, because all of the adjacent floating gate and the distant floating gate must have a higher electric potential than minimum value Von as described with reference to FIG. 42, second and third read voltages Vr2 and Vr3 are higher than minimum value Von and lower than critical program potential Vpc. That is, Von<Vr2<Vpc and Von<Vr3<Vpc. In some embodiments, to reduce interference in read operation, third read voltage Vr3 is lower than second read voltage Vr2. That is, Vr2>Vr3.

As shown in FIG. 45A, the first through third read voltages Vr1 through Vr3 are selected to have the following characteristics.

$$r1>0 \qquad \qquad 4)$$

$$r2<0 \qquad \qquad 5)$$

Here, r1 is a slope between wordlines WLn and WLn+1 of a curve (hereinafter, a read voltage curve) connecting voltages applied to adjacent wordlines during a read operation. r2 is a slope between wordlines WLn+1 and WLn+2 of the read voltage curve. That is, the first through third read voltages Vr1 through Vr3 are selected to have the following characteristics.

$$r1 \times r2 < 0 \qquad (6)$$

In other embodiments, where a read operation is performed on the selected memory cell, first, second, third, and fourth read voltages Vr1, Vr2, Vr3, and Vr4 having different sizes are applied to four wordlines WLn, WLn+1, WLn+2, and WLn+3 disposed sequentially on one side of the selected memory cell. First read voltage Vr1 is a lower voltage (i.e., Vr1<Von) than at least an electric potential of minimum value Von and the second, third, and fourth voltages Vr2, Vr3, and Vr4 are greater than minimum value Von and less than critical program potential Vpc (i.e., Von<Vr2, Vr3, Vr4<Vpc). Furthermore, as shown in FIG. 45B, fourth read voltage Vr4 is lower than the second read voltage Vr2 and higher than third read voltage Vr3. That is, Vr2>Vr4>Vr3.

Referring to FIG. 46, voltages defined by the left voltage profile are applied to wordlines WL1 through WL3 disposed at the left based on the selected memory cell and voltages defined by the right voltage profile are applied to wordlines WL4 through WL6 at the right. That is, the left voltage profile defines voltage levels applied to each of wordlines WL1 through WL3, and the right voltage profile defines voltage levels applied to each of wordlines WL4 through WL6. Specific examples for each of the left and right voltage profiles are provided by program and read voltage curves shown in FIGS. 44, 45A, and 45B.

In some embodiments, the left voltage profile and the right voltage profile are substantially symmetrical with reference to the selected memory cell as shown in FIGS. 47, 49A, and 49B. That is, slopes s1 and s4 have substantially the same size and slopes s2 and s3 have substantially the same size.

In some embodiments, the left voltage profile and the right voltage profile are substantially asymmetrical with reference to the selected memory cell as shown in FIG. 48. That is, the slopes s1 and s4 have different sizes and the slopes s2 and s3 have different sizes. In some embodiments, wordline voltages have different sizes but polarities of the slopes at each interval are symmetrical with reference to the selected memory cell. That is, s1×s4<0 and s2×s3<0.

The voltage profile of FIG. 48 is satisfied where all voltages applied to wordlines WL3 and WL4 are greater than critical program potential Vpc. The voltage profile of FIG. 48 is also satisfied where a voltage applied to wordline WL3 is higher than critical program potential Vpc and a voltage applied to wordline WL4 is lower than critical program potential Vpc.

FIGS. 49A and 49B are tables illustrating a method of operating a memory device according to an embodiment of the inventive concept. More specifically, FIGS. 49A and 49B illustrate voltage conditions for program, read, and erase operations, which are obtained through computer simulations of the memory device illustrated in FIG. 14. In the computer simulations, tunnel insulation pattern 160 is a silicon oxide layer having thickness of 80 Å and a coupling ratio of about 0.7. The selected memory cell comprises a floating gate disposed between wordlines WL3 and WL4.

As shown in FIGS. 49A and 49B, during a program operation, Vcc is applied to string selection lines SSL0 and SSL1 and 0V is applied to ground selection lines GSL0 and GSL1. 15V is applied to wordlines WL3 and WL4 at both sides of the selected memory cell and 0V is applied to wordlines WL2 and WL5 adjacent thereto and 8V is applied to other wordlines WL0, WL1, WL6, and WL7. 0V is applied to the selected bitline and Vcc is applied to unselected bitlines. Additionally, 8V is applied to first dummy line DL1 adjacent to the bitline and 0V is applied to second dummy line DL2 adjacent to common source line CSL. 1.2V is applied to common source line CSL.

In the embodiment of FIG. 49A, during a read operation, Vcc and 0V are applied to bitline BL and common source line CSL, respectively, and 0V is applied to wordlines WL3 and WL4 at both sides of the selected memory cell, and 12V is applied to wordlines WL2 and WL5 adjacent thereto. Additionally, 6V is applied to other wordlines WL0, WL1, WL6, and WL7, string selection lines SSL0 and SSL1, ground selection lines GSL0 and GSL1, and dummy lines DL1 and DL2.

In the embodiment of FIG. 49B, during a read operation, Vcc and 0V are applied to bitline BL and common source line CSL, respectively, one of 1V, 2.5V, and 4V is applied to wordlines WL3 and WL4 at both sides of the selected memory cell, and 10V is applied to wordlines WL2 and WL5 disposed at the second position from the selected memory cell. Meanwhile, voltages 1V, 2.5V or 4V are applied to wordlines WL3 and WL4 at both sides of the selected memory cell when the selected memory cell is in one of states P1, P2, and P3. Additionally, 5V is applied to wordlines WL1 and WL6 disposed at the third position from the selected memory cell and 7V is applied to other wordlines WL0 and WL7, string selection lines SSL0 and SSL1, ground selection lines GSL0 and GSL1, and dummy lines DL1 and DL2.

In the embodiment of FIG. 49A, during an erase operation, an erase voltage Vers is applied to bitline BL and common source line CSL and 6V is applied to string selection lines SSL0 and SSL1 and ground selection lines GSL0 and GSL1. 0V is applied to wordlines WL0 through WL7 and dummy lines DL1 and DL2.

In the embodiment of FIG. 49B, during an erase operation, erase voltage Vers is applied to common source line CSL and 6V is applied to ground selection lines GSL0 and GSL1; 0V is applied to wordlines WL0 through WL7 and dummy lines DL1 and DL2; and bitline BL and string selection lines SSL0 and SSL1 are floated.

The methods of FIGS. 49A and 49B are performed using symmetrical voltages such as those of FIG. 47. However, in other embodiments, a program or read operation can be performed using asymmetric voltages such as those of FIG. 48. In some alternative embodiments, during a program operation, a corresponding voltage is applied to at least one wordline using an incremental step pulse programming scheme. For example, the incremental step pulse programming scheme can be used to apply program voltages to at least one of wordlines WL3 and WL4 at both sides of the selected memory cell.

Figure 50:
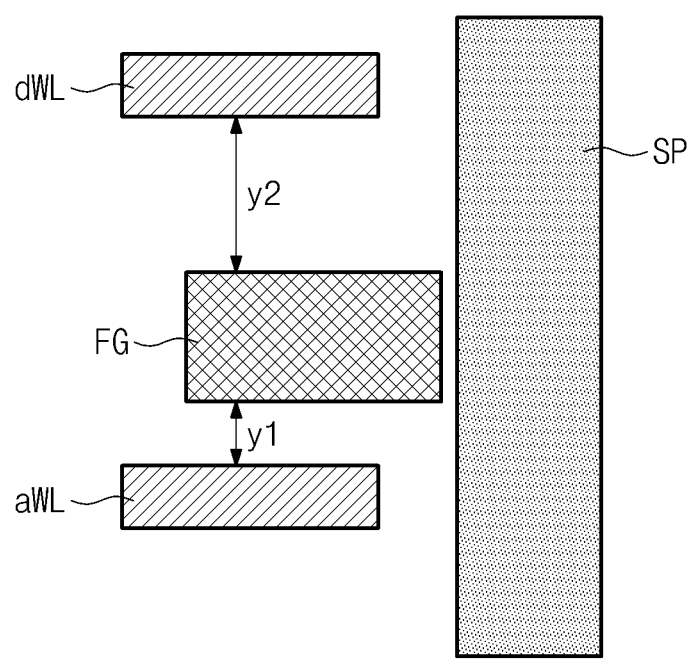
FIG. 50 is a sectional view illustrating a unit cell of a nonvolatile memory device according to an embodiment of the inventive concept.

FIG. 50 is a sectional view illustrating a unit cell UC of a nonvolatile memory device according to an embodiment of the inventive concept. The embodiment of FIG. 50 has common features with the embodiment of FIG. 2. Accordingly, a duplicative description of the common features will be omitted to avoid redundancy.

Referring to FIG. 50, a floating gate FG is separated from two adjacent wordlines aWL and dWL by different distances y1 and y2. In the embodiments of FIGS. 6 through 40, this configuration is achieved by changing layers constituting mold structure 100. For example, this configuration can be achieved by adding thin layers having an etch selectivity with respect to interlayer insulation layer 120 and sacrificial mold layer 130 in mold structure 100.

In the embodiment of FIG. 50, floating gate FG is more dominantly controlled by adjacent wordline aWL than distant wordline dWL. According to this asymmetric configuration, disturbance during a program or read operation is suppressed.

Figure 51:
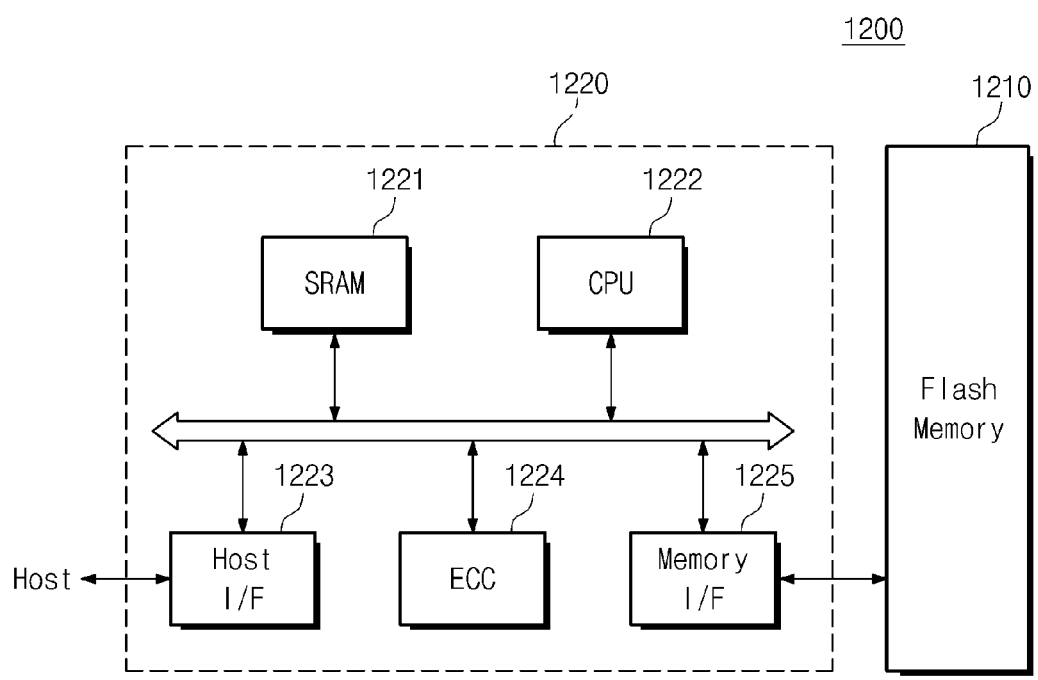
FIG. 51 is a block diagram illustrating a memory card comprising a flash memory device according to an embodiment of the inventive concept.

FIG. 51 is a block diagram illustrating a memory card 1200 comprising a flash memory device according to an embodiment of the inventive concept. Referring to FIG. 51, memory card 1200 comprises a flash memory device 1210 such as those described above. Memory card 1200 comprises a memory controller 1220 controlling general data exchanges between a host and flash memory device 1210.

SRAM 1221 is used as a working memory of a central processing unit (CPU) 1222. A host interface 1223 implements a data exchange protocol of a host connected to memory card 1200. An error correction code (ECC) block 1224 detects and corrects errors in data read from a multi-bit flash memory device 1210. A memory interface 1225 interfaces with flash memory device 1210. CPU 1222 performs general control operations for data exchange of memory controller 1220. Although not shown in FIG. 52, memory card 1200 can further comprise a ROM for storing code data to interface with the host.

Flash memory device 1210 can improve the reliability and erase characteristics of dummy cells, which can improve a memory card or memory system incorporating flash memory device 1210. Flash memory device 1210 can be incorporated in a variety of other systems, such as a solid state disk (SSD).

Figure 52:
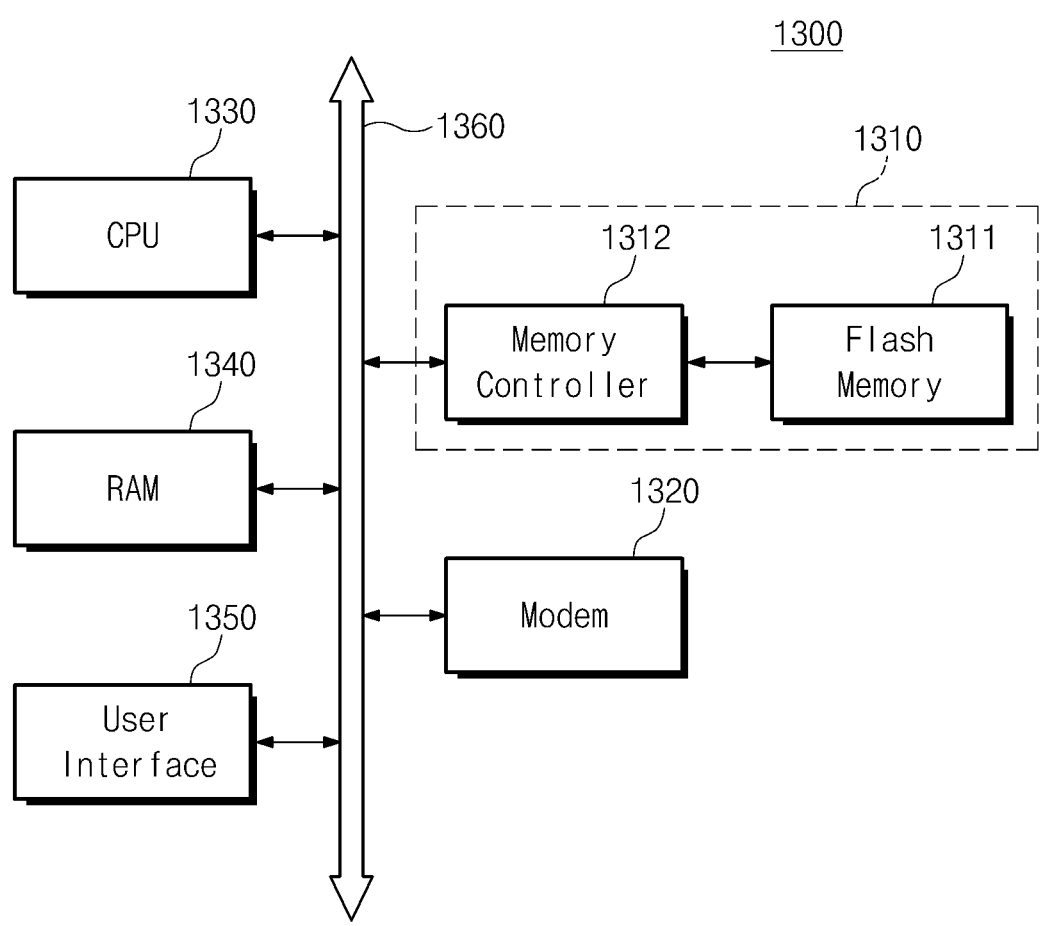
FIG. 52 is a block diagram illustrating an information processing system comprising a flash memory system according to an embodiment of the inventive concept.

FIG. 52 is a block diagram illustrating an information processing system 1300 comprising a flash memory system 1310 according to an embodiment of the inventive concept.

Referring to FIG. 52, flash memory system 1310 is mounted in information processing system 1300 such as a mobile device or a desktop computer. Information processing system 1300 comprises flash memory system 1310 and a modem 1320, a CPU 1330, RAM 1340, and a user interface 1350, which are electrically connected to a system bus 1360. Flash memory system 1310 is substantially identical to the above-mentioned memory system or flash memory system. Flash memory system 1310 stores data processed by CPU 1330 or data input from an external source. In some embodiments, flash memory system 1310 comprises a SSD capable of stably storing large amounts of data.

As reliability is increased, flash memory system 1310 can save resources consumed by error correction and it can improve its speed. Although not shown in the drawings, information processing system 1300 can further comprise other features, such as an application chipset, a camera image processor (CIS), and an input/output device.

The above-described memory devices or memory systems can be mounted in various types of packages. Examples of such packages or package types include package on package (PoP), ball grid array (BGA), chip scale packages (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

As indicated by the foregoing, in some embodiments of the inventive concept, a nonvolatile memory device comprises a floating gate formed between wordlines to face a semiconductor pattern. This can improve a coupling ratio of the nonvolatile memory device and improve its performance.

While the inventive concept has been particularly shown and described with reference to embodiments thereof, it will be understood that various changes in form and details may be made therein without departing from the scope of the attached claims.

What is claimed is:

1. A nonvolatile memory device, comprising:
   a semiconductor pattern comprising a channel region;
   a floating gate formed over the semiconductor pattern and facing the channel region; and
   first and second wordlines formed over the semiconductor pattern on opposite sides of the floating gate;
   wherein the floating gate is separated from the semiconductor pattern by a first distance, and the first and second wordlines are separated from the semiconductor pattern by a second distance greater than the first distance.

2. The nonvolatile memory device of claim 1, wherein the memory element has a disk shape comprising through hole;
   the first and second wordlines each have a line shape comprising a through hole; and
   the semiconductor pattern is formed in the through hole of the floating gate and the through holes of the first and second wordlines.

3. The nonvolatile memory device of claim 1, further comprising a substrate formed below the first and second wordlines, wherein the first and second wordlines have major axes that are substantially parallel to a top surface of the substrate, and the semiconductor pattern has a major axis that is substantially perpendicular to the top surface of the substrate.

4. The nonvolatile memory device of claim 1, further comprising:
   a first insulation layer interposed between the floating gate and the semiconductor pattern; and
   a second insulation layer interposed between the semiconductor pattern and the first and second wordlines,
   wherein the floating gate comprises a conductive pattern that is electrically isolated from the semiconductor pattern and is electrically isolated from the first and second wordlines by the first and second insulation layers.

5. The nonvolatile memory device of claim 4, wherein a thickness of the first insulation layer is less than a thickness of the second insulation layer.

6. The nonvolatile memory device of claim 4, wherein the second insulation layer is a multi-layer comprising at least two of a silicon oxide layer, a silicon nitride layer, a silicon oxide nitride layer, and a high-k dielectric.

7. The nonvolatile memory device of claim 4, wherein the first insulation layer is a silicon oxide layer formed locally on a surface of the floating gate adjacent to the semiconductor pattern.

8. The nonvolatile memory device of claim 4, wherein the first insulation layer comprises a tunnel region adjacent to the floating gate and a spacer region extending from the tunnel region to be adjacent to the first and second wordlines; and
   wherein a distance between the semiconductor layer and a sidewall of the first insulation layer spaced apart from the semiconductor layer is greater in the spacer region than in the tunnel region.

* * * * *